US00RE49165E

(19) United States
(12) Reissued Patent
Zhang et al.

(10) Patent Number: US RE49,165 E
(45) Date of Reissued Patent: Aug. 9, 2022

(54) ON-PITCH DRAIN SELECT LEVEL ISOLATION STRUCTURE FOR THREE-DIMENSIONAL MEMORY DEVICE AND METHOD OF MAKING THE SAME

(71) Applicant: SANDISK TECHNOLOGIES LLC, Addison, TX (US)

(72) Inventors: Yanli Zhang, San Jose, CA (US); Masanori Tsutsumi, Yokkaichi (JP); Shinsuke Yada, Yokkaichi (JP); Sayako Nagamine, Yokkaichi (JP); Johann Alsmeier, San Jose, CA (US)

(73) Assignee: SANDISK TECHNOLOGIES LLC, Addison, TX (US)

(21) Appl. No.: 16/906,278

(22) Filed: Jun. 19, 2020

Related U.S. Patent Documents

Reissue of:
(64) Patent No.: 10,236,300
Issued: Mar. 19, 2019
Appl. No.: 15/784,549
Filed: Oct. 16, 2017

U.S. Applications:
(60) Provisional application No. 62/536,584, filed on Jul. 25, 2017.

(51) Int. Cl.
*H01L 27/11524* (2017.01)
*H01L 27/11582* (2017.01)
(Continued)

(52) U.S. Cl.
CPC .... *H01L 27/11582* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
CPC ..... H01L 27/11582; H01L 27/1157; H01L 27/11524; H01L 27/1128; H01L 27/11556; H01L 27/11529; H01L 27/11573
See application file for complete search history.

(56) References Cited

U.S. PATENT DOCUMENTS 5,915,167 A 6/1999 Leedy
8,658,499 B2 2/2014 Makala et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Tuan H Nguyen
*Assistant Examiner* — Minh Nguyen
(74) *Attorney, Agent, or Firm* — The Marbury Law Group PLLC

(57) ABSTRACT

A three-dimensional memory structure includes an alternating stack of insulating layers and electrically conductive layers located over a substrate, an array of memory stack structures extending through the alternating stack, an array of drain select level assemblies overlying the alternating stack and having a same periodicity as the array of memory stack structures, drain select gate electrodes laterally surrounding respective rows of the drain select level assemblies, and a drain select level isolation strip located between a neighboring pair of drain select gate electrodes and including a pair of lengthwise sidewalls. Each of the pair of lengthwise sidewalls includes a laterally alternating sequence of planar sidewall portions and [convex] *concave* sidewall portions.

13 Claims, 59 Drawing Sheets

(51) Int. Cl.

| | |
|---|---|
| ***H01L 27/1157*** | (2017.01) |
| ***H01L 27/11529*** | (2017.01) |
| ***H01L 27/11556*** | (2017.01) |
| ***H01L 27/11573*** | (2017.01) |

(56) References Cited

U.S. PATENT DOCUMENTS

| | | | | |
|---|---|---|---|---|
| 8,878,278 | B2 | 11/2014 | Alsmeier et al. | |
| 9,023,719 | B2 | 5/2015 | Pachamuthu et al. | |
| 9,331,094 | B2 | 1/2016 | Pachamuthu et al. | |
| 9,305,932 | B2 | 4/2016 | Kanakamedala et al. | |
| 9,368,509 | B2 | 6/2016 | Pang et al. | |
| 9,449,983 | B2 | 9/2016 | Yada et al. | |
| 9,576,966 | B1 | 2/2017 | Peri et al. | |
| 9,679,907 | B1 | 6/2017 | Kaneko | |
| 9,972,640 | B1 * | 5/2018 | Kai | H01L 21/31116 |
| 2011/0013454 | A1 | 1/2011 | Hishida et al. | |
| 2011/0059595 | A1 | 3/2011 | Jung | |
| 2015/0179662 | A1 | 6/2015 | Makala et al. | |
| 2015/0340374 | A1 * | 11/2015 | Jung | H01L 27/11573 438/258 |
| 2015/0348984 | A1 | 12/2015 | Yada et al. | |
| 2015/0380419 | A1 | 12/2015 | Gunji-Yoneoka et al. | |
| 2016/0111438 | A1 | 4/2016 | Tsutsumi et al. | |
| 2016/0204122 | A1 | 7/2016 | Shoji et al. | |
| 2017/0148811 | A1 | 5/2017 | Zhang et al. | |
| 2018/0366482 | A1 * | 12/2018 | Zhou | H01L 27/11524 |

OTHER PUBLICATIONS

Pan, W. S. et al., "Selective Reactive Ion Etching of Tungsten Films in CHF3 and Other Fluorinated Gases," J. Vac. Sci. Technol. B, vol. 6, No. 4, pp. 1073-1080, (1988).

U.S. Appl. No. 15/056,510, filed Feb. 29, 2016, SanDisk Technologies Inc.

U.S. Appl. No. 15/078,555, filed Mar. 23, 2016, SanDisk Technologies LLC.

U.S. Appl. No. 15/155,639, filed May 16, 2016, SanDisk Technologies LLC.

U.S. Appl. No. 15/174,030, filed Jun. 6, 2016, SanDisk Technologies LLC.

U.S. Appl. No. 15/219,652, filed Jul. 26, 2016, SanDisk Technologies LLC.

U.S. Appl. No. 15/219,719, filed Jul. 26, 2016, SanDisk Technologies LLC.

U.S. Appl. No. 15/225,492, filed Aug. 1, 2016, SanDisk Technologies LLC.

U.S. Appl. No. 15/286,063, filed Oct. 5, 2016, SanDisk Technologies LLC.

U.S. Appl. No. 15/332,429, filed Oct. 24, 2016, SanDisk Technologies LLC.

U.S. Appl. No. 15/337,235, filed Oct. 28, 2016, SanDisk Technologies LLC.

U.S. Appl. No. 15/354,067, filed Nov. 17, 2016, SanDisk Technologies LLC.

U.S. Appl. No. 15/354,795, filed Nov. 17, 2016, SanDisk Technologies LLC.

U.S. Appl. No. 15/468,732, filed Mar. 24, 2017, SanDisk Technologies LLC.

U.S. Appl. No. 15/704,286, filed Sep. 14, 2017, SanDisk Technologies LLC.

International Search Report and Written Opinion of the International Search Authority for International Patent Application No. PCTUS2018/033163, dated Sep. 10, 2018, 14 pages.

* cited by examiner hd1
hd2
272S
272C
272P
277
277B
277A
p
p
263
A
A'
B'
273
270
B 58
50
263
262
260
250
63
62
60
52
54
56
115
273
272
270
70
42
32
42
277

58
50
263
262
260
250
63
62
60
52
54
56
277
273
270
70
42
32
42
115
272 hd1
hd2
263
46L
A
A'
B
B'
79'

115
46L
72
146
263
262
260
250
58
50
63
62
60
52
54
56
270
70
46
32
46
79'
50
44
70
46
32

115
46L
72
146
263
262
260
250
58
50
63
62
60
52
54
56
270
70
46
32
46 hd1
hd2
263
46L
A
A'
B
B'
79'
50
44
70
46
32
58
63
62
60
52
54
56
250
260
262
132
246
72
270

ON-PITCH DRAIN SELECT LEVEL ISOLATION STRUCTURE FOR THREE-DIMENSIONAL MEMORY DEVICE AND METHOD OF MAKING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

This application *is a reissue of U.S. Pat. No. 10,236,300, which issued on Mar. 19, 2019 from U.S. patent application Ser. No. 15/784,549, filed on Oct. 16, 2017, which* claims the benefit of priority of U.S. Provisional Patent Application Ser. No. 62/536,584 filed on Jul. 25, 2017, the entire contents of which are incorporated herein by reference.

FIELD

The present disclosure relates generally to the field of semiconductor devices, and particular to a three-dimensional memory device employing drain select level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; an array of memory stack structures extending through the alternating stack and arranged as rows that extend along a first horizontal direction and spaced apart along a second horizontal direction, wherein each of the memory stack structures comprises a memory film and a memory level channel portion contacting an inner sidewall of the memory film; an array of drain select level assemblies overlying the alternating stack and having a same periodicity as the array of memory stack structures along the first horizontal direction and the second horizontal direction; drain select gate electrodes laterally surrounding respective rows of the drain select level assemblies; and a first drain select level isolation strip comprising a dielectric material and located between a neighboring pair of drain select gate electrodes and including a pair of lengthwise sidewalls, wherein each of the pair of lengthwise sidewalls includes a laterally alternating sequence of planar sidewall portions and [convex] *concave* sidewall portions.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming an array of memory stack structures extending through the alternating stack and arranged as rows that extend along a first horizontal direction and spaced apart along a second horizontal direction, wherein each of the memory stack structures comprises a memory film and a memory level channel portion contacting an inner sidewall of the memory film; forming an array of drain select level assemblies having a same periodicity as the array of memory stack structures along the first horizontal direction and the second horizontal direction over the alternating stack, wherein each of the drain select level assemblies comprises a drain select level channel portion is located over a respective memory level channel portion; forming drain select level isolation strips; and forming drain select gate electrodes between the array of drain select level assemblies and the drain select level isolation strips, wherein each of the drain select gate electrodes laterally surrounds respective rows of the drain select level assemblies.

BRIEF DESCRIPTION OF THE DRAWINGS

FIG. 42B is a vertical cross-section view of the alternative embodiment of the second exemplary structure along the plane B-B' of FIG. 42C.

FIG. 42C is a top-down view of the alternative embodiment of the second exemplary structure after formation of a sacrificial spacer material layer according to the second embodiment of the present disclosure.

FIG. 43A is a vertical cross-section view of the alternative embodiment of the second exemplary structure along the plane A-A' of FIG. 43C.

FIG. 43B is a vertical cross-section view of the alternative embodiment of the second exemplary structure along the plane B-B' of FIG. 43C.

FIG. 43C is a top-down view of the alternative embodiment of the second exemplary structure after formation of sacrificial spacers according to the second embodiment of the present disclosure.

FIG. 44A is a vertical cross-section view of the alternative embodiment of the second exemplary structure along the plane A-A' of FIG. 44C.

FIG. 44B is a vertical cross-section view of the alternative embodiment of the second exemplary structure along the plane B-B' of FIG. 44C.

FIG. 44C is a top-down view of the alternative embodiment of the second exemplary structure after formation of drain select level isolation strips according to the second embodiment of the present disclosure.

FIG. 45A is a vertical cross-section view of the alternative embodiment of the second exemplary structure along the plane A-A' of FIG. 45C.

FIG. 45B is a vertical cross-section view of the alternative embodiment of the second exemplary structure along the plane B-B' of FIG. 45C.

FIG. 45C is a top-down view of the alternative embodiment of the second exemplary structure after formation of backside trenches according to the second embodiment of the present disclosure.

FIG. 46A is a vertical cross-section view of the alternative embodiment of the second exemplary structure along the plane A-A' of FIG. 46C.

Figure 46C:
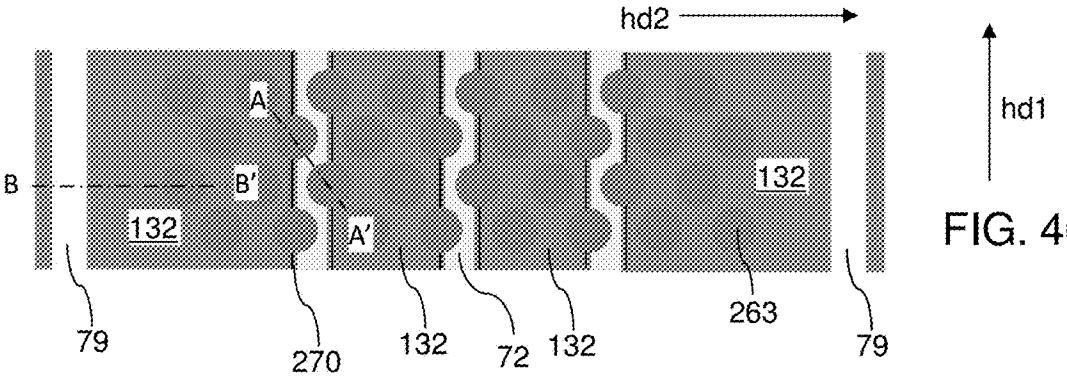
Figure 46B:
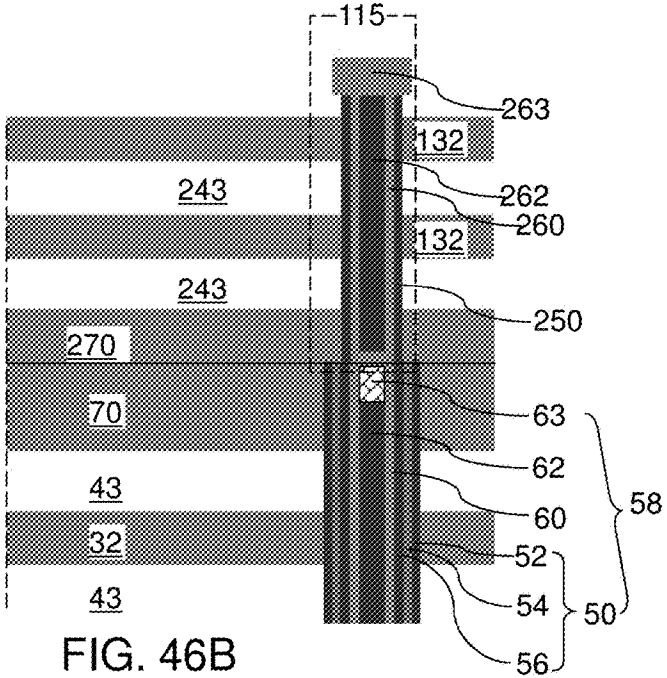

FIG. 46B is a vertical cross-section view of the alternative embodiment of the second exemplary structure along the plane B-B' of FIG. 46C.

FIG. 46C is a top-down view of the alternative embodiment of the second exemplary structure after removal of the sacrificial material layers and sacrificial matrix material layers according to the second embodiment of the present disclosure.

Figures 47A, 47B, 47C:
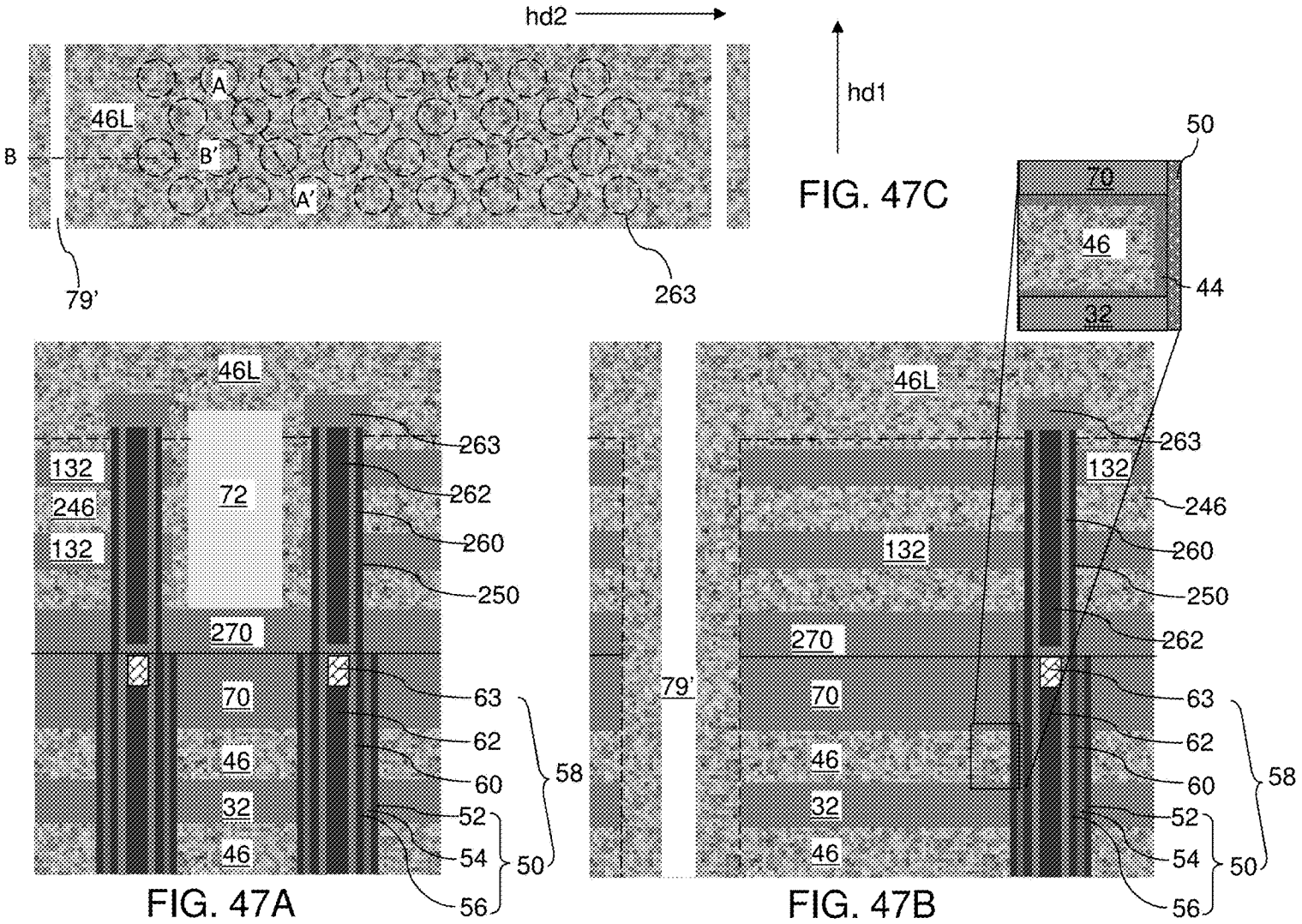

FIG. 47A is a vertical cross-section view of the alternative embodiment of the second exemplary structure along the plane A-A' of FIG. 47C.

FIG. 47B is a vertical cross-section view of the alternative embodiment of the second exemplary structure along the plane B-B' of FIG. 47C.

FIG. 47C is a top-down view of the alternative embodiment of the second exemplary structure after deposition of at least one conductive material in the backside recesses and over the array of drain select level assemblies according to the second embodiment of the present disclosure.

Figure 48C:
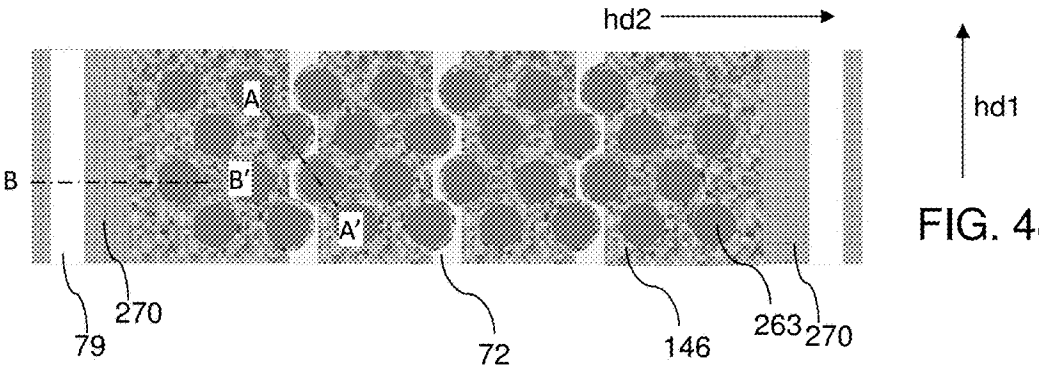
Figure 48B:
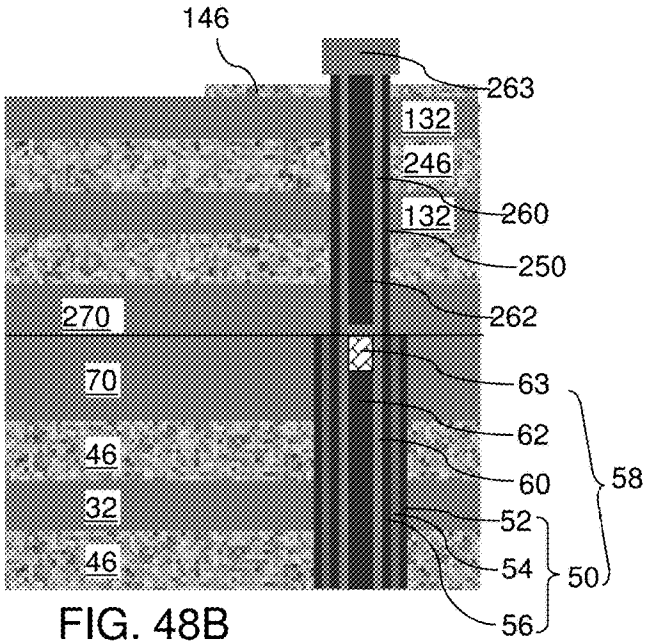
Figure 48A:
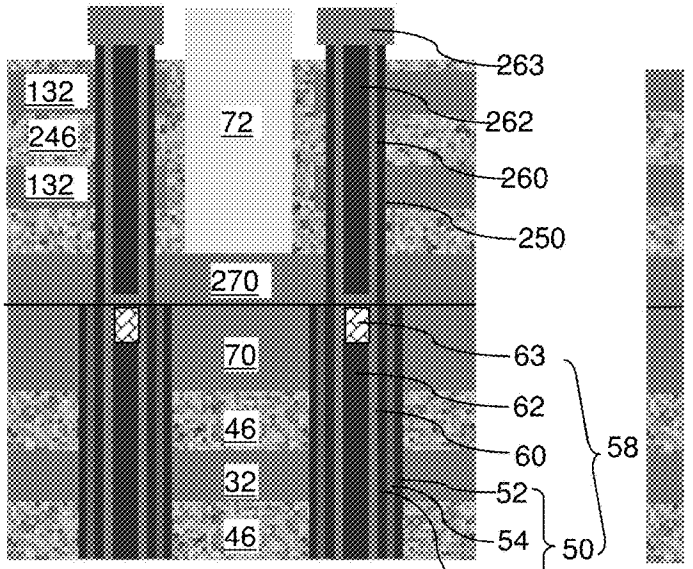

FIG. 48A is a vertical cross-section view of the alternative embodiment of the second exemplary structure along the plane A-A' of FIG. 48C.

FIG. 48B is a vertical cross-section view of the alternative embodiment of the second exemplary structure along the plane B-B' of FIG. 48C.

FIG. 48C is a top-down view of the alternative embodiment of the second exemplary structure after isotropically recessing the at least one conductive material to form electrically conductive layers and drain select gate electrodes according to the second embodiment of the present disclosure.

Figure 49C:
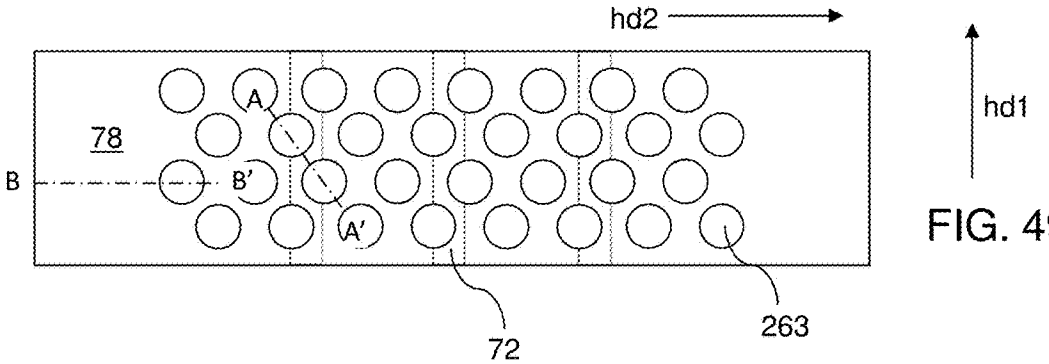
Figure 49B:
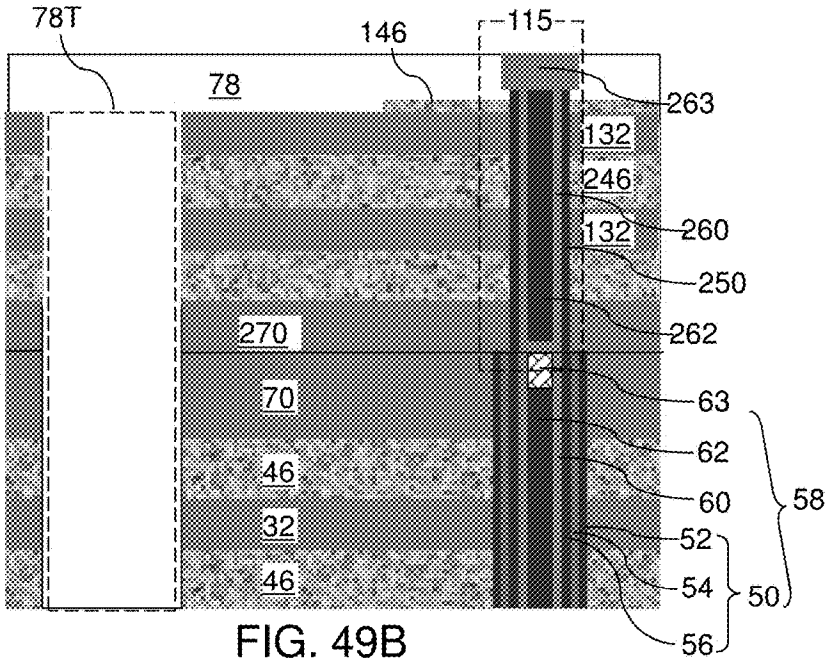
Figure 49A:
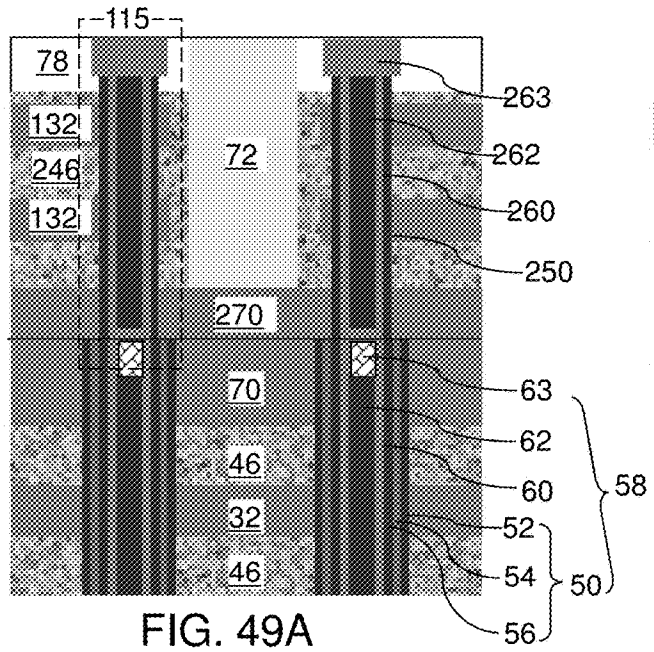

FIG. 49A is a vertical cross-section view of the alternative embodiment of the second exemplary structure along the plane A-A' of FIG. 49C.

FIG. 49B is a vertical cross-section view of the alternative embodiment of the second exemplary structure along the plane B-B' of FIG. 49C.

FIG. 49C is a top-down view of the alternative embodiment of the second exemplary structure after formation of a dielectric fill material layer according to the second embodiment of the present disclosure.

DETAILED DESCRIPTION

As discussed above, the present disclosure is directed to a three-dimensional memory device employing drain select level isolation structures and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The various embodiments of the present disclosure can be employed to form drain select level isolation structures which permit selection of one group of memory stack structures (e.g., NAND strings) among multiple groups of memory stack structures connected to same set of bit lines. In case more than two groups of memory stack structures are provided between a neighboring pair of backside trenches, formation of drain select level isolation structures prior to replacement of sacrificial material layers with electrically conductive layers prevents replacement of center portions of the sacrificial material layers between drain select level isolation structures.

In view of this, methods of forming electrically conductive layers and drain select level isolation structures of various embodiments are provided which permit replacement of center portions of the sacrificial material layers between drain select level isolation structures. As used herein, a drain select level corresponds to the location of the drain select gate(s) of the three-dimensional memory device. For example, the drain select level may be located between the bottom surface of the lowest drain select gate and the top surface of the highest drain select gate.

Figure 1:
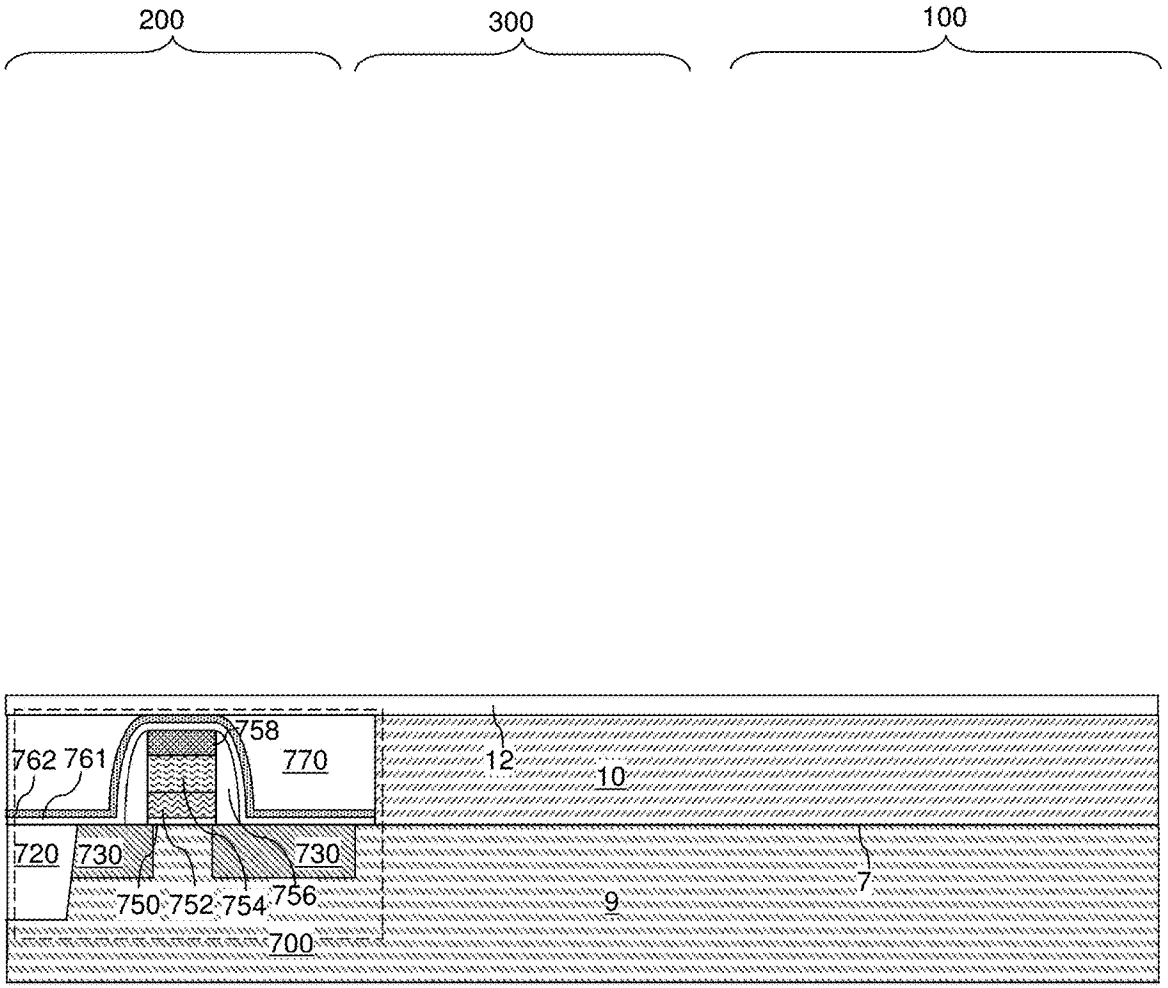
FIG. 1 is a schematic vertical cross-sectional view of a first exemplary structure after formation of at least one peripheral device, a semiconductor material layer, and a base insulating layer according to a first embodiment of the present disclosure.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A base insulating layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment, the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a base insulating layer 12 can be formed above the semiconductor material layer 10 and the planarization dielectric layer 770. The base insulating layer 12 can be, for example, silicon oxide layer. The thickness of the base insulating layer 12 can be in a range from 3 nm to 30 nm, although lesser and greater thicknesses can also be employed.

Figure 2:
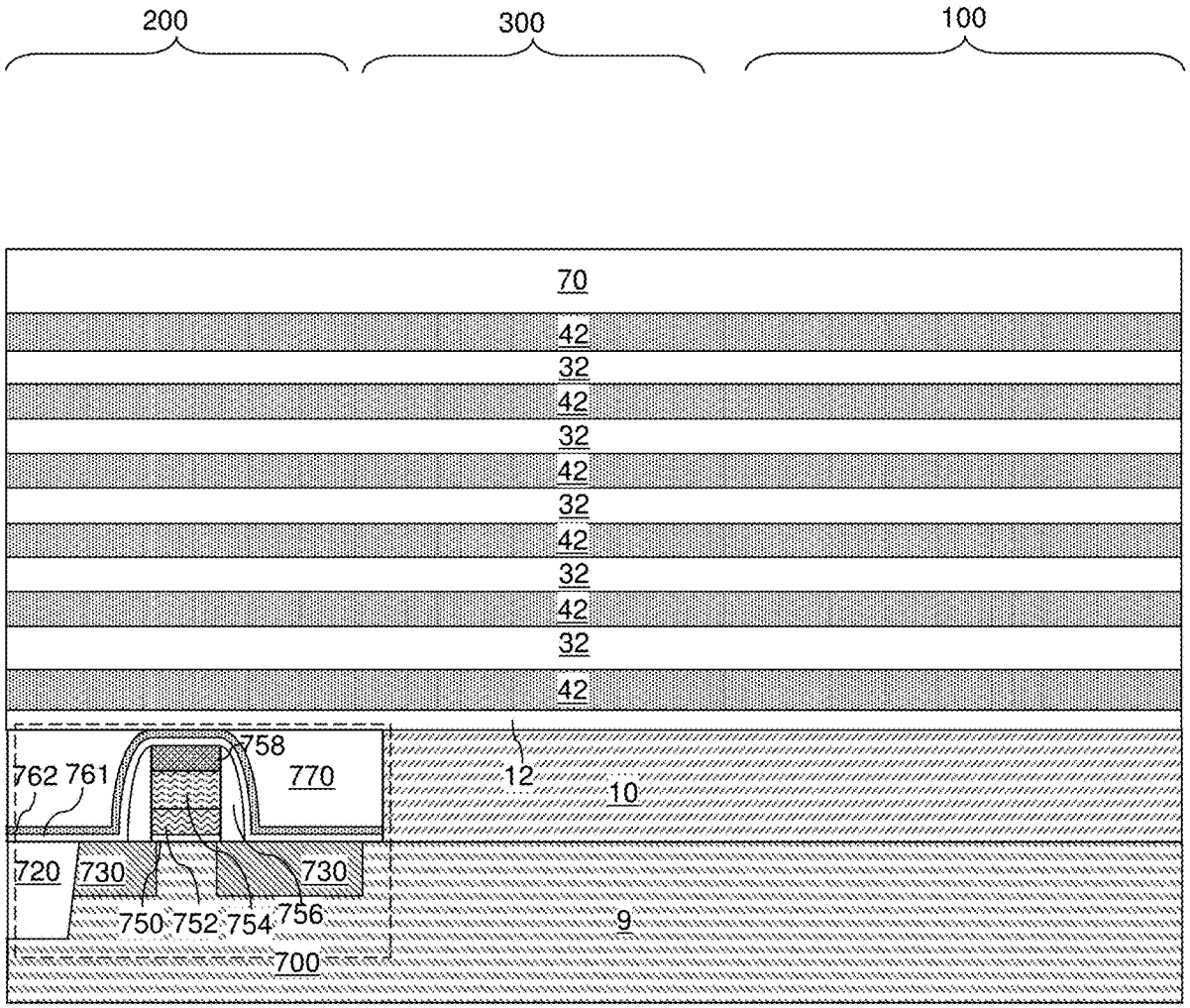
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the base insulating layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
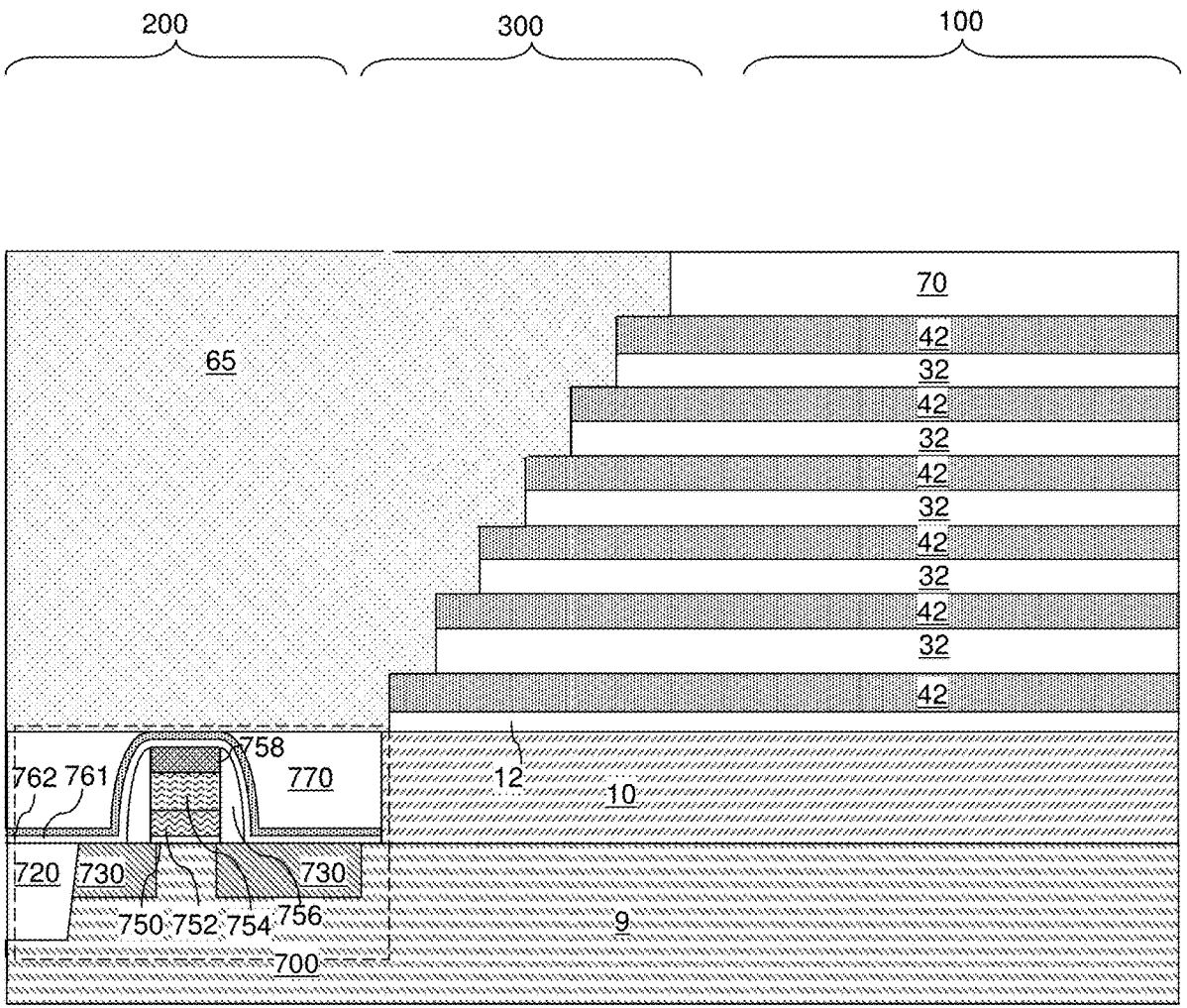
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the memory array region (e.g., device region) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP).

The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
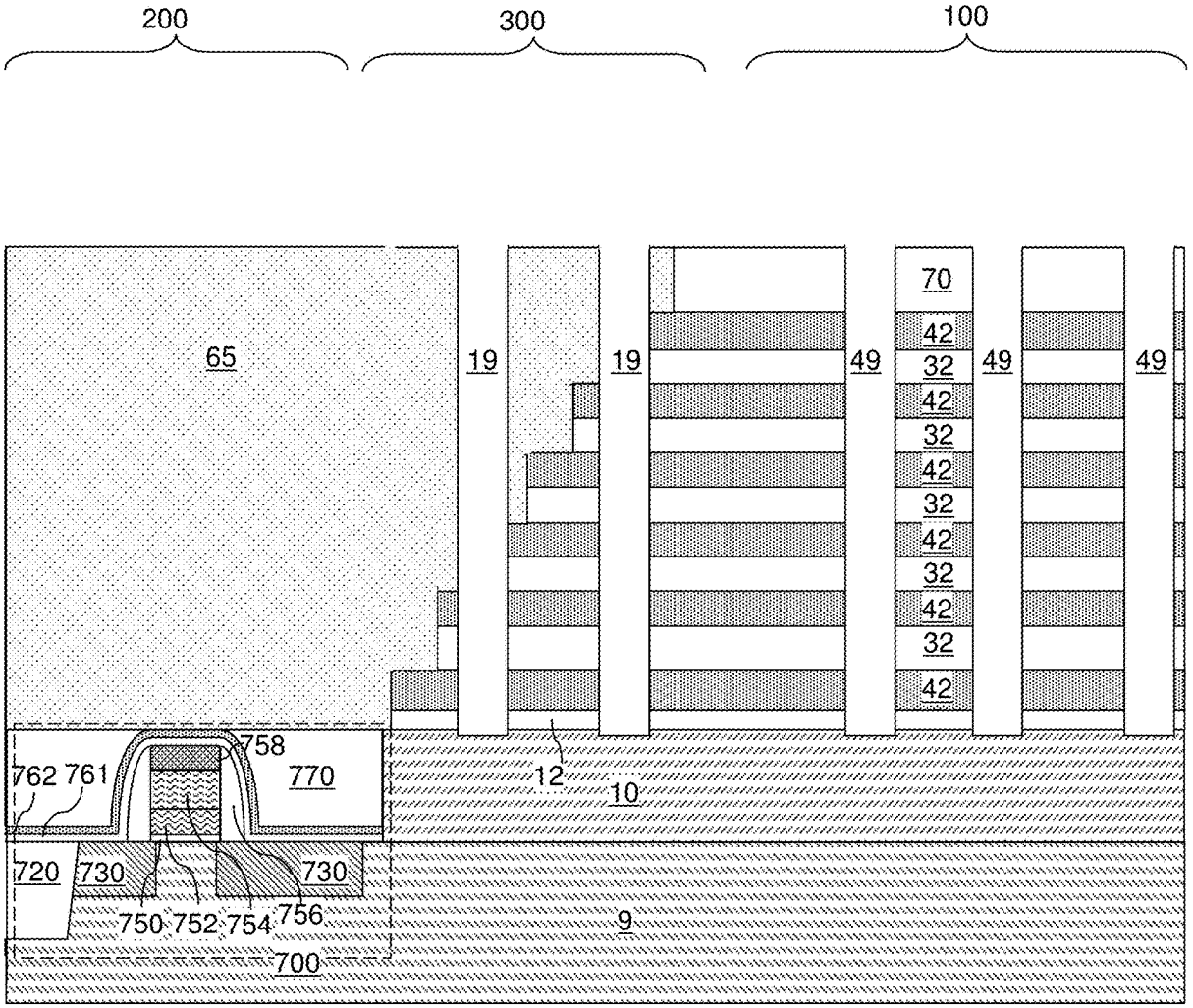
FIG. 4A is a schematic vertical cross-sectional view of the first exemplary structure after formation of memory openings and support openings according to the first embodiment of the present disclosure.
Figure 4B:
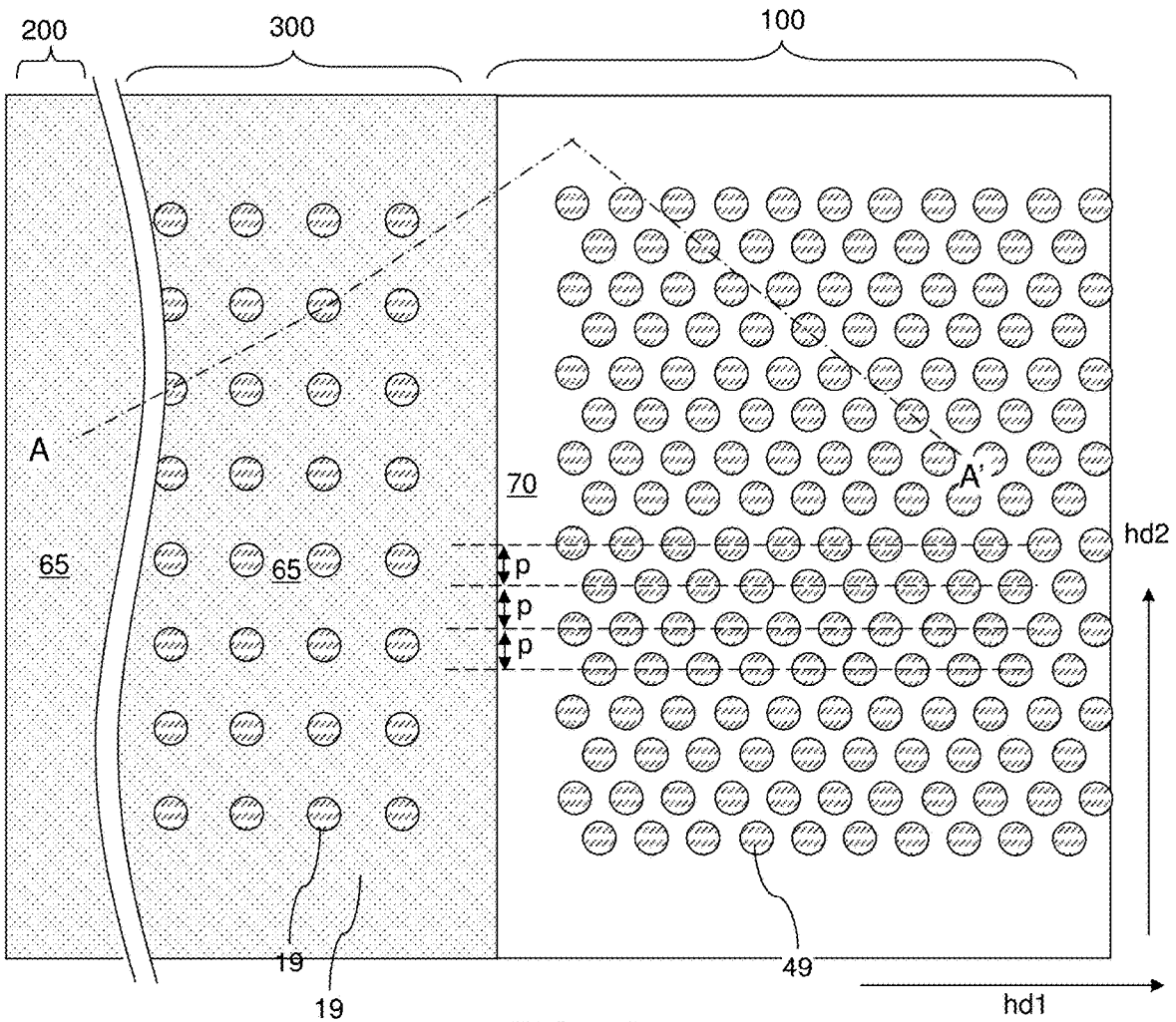
FIG. 4B is a top-down view of the first exemplary structure of FIG. 4A. The vertical plane A-A' is the plane of the schematic vertical cross-sectional view of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the base insulating layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Figure 5B:
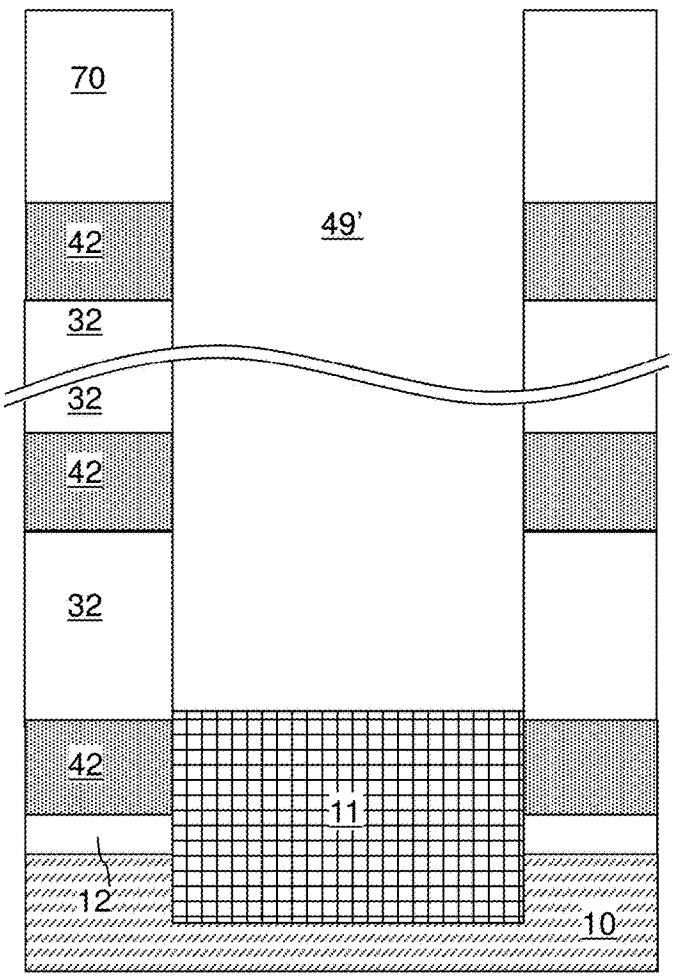
FIGS. 5A-5H are sequential schematic vertical cross-sectional views of a memory opening within the first exemplary structure during processing steps employed to form memory stack structures according to the first embodiment of the present disclosure.
Figure 5A:
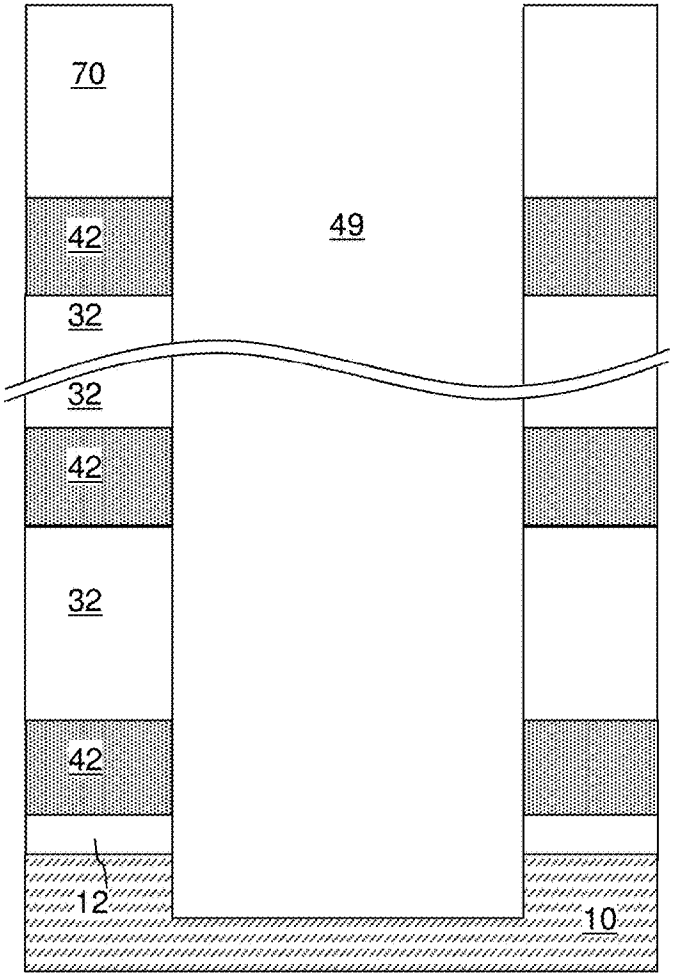

Referring to FIG. 5A, a memory opening 49 in the exemplary device structure of FIGS. 4A and 4B is illustrated. The memory opening 49 extends through the insulating cap layer 70, the alternating stack (32, 42), the base insulating layer 12, and optionally into an upper portion of the semiconductor material layer 10. At this processing step, each support opening 19 can extend through the retro-stepped dielectric material portion 65, a subset of layers in the alternating stack (32, 42), the base insulating layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10.

In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5D:
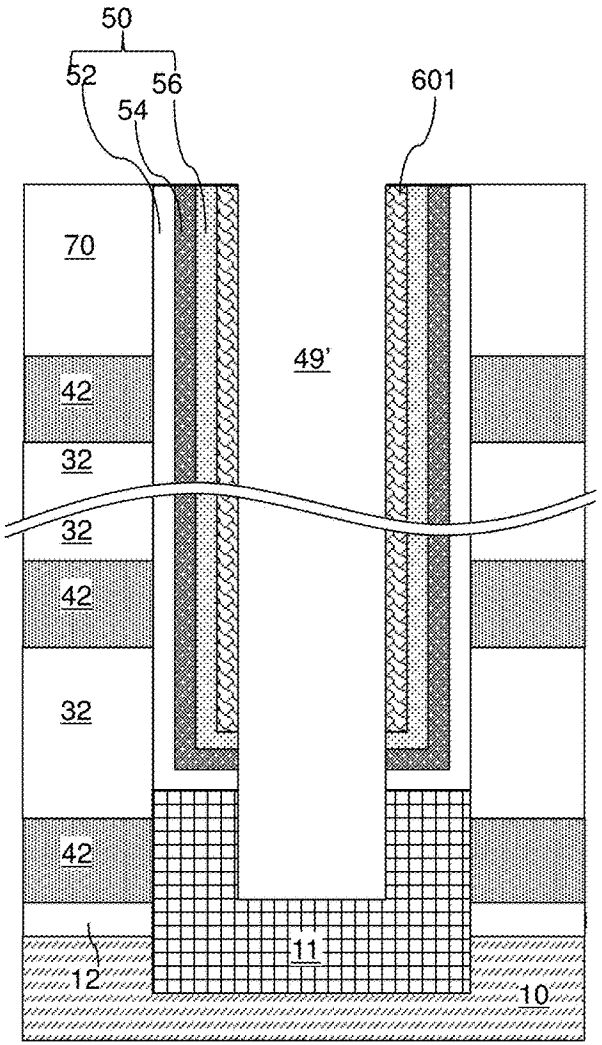
Figure 5C:
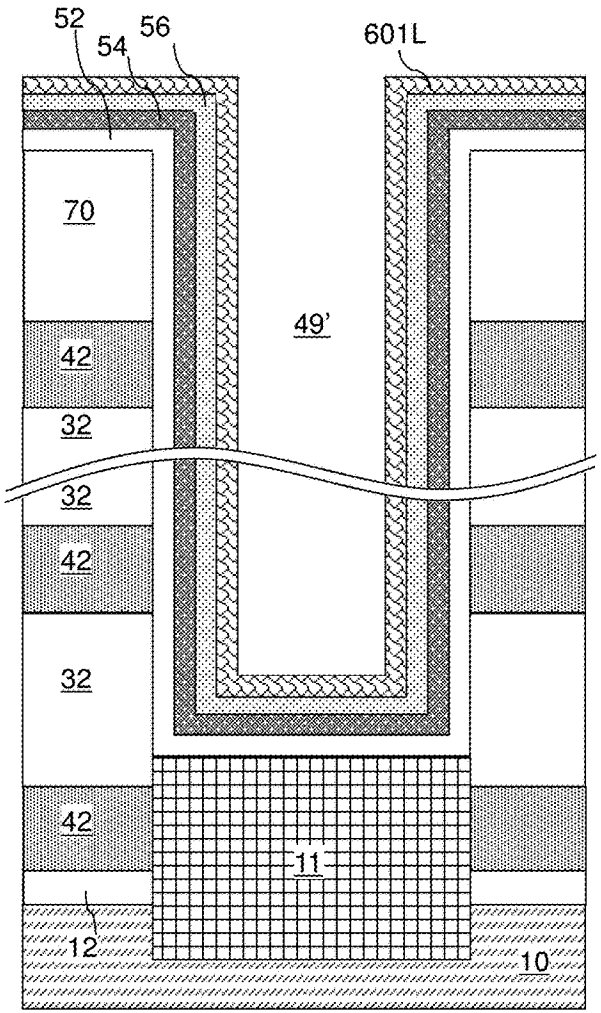

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5F:
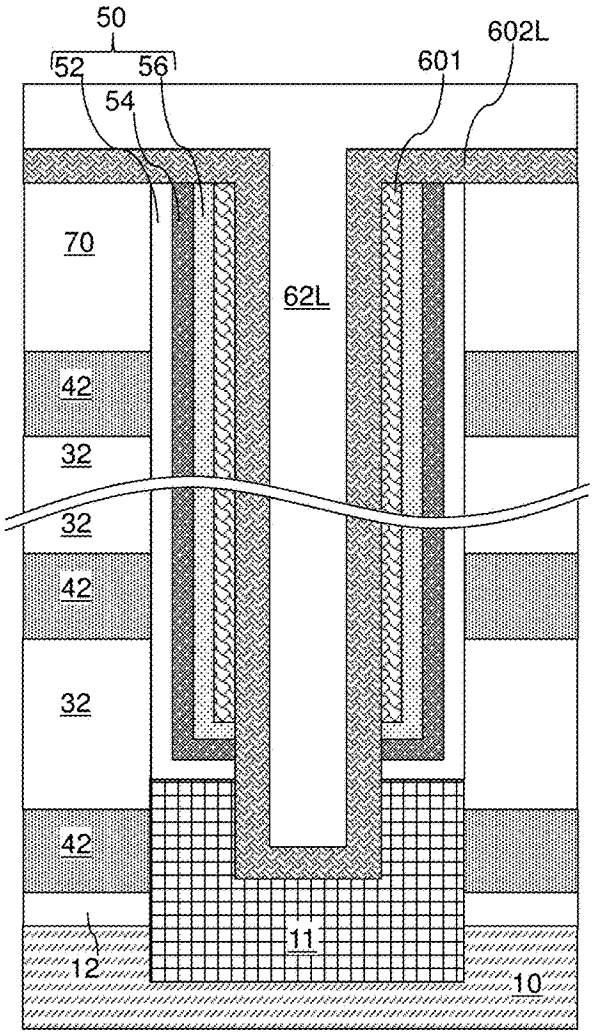
Figure 5E:
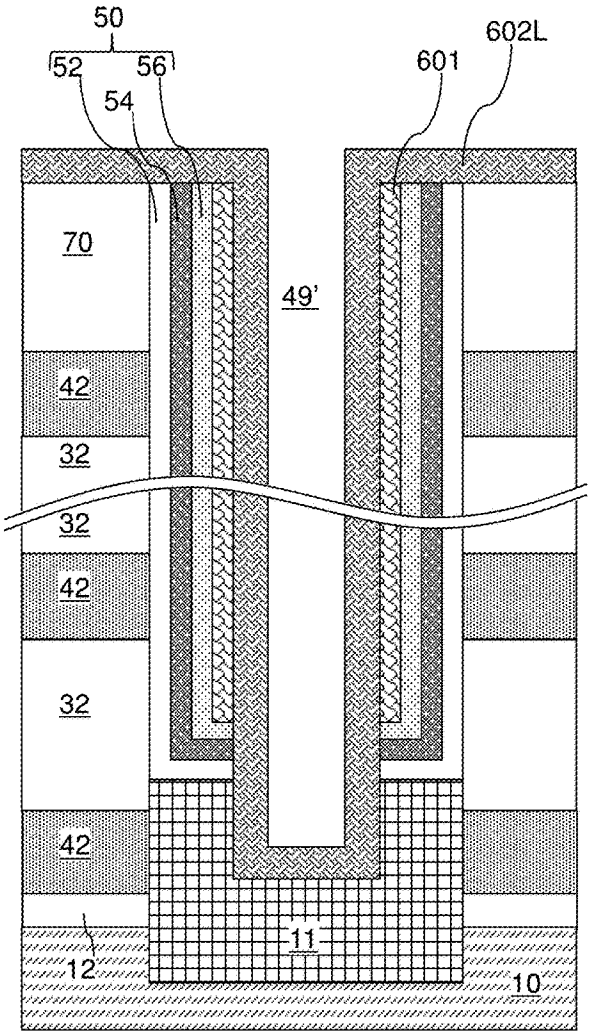

Referring to FIG. 5E, a second semiconductor channel layer 602 can be deposited directly on the semiconductor surface of the pedestal channel portion 11 or the semiconductor material layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
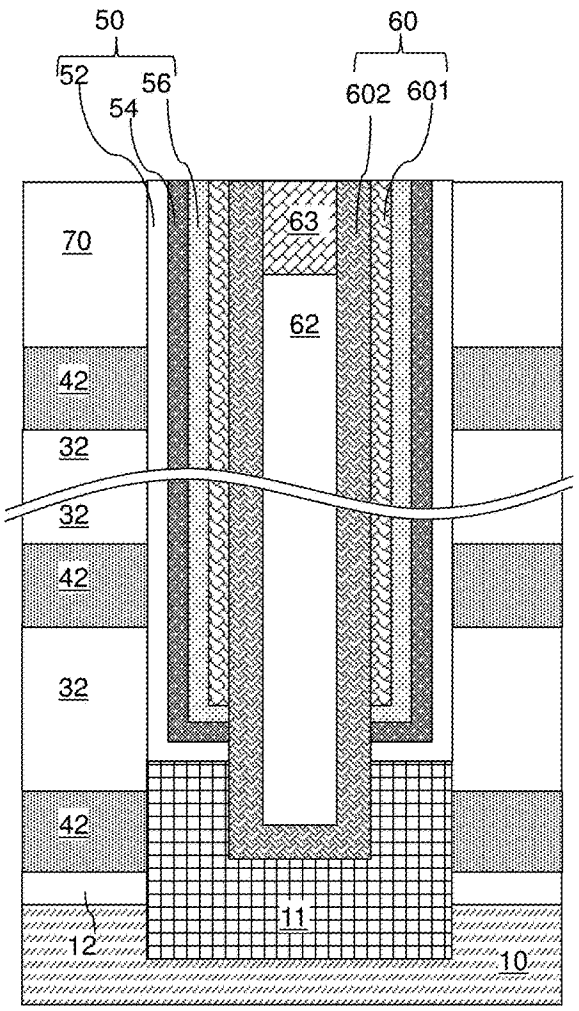
Figure 5G:
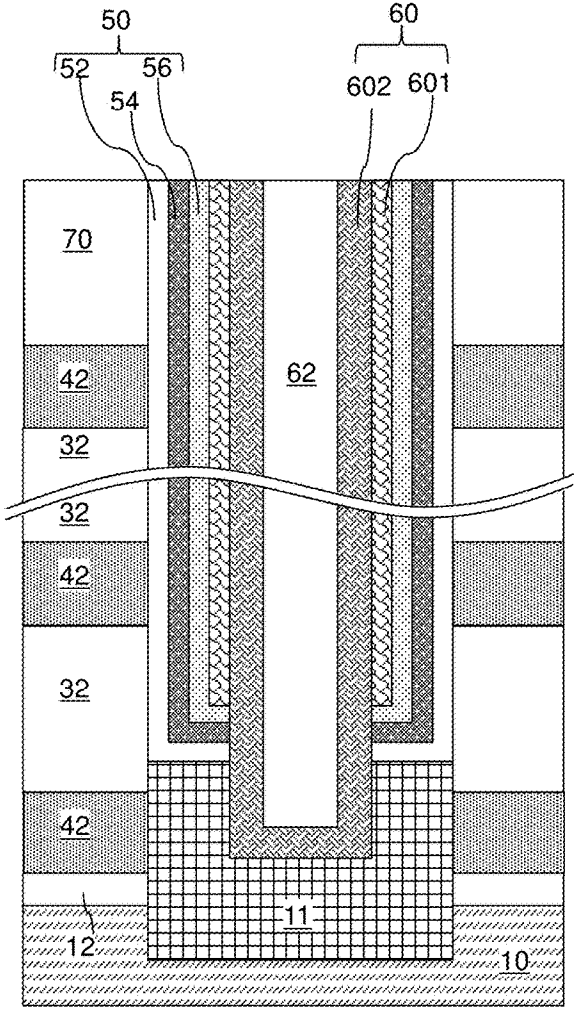
Figure 6A:
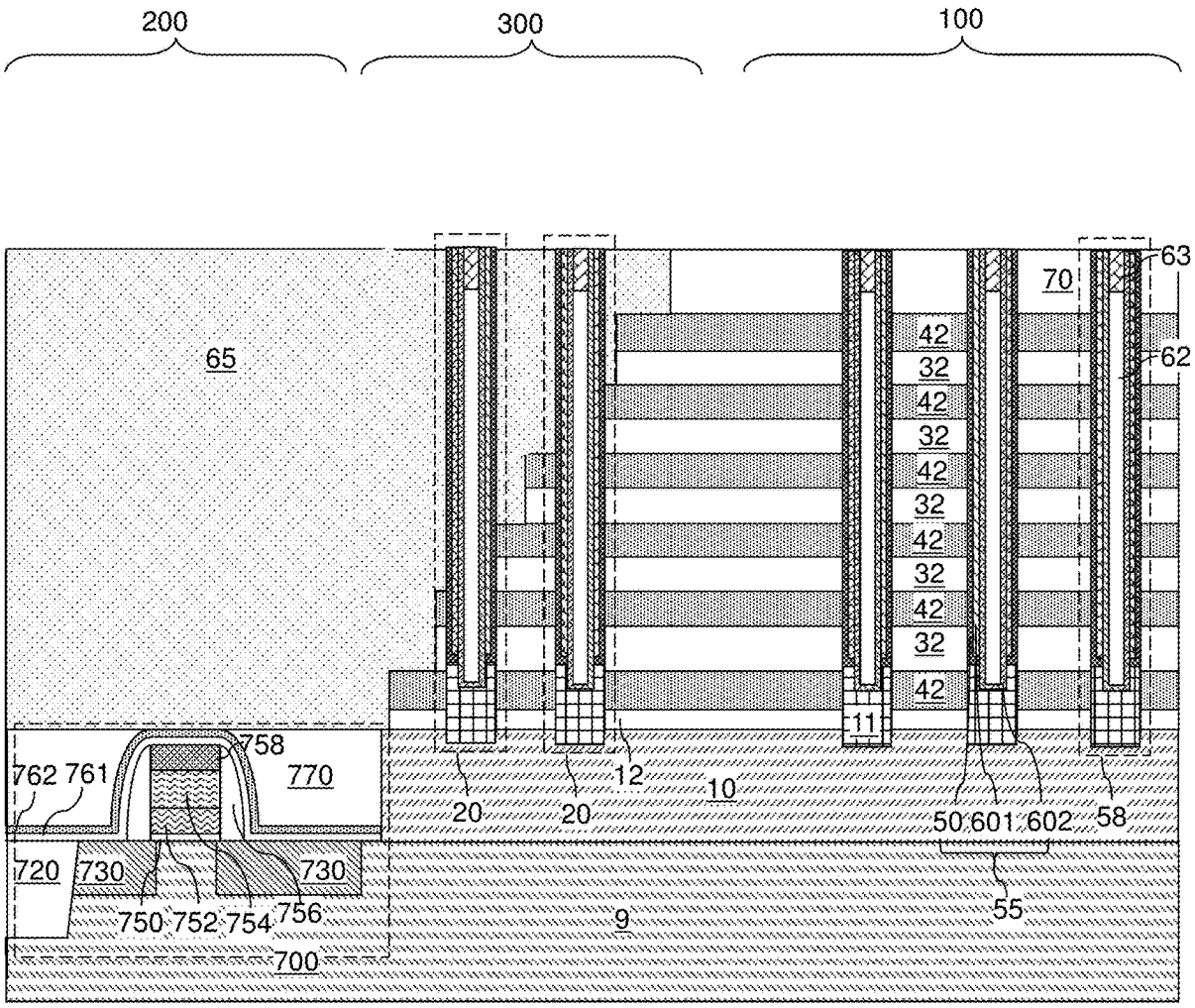
FIG. 6A is a schematic vertical cross-sectional view of the first exemplary structure after formation of memory opening fill structures and support opening fill structures according to the first embodiment of the present disclosure.
Figure 6B:
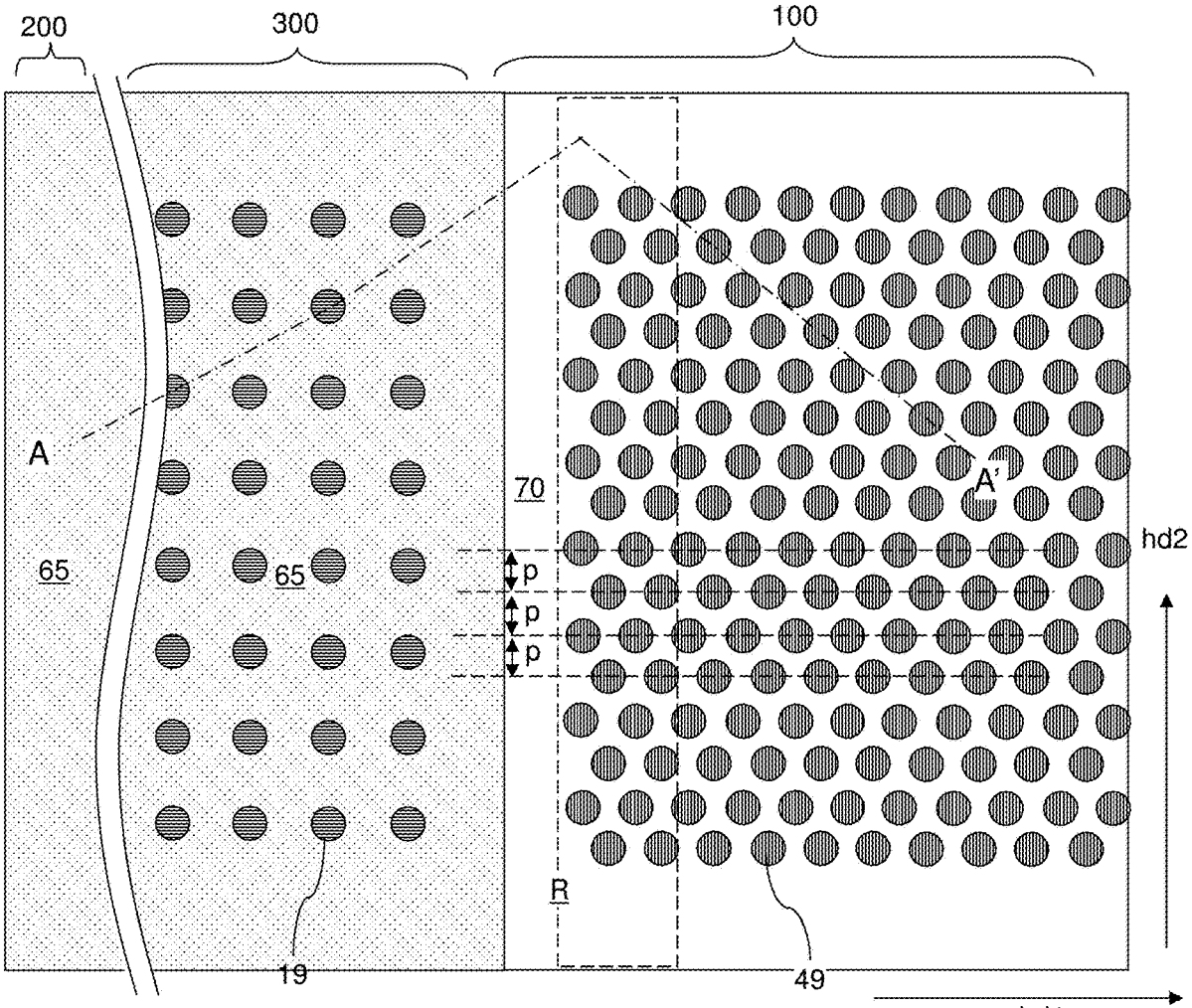
FIG. 6B is a top-down view of the first exemplary structure of FIG. 6A. The vertical plane A-A' is the plane of the schematic vertical cross-sectional view of FIG. 6A.
Figure 7C:
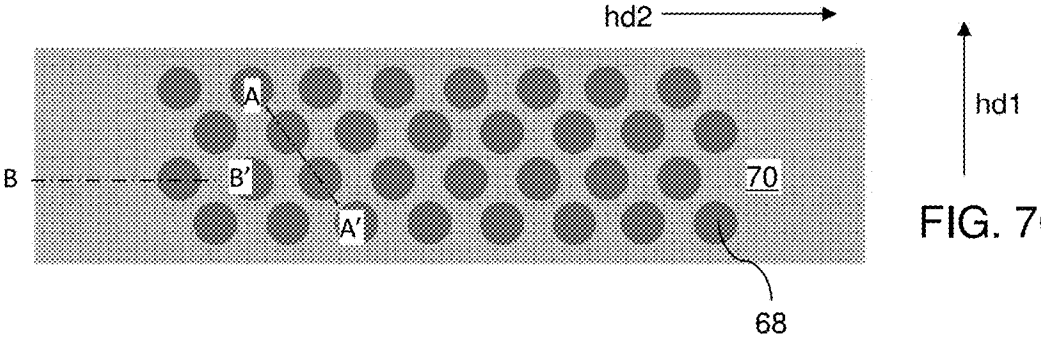
FIG. 7C is a top-down view of the region R in the first exemplary structure of FIG. 6B.
Figure 7B:
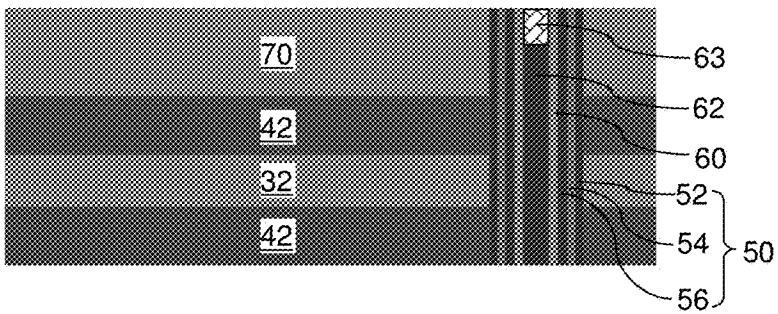
FIG. 7B is a vertical cross-section view of the first exemplary structure along the plane B-B' of FIG. 7C.
Figure 7A:
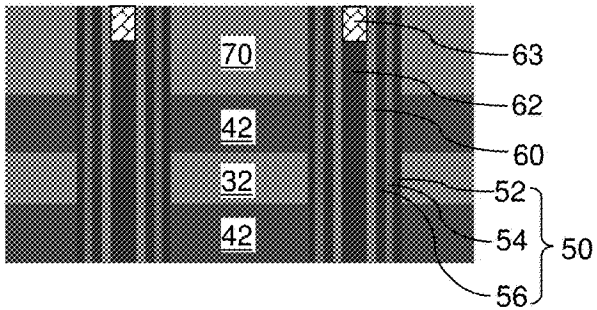
FIG. 7A is a vertical cross-section view of the first exemplary structure along the plane A-A' of FIG. 7C.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a memory level channel portion 60 through which electrical current can flow when a vertical NAND device including the memory level channel portion 60 is turned on. A tunneling dielectric layer 56 is surrounded by a charge storage layer 54, and laterally surrounds a portion of the memory level channel portion 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Enhanced doping regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the enhanced doping regions 63.

According to an embodiment of the present disclosure, the enhanced doping regions 63 can have a doping of the same conductivity type as the memory level channel portions 60, which is the first conductivity type. Thus, the semiconductor material layer 10, the pedestal channel portions 11, the memory level channel portions 60, and the enhanced doping regions 63 can have the same type of doping, i.e., the doping of the first conductivity type. As such, the enhanced doping regions 63 are not source regions or drain regions of the vertical field effect transistors that are formed through the memory openings 49. Each enhanced doping region 63 is a portion of a respective vertical semiconductor channel, and has a greater dopant concentration than the memory level channel portions 60 or drain select level channel portions to be subsequently formed. By locally increasing the dopant concentration in the enhanced doping regions 63, the conductivity of the vertical semiconductor channel can be increased during operation of the vertical field effect transistors to be subsequently formed.

In an illustrative example, each of the first and second semiconductor channel layers (601, 602) can have a dopant concentration in a range from $1.0\times10^{14}/cm^3$ to $3.0\times10^{17}/cm^3$, and each of the enhanced doping regions 63 can have a dopant concentration in a range from $1.0\times10^{16}/cm^3$ to $1.0\times10^{20}/cm^3$. Drain select level channel portions to be subsequently formed can have a dopant concentration in a range from $1.0\times10^{14}/cm^3$ to $3.0\times10^{17}/cm^3$.

Each combination of a memory film 50 and a memory level channel portion 60 (which is a portion of a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52.

Referring to FIGS. 6A, 6B, and 7A-7C, the first exemplary structure is illustrated after formation of memory opening fill structures 58 and support pillar structures 20 within the memory openings 49 and the support openings 19, respectively. Each combination of a pedestal channel portion 11 (if present), a memory stack structure 55, a dielectric core 62, and an enhanced doping region 63 within a memory opening 49 is herein referred to as a memory opening fill structure 58. Each combination of a pedestal channel portion 11 (if present), a memory film 50, a memory level channel portion 60, a dielectric core 62, and an enhanced doping region 63 (which is an electrically inactive dummy structure that is not directly contacted by any conductive structure from above in the final device structure) within each support opening 19 fills the respective support openings 19, and constitutes a support pillar structure 20. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each exemplary memory stack structure 55 includes a memory level channel portion 60, which may comprise multiple semiconductor channel layers (601, 602), and a memory film 50. The memory film 50 may comprise a tunneling dielectric layer 56 laterally surrounding the memory level channel portion 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the memory level channel portion 60.

Figure 8C:
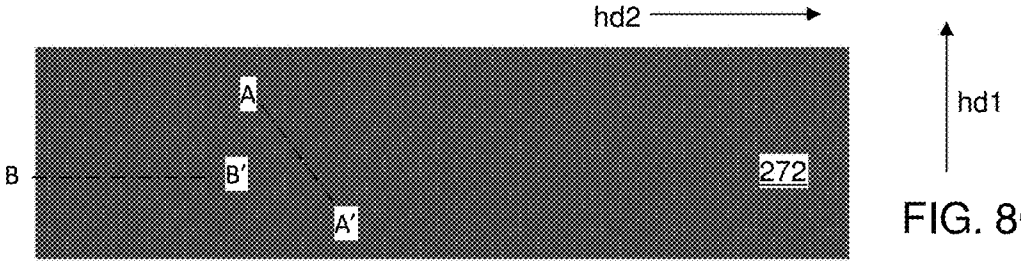
FIG. 8C is a top-down view of the region R in the first exemplary structure after formation of an isolation spacer layer and a sacrificial matrix material layer according to the first embodiment of the present disclosure.
Figure 8B:
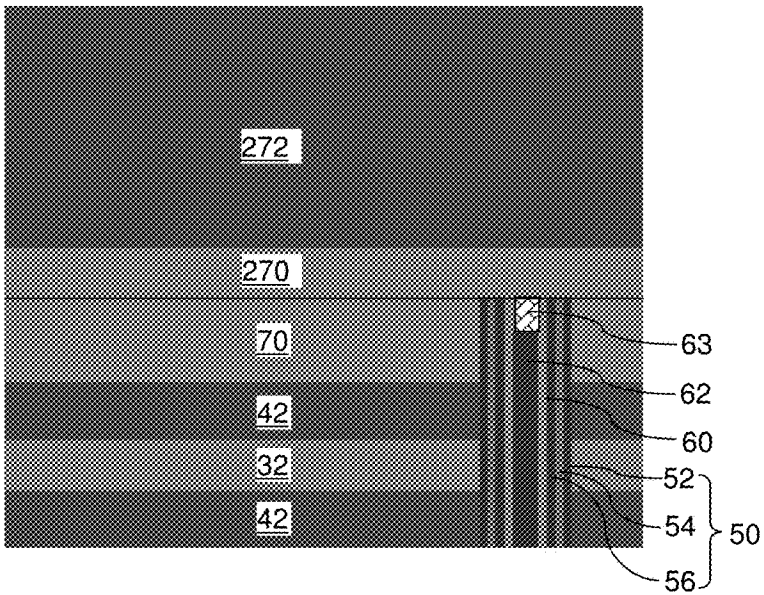
FIG. 8B is a vertical cross-section view of the first exemplary structure along the plane B-B' of FIG. 8C.
Figure 8A:
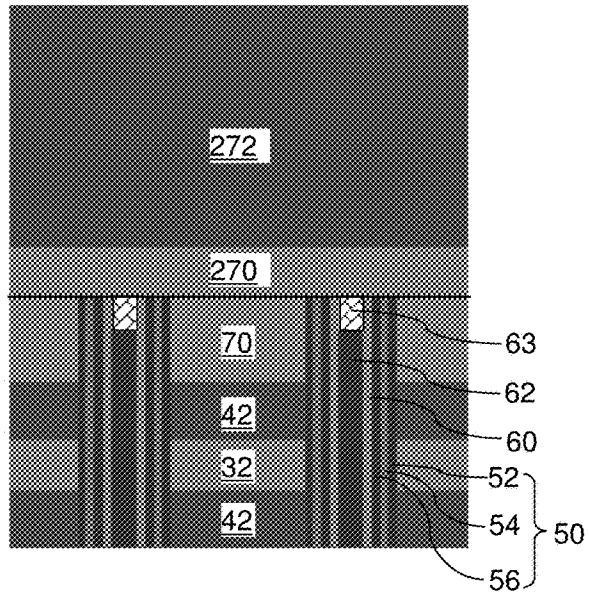
FIG. 8A is a vertical cross-section view of the first exemplary structure along the plane A-A' of FIG. 8C.

Generally, the first exemplary structure includes an alternating stack of insulating layers 32 and spacer material layers that is formed over a substrate (9, 10) such that the spacer material layers are formed as sacrificial material layers 42 and subsequently replaced with electrically conductive layers, or are formed as electrically conductive layers. The array of memory stack structures 55 extends through the alternating stack and is arranged as rows that extend along a first horizontal direction hd1 and are spaced along a second horizontal direction hd2. Each of the memory stack structures 55 comprises a memory film 50 and a memory level channel portion contacting an inner sidewall of the memory film;

Referring to FIGS. 8A-8C, an isolation spacer layer 270 can be formed over the insulating cap layer 70 and the memory stack structures 55. The isolation spacer layer 270 can include a dielectric material such as silicon oxide, a dielectric metal oxide, or silicon oxynitride, and can have a thickness in a range from 5 nm to 100 nm, although lesser and greater thicknesses can also be employed.

At least one sacrificial matrix material layer can be subsequently formed. In one embodiment, the at least one sacrificial matrix material layer can consist of a single sacrificial matrix material layer, which is herein referred to as a sacrificial matrix material layer 272. The sacrificial matrix material layer 272 includes a material that can be removed selective to the material of the underlying layer, i.e., the isolation spacer layer 270. In one embodiment, the sacrificial matrix material layer 272 can include the same material as the sacrificial material layers 42. In an illustrative example, the sacrificial matrix material layer 272 and the sacrificial material layers 42 can include silicon nitride. In one embodiment, the sacrificial matrix material layer 272 can have a thickness that is in a range from twice the average thickness of the sacrificial material layers 42 to 10 times the average thickness of the sacrificial material layers 42. For example, the sacrificial matrix material layer 272 can have a thickness in a range from 100 nm to 600 nm, although lesser and greater thicknesses can also be employed.

Figure 9C:
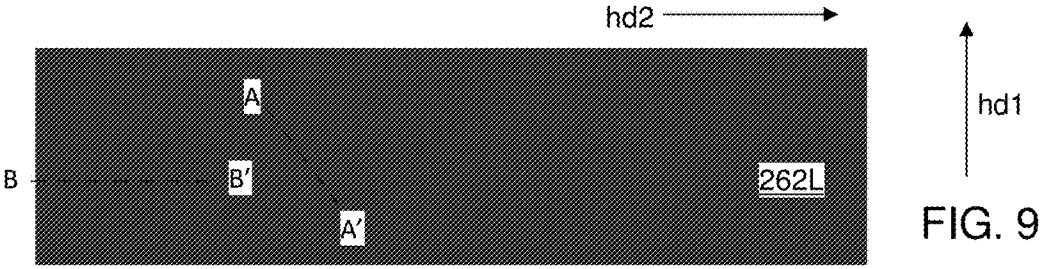
FIG. 9C is a top-down view of the region R in the first exemplary structure after formation of an array of openings extending through the sacrificial matrix material layer, gate dielectrics, a semiconductor material layer, and a drain select level dielectric core layer according to the first embodiment of the present disclosure.
Figure 9B:
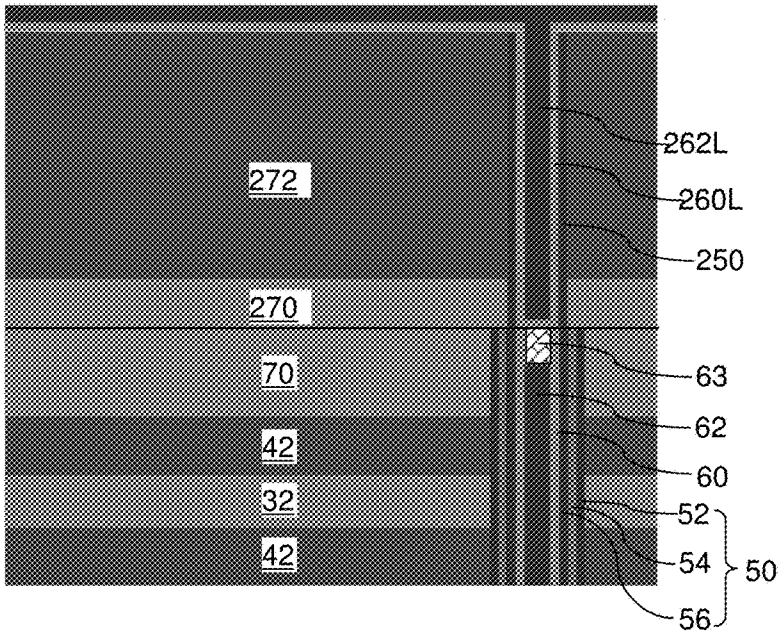
FIG. 9B is a vertical cross-section view of the first exemplary structure along the plane B-B' of FIG. 9C.
Figure 9A:
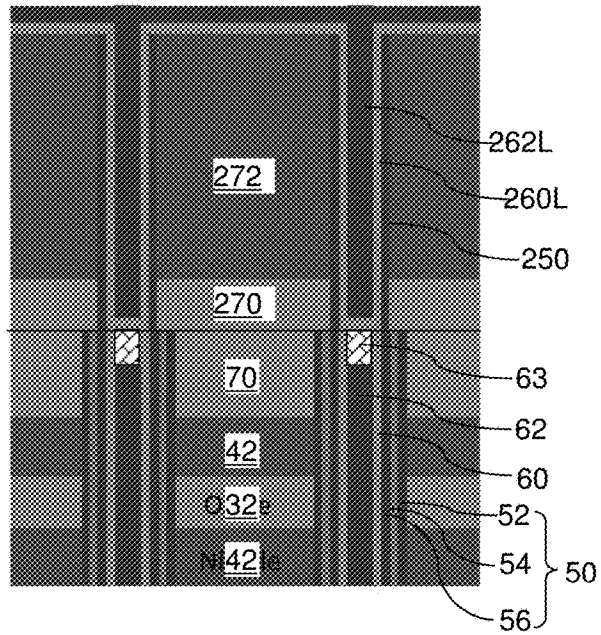
FIG. 9A is a vertical cross-section view of the first exemplary structure along the plane A-A' of FIG. 9C.

Referring to FIGS. 9A-9C, arrays of cylindrical openings can be formed through the sacrificial matrix material layer 272. The array of cylindrical openings can have the same periodicity as the memory openings 49 and the support openings 19. In one embodiment, a photoresist layer (not shown) can be applied over the sacrificial matrix material layer 272, and the same lithographic mask that forms the pattern for the memory openings 49 and the support openings 19 can be employed to pattern the photoresist layer. The pattern in the photoresist layer can be subsequently transferred through the sacrificial matrix material layer 272 to form the arrays of cylindrical openings.

In one embodiment, each of the cylindrical openings can be aligned to an underlying one of the memory opening fill structures 58 and the support opening fill structures 20.

Thus, a vertical axis passing through the geometrical center of each cylindrical opening can coincide with, or can be laterally offset by less than the overly tolerance of the lithographic alignment process employed during patterning of the photoresist later from, a vertical axis passing through the geometrical center of the underlying one of the memory opening fill structures 58 and the support opening fill structures 20. Generally, the same lithographic mask employed to pattern the memory openings 49 and the support openings 19 can be employed to form the array of cylindrical openings. Thus, each array of cylindrical openings overlying an array of the memory stack structures 58 can have the same periodicity as the array of memory stack structures 58 along the first horizontal direction hd1 and the second horizontal direction hd2.

A top surface of a respective one of the memory level channel portion 60 and the enhanced doping regions 63 can be physically exposed at the bottom of each cylindrical opening. The lateral dimensions of the cylindrical openings may be the same as, may be greater than, or may be less than, the lateral dimensions of the memory openings 49 or the support openings 19 depending on the exposure conditions during lithographic patterning of the photoresist layer. As such, the cylindrical openings may have any two-dimensional closed shape that generally matches the horizontal cross-sectional shape of the underlying memory opening 49 or the underlying support opening 19.

A plurality of gate dielectrics 250 can be formed on the sidewalls of the cylindrical openings. The plurality of gate dielectrics 250 can be formed by deposition of a conformal gate dielectric material layer such as a silicon oxide layer and/or a dielectric metal oxide layer, and by an anisotropic etch process that etches the horizontal portions of the conformal gate dielectric material layer. Thus, each gate dielectric 250 can have a tubular shape. The horizontal cross-sectional shape of each gate dielectric 250 can be independent of the height of the cross-sectional plane. The thickness, as measured between an inner sidewall and an outer sidewall, of each gate dielectric 250 can be in a range from 1.5 nm to 10 nm, such as from 2 nm to 6 nm, although lesser and greater thicknesses can also be employed.

A conformal semiconductor material layer 260L can be deposited on the inner sidewalls of the gate dielectrics 250 and over the sacrificial matrix material layer 272. The conformal semiconductor material layer 260L includes a semiconductor material (e.g., polysilicon or amorphous silicon) having a doping of the first conductivity type, which is the same conductivity type as the doping of the memory level channel portions 60 and the enhanced doping regions 63. The conformal semiconductor material layer 260L can be deposited by low pressure chemical vapor deposition (LPCVD) or atomic layer deposition (ALD), and can be doped by in-situ doping. The thickness of the conformal semiconductor material layer 260L can be in a range from 4 nm to 20 nm, although lesser and greater thicknesses can also be employed.

In case the cylindrical openings are not completely filled with the conformal semiconductor material layer 260L, a drain select level dielectric core layer 262L can be deposited on the conformal semiconductor material layer 260L in unfilled volumes of the cylindrical openings. The drain select level dielectric core layer 262L includes a dielectric material such as silicon oxide.

Figure 10C:
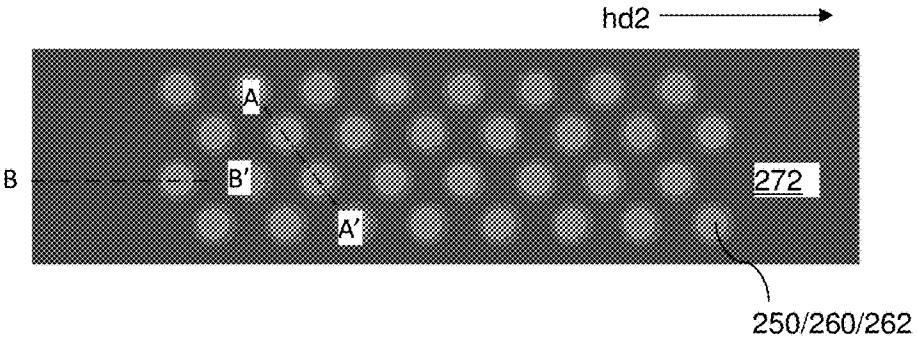
FIG. 10C is a top-down view of the region R in the first exemplary structure after formation of drain select level channel portions and drain select level dielectric cores according to the first embodiment of the present disclosure.
Figure 10B:
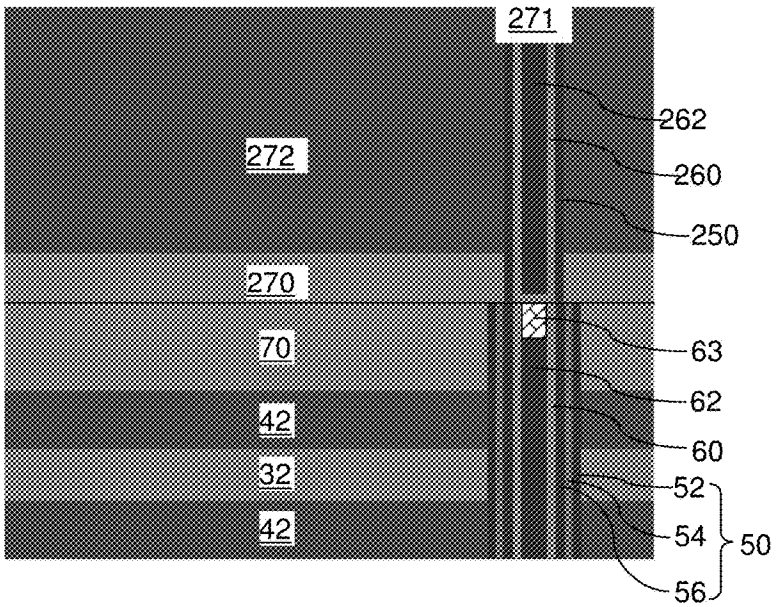
FIG. 10B is a vertical cross-section view of the first exemplary structure along the plane B-B' of FIG. 10C.
Figure 10A:
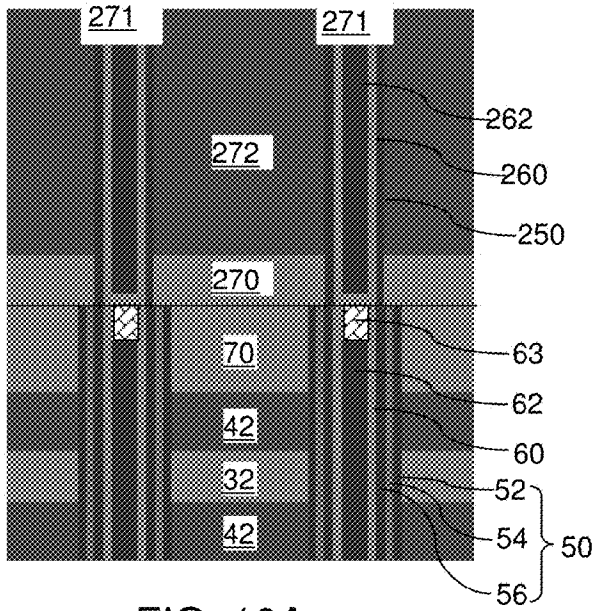
FIG. 10A is a vertical cross-section view of the first exemplary structure along the plane A-A' of FIG. 10C.

Referring to FIGS. 10A-10C, a recess etch can be performed to remove horizontal portions of the drain select level dielectric core layer 262L and the conformal semiconductor material layer 260L from above the top surface of the sacrificial matrix material layer 272. The recess etch process can include a single etch step that removes the materials of the drain select level dielectric core layer 262L and the conformal semiconductor material layer 260L indiscriminately, or can include a first etch step that removes the material of the drain select level dielectric core layer 262L and a second etch step that removes the material of the conformal semiconductor material layer 260L.

After removal of the horizontal portions of the drain select level dielectric core layer 262L and the conformal semiconductor material layer 260L, the etch step(s) of the recess etch process can be extended to vertically recess each of the drain select level dielectric core layer 262L and the conformal semiconductor material layer 260L below the horizontal plane including the top surface of the sacrificial matrix material layer 272. The recess depth below the horizontal plane including the top surface of the sacrificial matrix material layer 272 can be in a range from 40 nm to 200 nm, although lesser and greater recess depths can also be employed.

Each patterned portion of the conformal semiconductor material layer 260L in the respective cylindrical openings constitutes a drain select level channel portion 260. Each patterned portion of the drain select level dielectric core layer 262L constitutes a drain select level dielectric core 262. Each drain select level dielectric core 262 can have a pillar shape. Each drain select level channel portion 260 laterally encircles a drain select level dielectric core 262. Each gate dielectric 250 laterally encircles a drain select level channel portion 260.

Subsequently, an isotropic etch process can be performed to isotropically etch the material of the sacrificial matrix material layer 272. Vertical and horizontal surfaces of the sacrificial matrix material layer 272 can be isotropically recessed. The maximum lateral dimension of each recessed region 271 overlying the drain select level channel portions 260 increases by twice the recess distance, which can be in a range from 5 nm to 30 nm, although lesser and greater recess distances can also be employed.

Figure 11C:
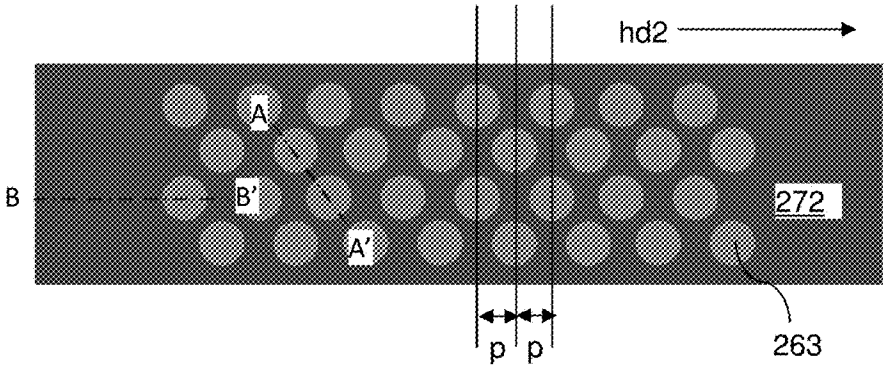
FIG. 11C is a top-down view of the region R in the first exemplary structure after formation of drain regions according to the first embodiment of the present disclosure.
Figure 11B:
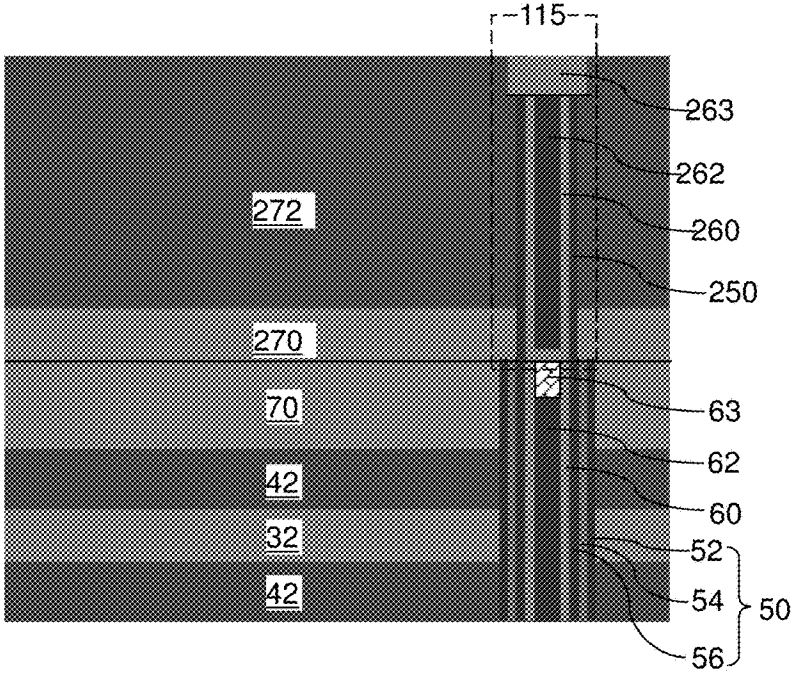
FIG. 11B is a vertical cross-section view of the first exemplary structure along the plane B-B' of FIG. 11C.
Figure 11A:
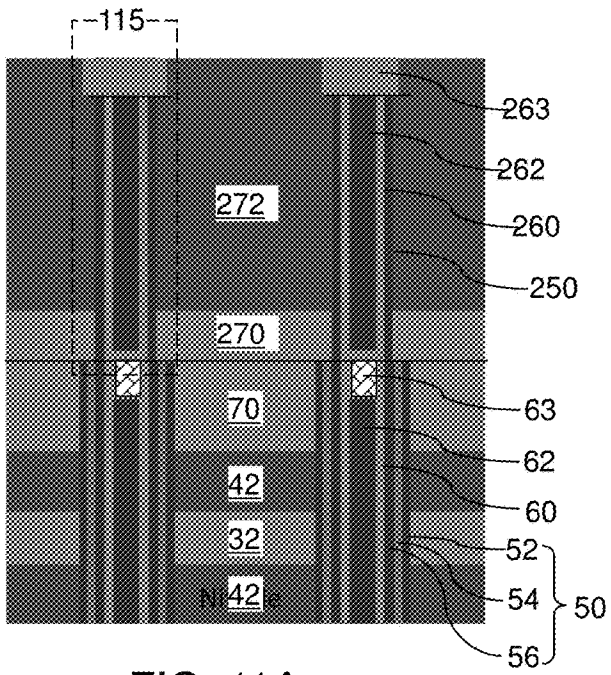
FIG. 11A is a vertical cross-section view of the first exemplary structure along the plane A-A' of FIG. 11C.

Referring to FIGS. 11A-11C, a doped semiconductor material having a doping of a second conductivity type is deposited in the recessed regions 271 overlying the drain select level channel portions 260. The second conductivity type is the opposite of the first conductivity type. For example, if the first conductivity type is p-type, the second conductivity type is n-type, and vice versa. The doped semiconductor material can be planarized to remove excess portions from above the horizontal plane including the top surface of the sacrificial matrix material layer 272. The planarization of the doped semiconductor material can be performed by a recess etch or chemical mechanical planarization. Each remaining portion of the doped semiconductor material in the recessed regions constitutes a drain region 263. In one embodiment, a p-n junction can be formed at each interface between the drain regions 263 and the drain select level channel portions 260.

The drain regions 263 can be formed on top of each drain select level channel portion 260. Each set of adjacent gate dielectric 250, drain select level channel portion 260, drain region 263, and drain select level dielectric core 262, if present, constitutes a drain select level assembly 115. Generally, the array of drain select level assemblies 115 can be formed through the at least one sacrificial matrix material layer, which can be the sacrificial matrix material layer 272. The array of drain select level assemblies 115 has the same periodicity as the array of memory stack structures 55 along the first horizontal direction hd1 and the second horizontal direction hd2, and overlies the alternating stack (32, 42). Each of the drain select level assemblies 115 comprises a drain select level channel portion 260 contacting a respective memory level channel portion 60.

Figures 12A, 12B, 12C:
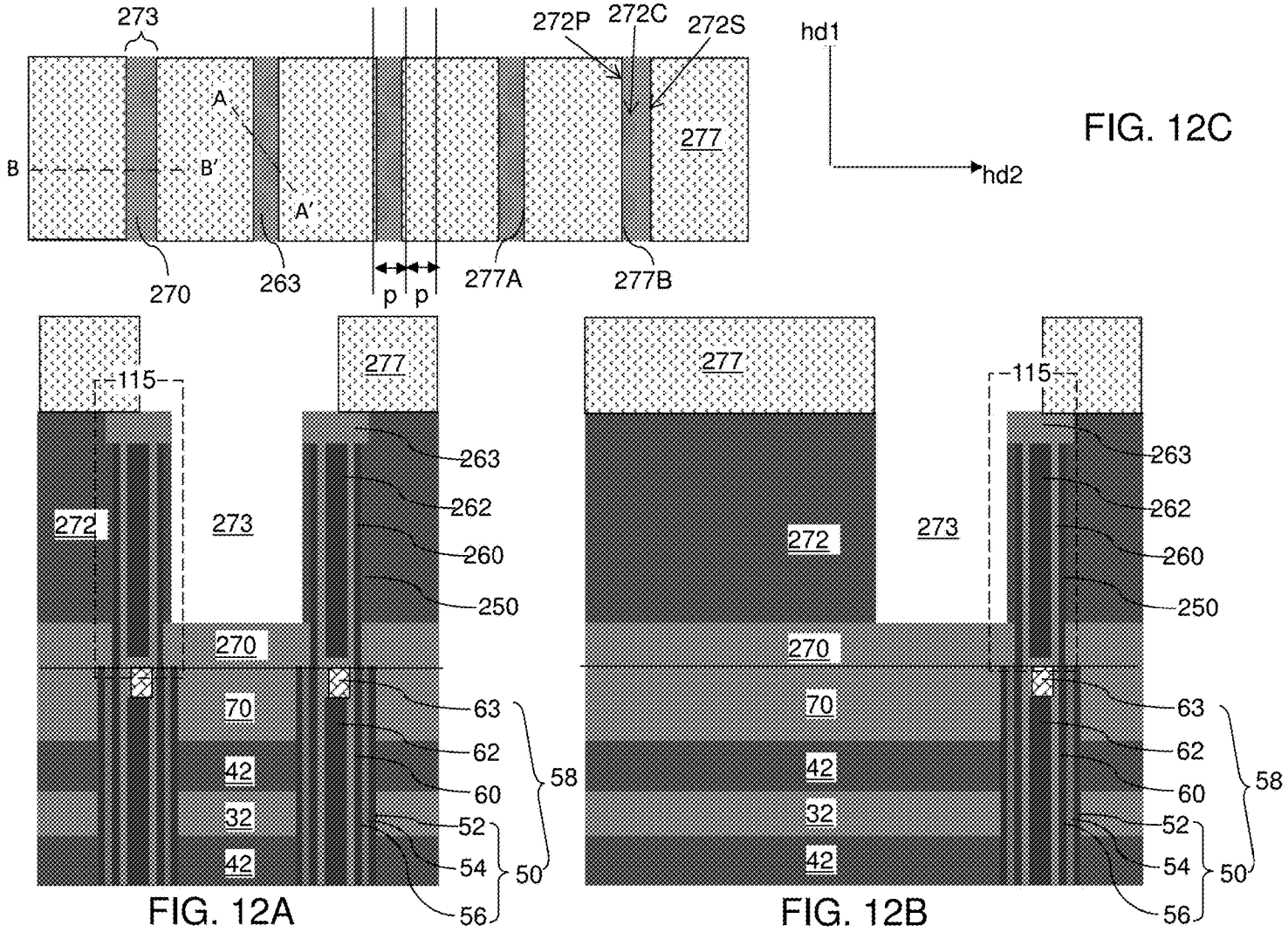
FIG. 12A is a vertical cross-section view of the first exemplary structure along the plane A-A' of FIG. 12C.
FIG. 12B is a vertical cross-section view of the first exemplary structure along the plane B-B' of FIG. 12C.
FIG. 12C is a top-down view of the region R in the first exemplary structure after patterning laterally extending trenches in the sacrificial matrix material layer according to the first embodiment of the present disclosure.

Referring to FIGS. 12A-12C, a photoresist layer 277 can be applied over the first exemplary structure, and can be lithographically patterned to form line patterns in areas in which electrical isolation between neighboring pairs of drain select gate electrodes is to be provided. In one embodiment, the patterned portions of the photoresist layer 277 can have a pair of lengthwise sidewalls that extend along the lengthwise direction of a pair of rows of memory opening fill structures 58, i.e., along the first horizontal direction hd1. A first lengthwise sidewall 277A of each patterned portion of the photoresist layer 277 can overlie a first row of memory opening fill structures 58 within two rows of memory opening fill structures 58 that are neighboring row pairs, and a second lengthwise sidewall 277B of each patterned portion of the photoresist layer 277 can overlie a second row of memory opening fill structures 58 within the two rows of memory opening fill structures 58. The width of each patterned portion of the photoresist layer 277, as measured along a direction perpendicular to the direction of the lengthwise sidewalls, can be in a range from 0.5 times the inter-row pitch p to 1.5 times the inter-row pitch p, and may be in a range from 0.7 times the inter-row pitch p to 1.3 times the inter-row pitch p.

An anisotropic etch process that etches the materials of the sacrificial matrix material layer 272 selective to the material of the drain regions 263 can be performed. For example, if the sacrificial matrix material layer 272 includes silicon nitride, an anisotropic etch process that etches silicon nitride selective to the semiconductor material of the drain regions 263 can be employed. The photoresist layer 277 and the drain regions 263 protect underlying masked portions of the sacrificial matrix material layer 272 during the anisotropic etch process. As such, the combination of the photoresist layer 277 and the drain regions 263 functions as an etch mask for anisotropically etching the sacrificial matrix material layer 272. The isolation spacer layer 270 can be employed as an etch stop layer for the anisotropic etch process.

An anisotropic etch is performed employing the combination of the patterned photoresist layer 277 and the array of drain select level assemblies 115 (and specifically, the array of drain regions 263) as an etch mask. Laterally extending trenches 273 that generally extend along the first horizontal direction hd1 is formed in the sacrificial matrix material layer 272. As used herein, a structure "generally extends" along a specific direction if the most prominent extension direction is the specific direction. Portions of such a structure may locally extend along directions that are different from the specific direction provided that the overall direction, and the most prominent extension direction, is the specific direction.

Each laterally extending trench 273 can laterally extend along the first horizontal direction hd1. Each laterally extending trench 273 is laterally bounded by two lengthwise sidewalls that generally extend along the first horizontal direction hd1. For each laterally extending trench 273 located between a neighboring pair of rows of the drain select level assemblies 115, each of the two lengthwise sidewalls can include a respective alternating sequence of planar sidewall segments 272P of the sacrificial matrix material layer 272 and convex sidewall segments 272C of the sacrificial matrix material layer 272. As used herein, a "planar sidewall segment" refers to a segment of a sidewall that is entirely contained within a two-dimensional Euclidean plane. As used herein, a "convex sidewall segment" refers to a segment of a sidewall that is entirely contained within a convex surface. As used herein, a "concave sidewall segment" refers to a segment of a sidewall that is entirely contained within a concave surface. In one embodiment, for each laterally extending trench 273 located between a neighboring pair of rows of the drain select level assemblies 115, each of the two lengthwise sidewalls can include a respective alternating sequence of vertical planar sidewall segments of the sacrificial matrix material layer 272 and vertical convex sidewall segments of the sacrificial matrix material layer 272. As used herein, a "vertical planar sidewall segment" refers to a planar sidewall segment that extends straight along a vertical direction. As used herein, a "vertical convex sidewall segment" refers to a convex sidewall segment that extends straight along a vertical direction. As used herein, a "vertical concave sidewall segment" refers to a concave sidewall segment that extends straight along a vertical direction.

For each laterally extending trench 273 located around an outermost row of the drain select level assemblies 115, one of the two lengthwise sidewalls can include a respective alternating sequence of planar sidewall segments 272P of the sacrificial matrix material layer 272 and convex sidewall segments 272C of the sacrificial matrix material layer 272, and the other of the two lengthwise sidewalls can consist of a single straight vertical sidewall 272S. In one embodiment, for each laterally extending trench 273 located between a neighboring pair of rows of the drain select level assemblies 115, one of the two lengthwise sidewalls can include a respective alternating sequence of vertical planar sidewall segments 272P of the sacrificial matrix material layer 272 and vertical convex sidewall segments 272C of the sacrificial matrix material layer 272. The photoresist layer 277 can be subsequently removed, for example, by ashing.

Figure 13C:
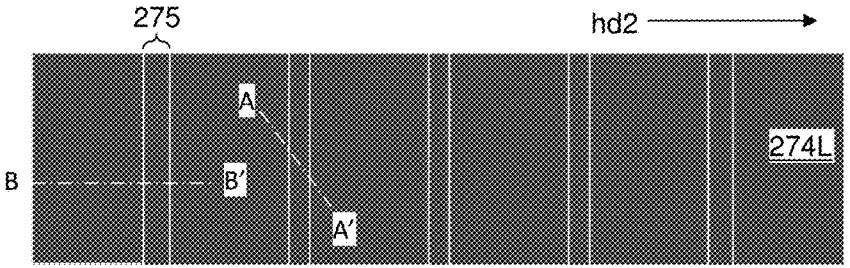
FIG. 13C is a top-down view of the region R in the first exemplary structure after formation of a sacrificial spacer material layer according to the first embodiment of the present disclosure.
Figure 13B:
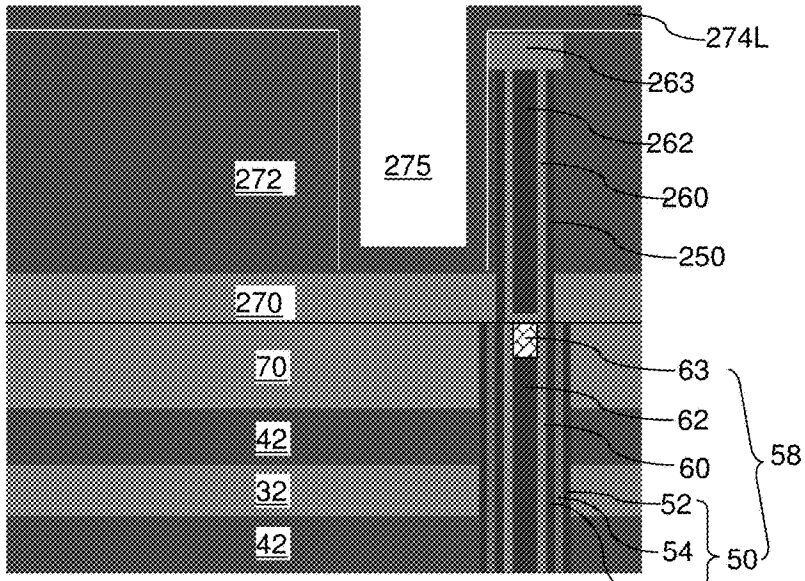
FIG. 13B is a vertical cross-section view of the first exemplary structure along the plane B-B' of FIG. 13C.
Figure 13A:
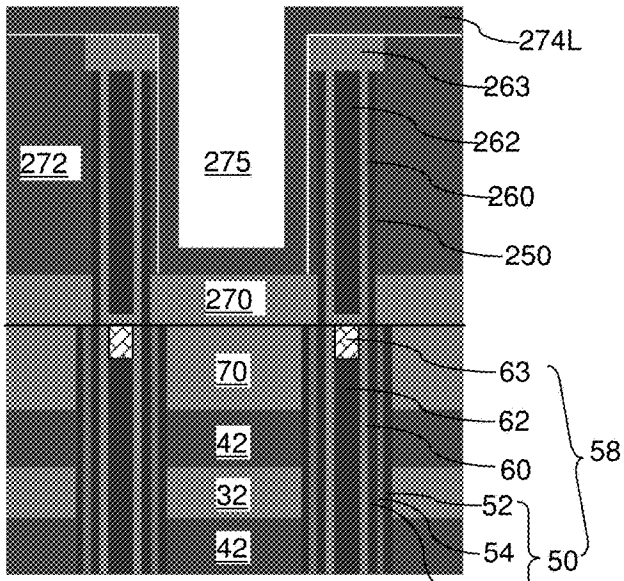
FIG. 13A is a vertical cross-section view of the first exemplary structure along the plane A-A' of FIG. 13C.

Referring to FIGS. 13A-13C, a sacrificial spacer material layer 274L can be deposited by a conformal deposition process. The sacrificial spacer material layer 274L includes a sacrificial material that can be removed selective to the materials of the drain regions 263 and the isolation spacer layer 270. In one embodiment, the sacrificial spacer material layer 274L can be the same as the material of the sacrificial matrix material layer 272 (e.g., silicon nitride). The thickness of the sacrificial spacer material layer 274L can be in a range from 5% to 35% of the minimum lateral width of the laterally extending trenches 273 as formed at the processing steps of FIGS. 12A-12C.

Figure 14C:
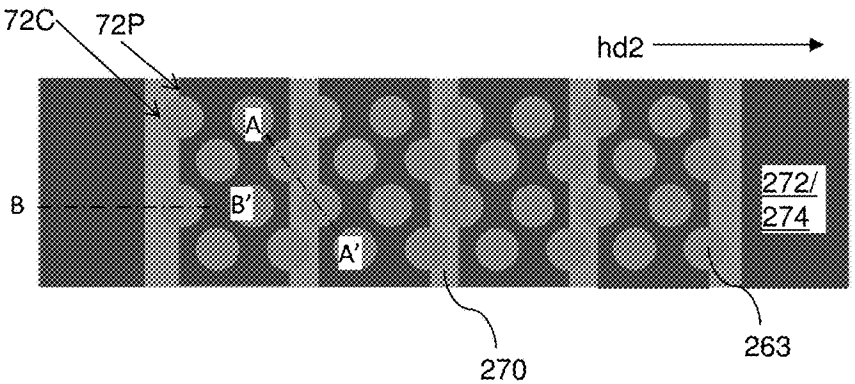
FIG. 14C is a top-down view of the region R in the first exemplary structure after formation of sacrificial spacers according to the first embodiment of the present disclosure.
Figure 14B:
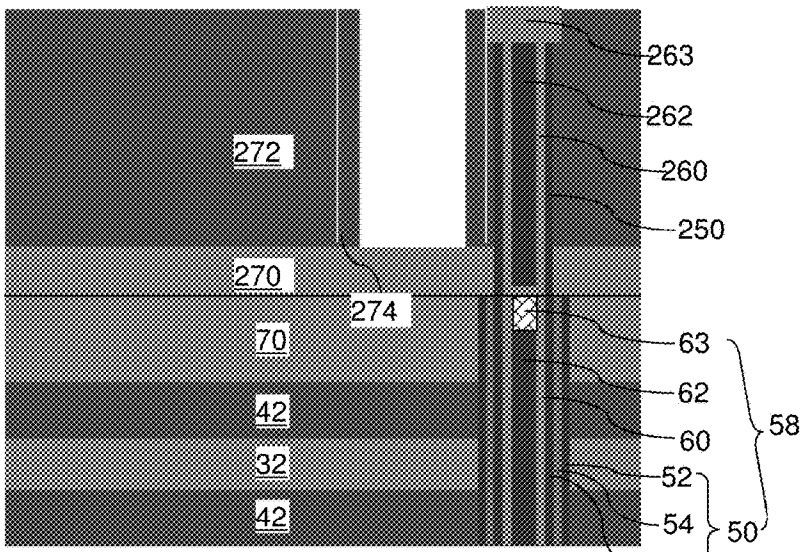
FIG. 14B is a vertical cross-section view of the first exemplary structure along the plane B-B' of FIG. 14C.
Figure 14A:
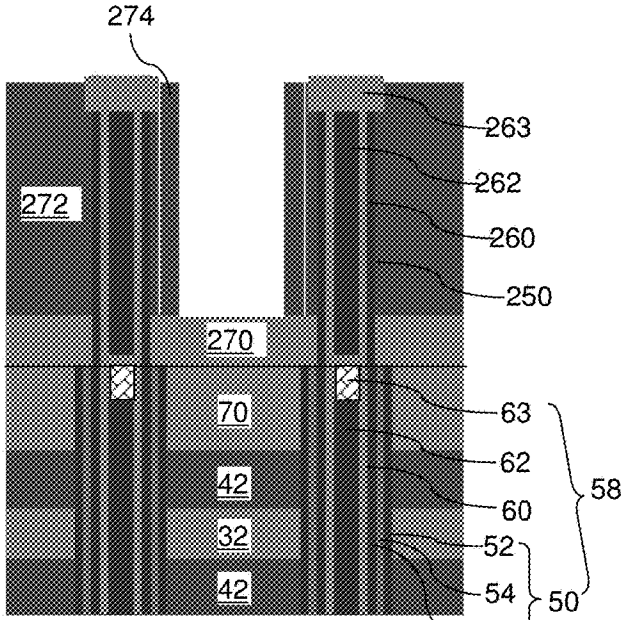
FIG. 14A is a vertical cross-section view of the first exemplary structure along the plane A-A' of FIG. 14C.

Referring to FIGS. 14A-14C, the sacrificial spacer material layer 274L can be anisotropically etched to remove horizontal portions. Each remaining portion of the sacrificial spacer material layer 274 constitutes a sacrificial spacer 274. Thus, the sacrificial spacers 274 are formed within the laterally extending trenches 273 by depositing and anisotropically etching the sacrificial spacer material layer 274L. The laterally extending unfilled cavities 275 are narrower than the laterally extending trenches 273 as formed at the processing steps of FIGS. 12A-12C. The sidewalls of the laterally extending cavities 275 are laterally offset from vertical planes (which have cylindrical surfaces) that include sidewalls of the drain regions 263 by the lateral thickness of the sacrificial spacers 274.

Figure 15C:
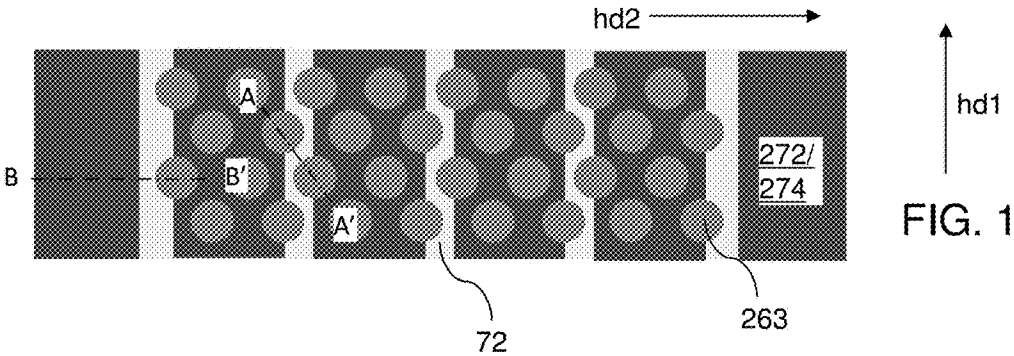
FIG. 15C is a top-down view of the region R in the first exemplary structure after formation of drain select level isolation strips according to the first embodiment of the present disclosure.
Figure 15B:
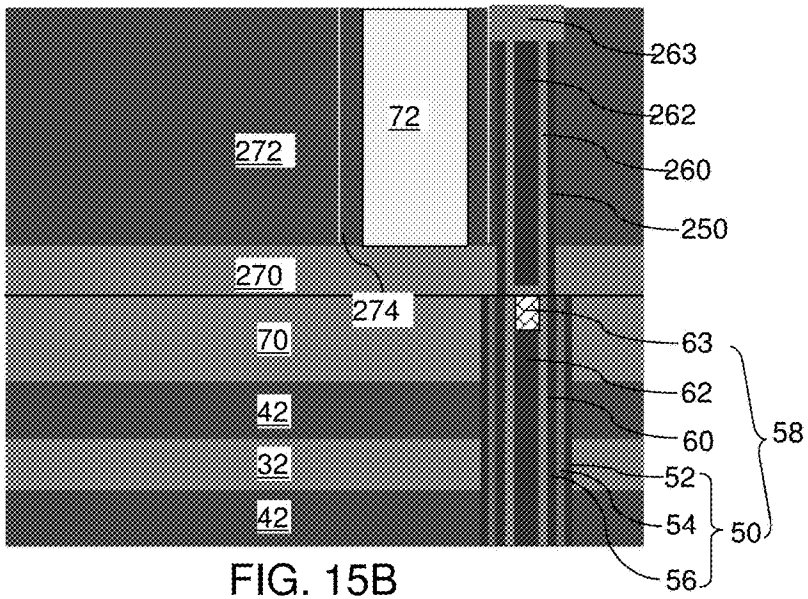
FIG. 15B is a vertical cross-section view of the first exemplary structure along the plane B-B' of FIG. 15C.
Figure 15A:
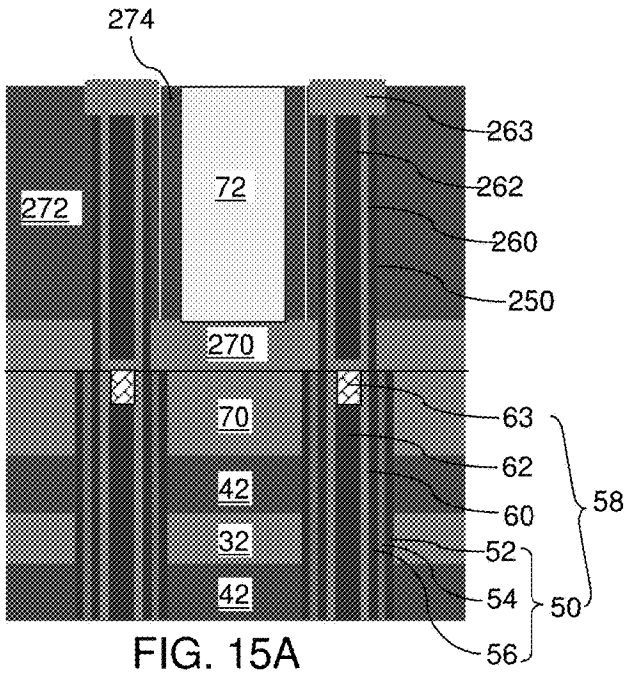
FIG. 15A is a vertical cross-section view of the first exemplary structure along the plane A-A' of FIG. 15C.

Referring to FIGS. 15A-15C, a planarizable dielectric material such as silicon oxide can be deposited to fill the laterally extending trenches. Excess portions of the deposited dielectric material can be removed from above the horizontal plane including the top surfaces of the drain regions 263 by a planarization process, which can include a recess etch and/or chemical mechanical planarization. Each remaining portion of the dielectric material that fills the laterally extending cavities constitutes a drain select level isolation strip 72, which is a continuous dielectric material portion that generally extends along the first horizontal direction hd1 (e.g., word line direction). Thus, the volumes of the drain select level isolation strips 72 can be the same as the volumes of the laterally extending trenches 273 less the volumes of the sacrificial spacers 274.

Each drain select level isolation strip 72 includes a pair of lengthwise sidewalls that generally extend along the first horizontal direction hd1. Each of the pair of lengthwise sidewalls includes a laterally alternating sequence of planar sidewall portions 72P and [convex] *concave* sidewall portions 72C. In one embodiment, each of the pair of lengthwise sidewalls includes a laterally alternating sequence of vertical planar sidewall portions 72P and vertical [convex] *concave* sidewall portions 72C. Each of the [convex] *concave* sidewall portions is equidistant from a sidewall of a respective most proximal one of the drain select level assemblies 115 by the lateral thickness of the sacrificial spacers 274.

Figure 16C:
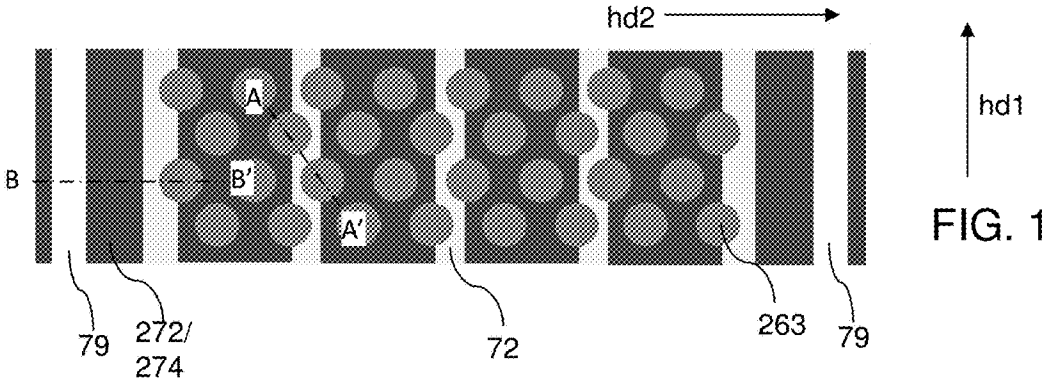
FIG. 16C is a top-down view of the region R in the first exemplary structure after formation of backside trenches according to the first embodiment of the present disclosure.
Figure 16B:
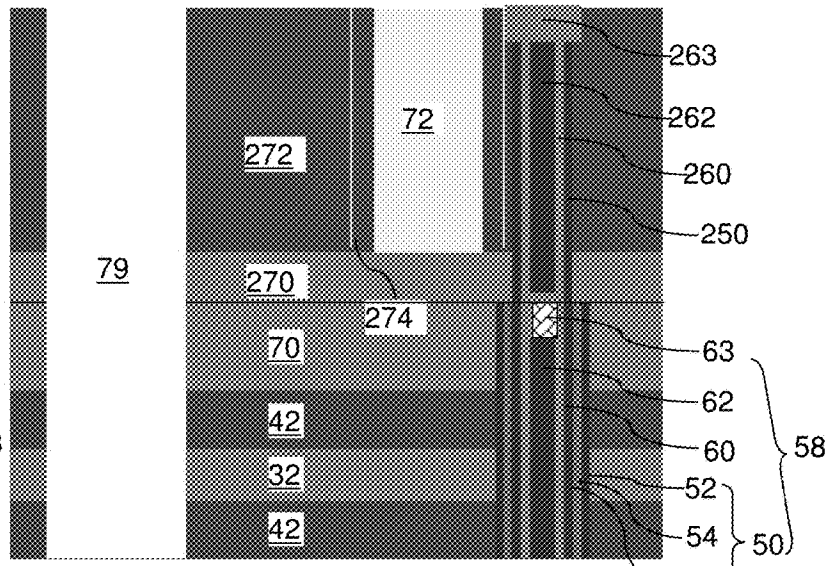
FIG. 16B is a vertical cross-section view of the first exemplary structure along the plane B-B' of FIG. 16C.
Figure 16A:
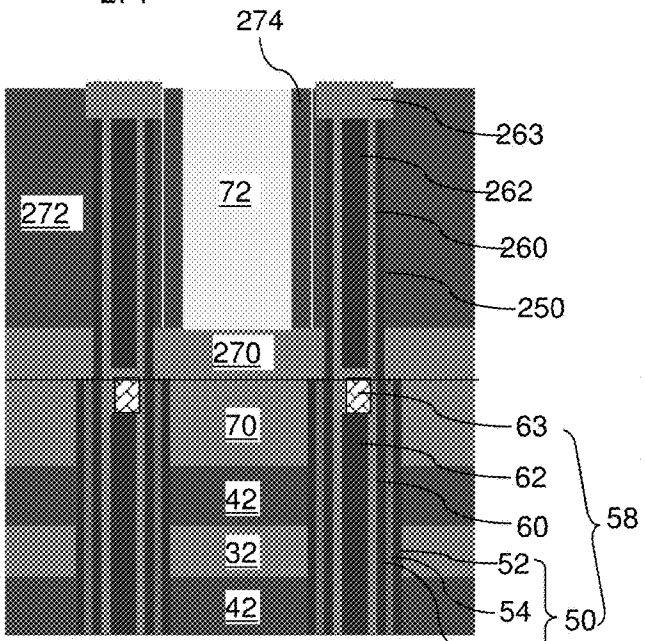
FIG. 16A is a vertical cross-section view of the first exemplary structure along the plane A-A' of FIG. 16C.
Figure 16D:
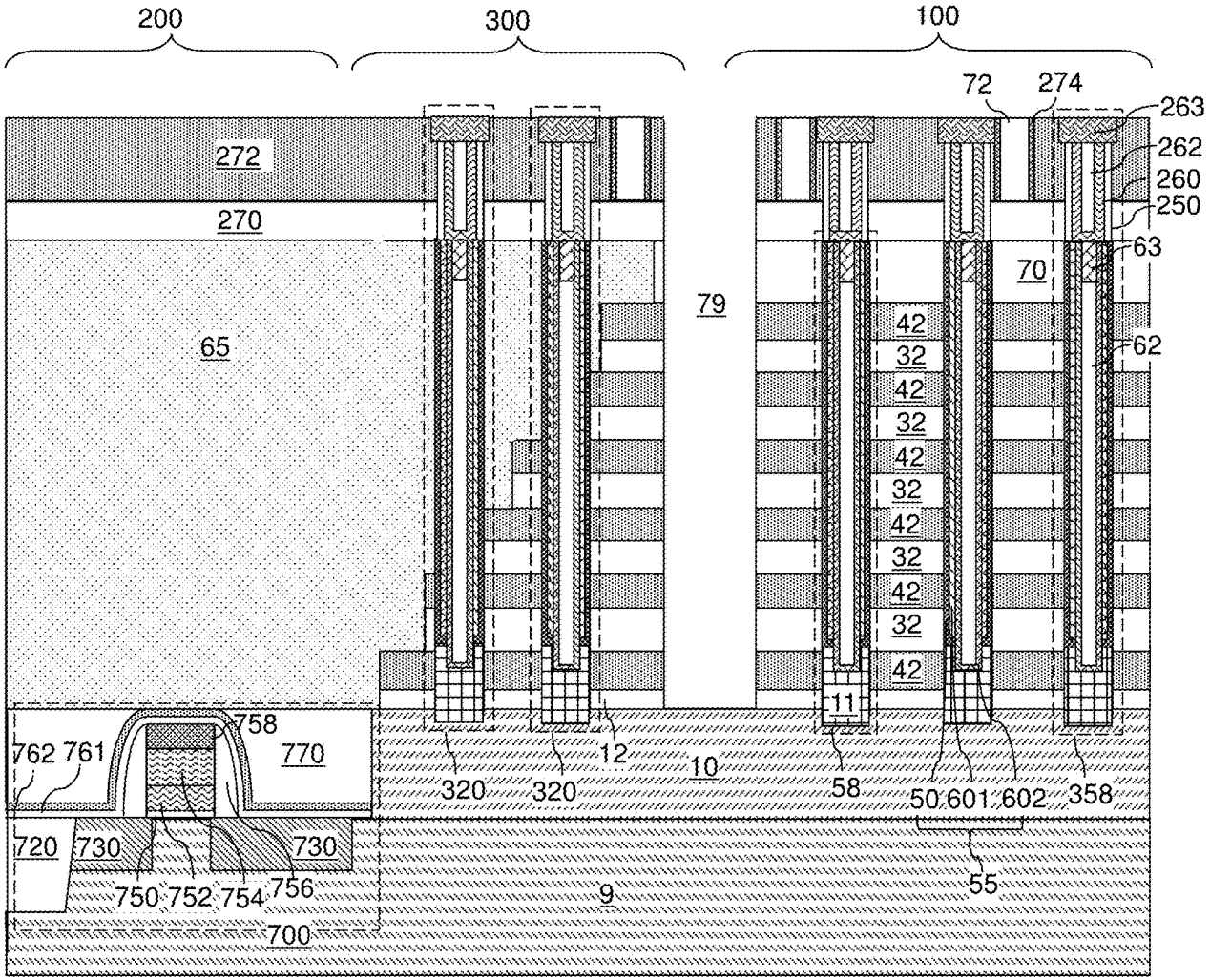
FIG. 16D is a vertical cross-sectional view of the first exemplary structure at the processing steps of FIGS. 16A-16C.

Referring to FIGS. 16A-16E, a photoresist layer (not shown) can be applied over the sacrificial matrix material layer 272, the drain select level isolation strips 72, and the drain select level assemblies 115. The photoresist layer is lithographically patterned to form openings in areas between clusters of drain select level assemblies 115, as shown in FIG. 16D. Each vertical stack of a memory opening fill structure 58 and a drain select level assembly 115 constitutes a vertical transistor stack structure 358, which includes a vertical semiconductor channel (60, 260) that includes a memory level channel portion 60 and a drain select level channel portion 260, charge storage elements, and various dielectric material layers that prevent electrical shorts from various control gates to be subsequently formed. Each vertical stack of a support opening fill structure 20 (which is a first support pillar structure) and a drain select level assembly 115 (which is a second support pillar structure) constitutes a support pillar stack 320. Thus, the photoresist layer includes openings between arrays of the vertical transistor stack structures 358, each of which can be a two-dimensional periodic array having an inter-row pitch p along the second horizontal direction hd2.

The pattern in the photoresist layer can be transferred through the sacrificial matrix material layer 272, the isolation spacer layer 270, the insulating cap layer 70, the alternating stack (32, 42) and/or the retro-stepped dielectric material portion 65 employing an anisotropic etch to form the backside trenches 79. The backside trenches 79 vertically extend at least to the top surface of the substrate (9, 10), and laterally extend in the first horizontal direction hd1 through the memory array region 100 and the contact region 300. In one embodiment, the backside trenches 79 can include a source contact opening in which a source contact via structure can be subsequently formed.

Figure 16E:
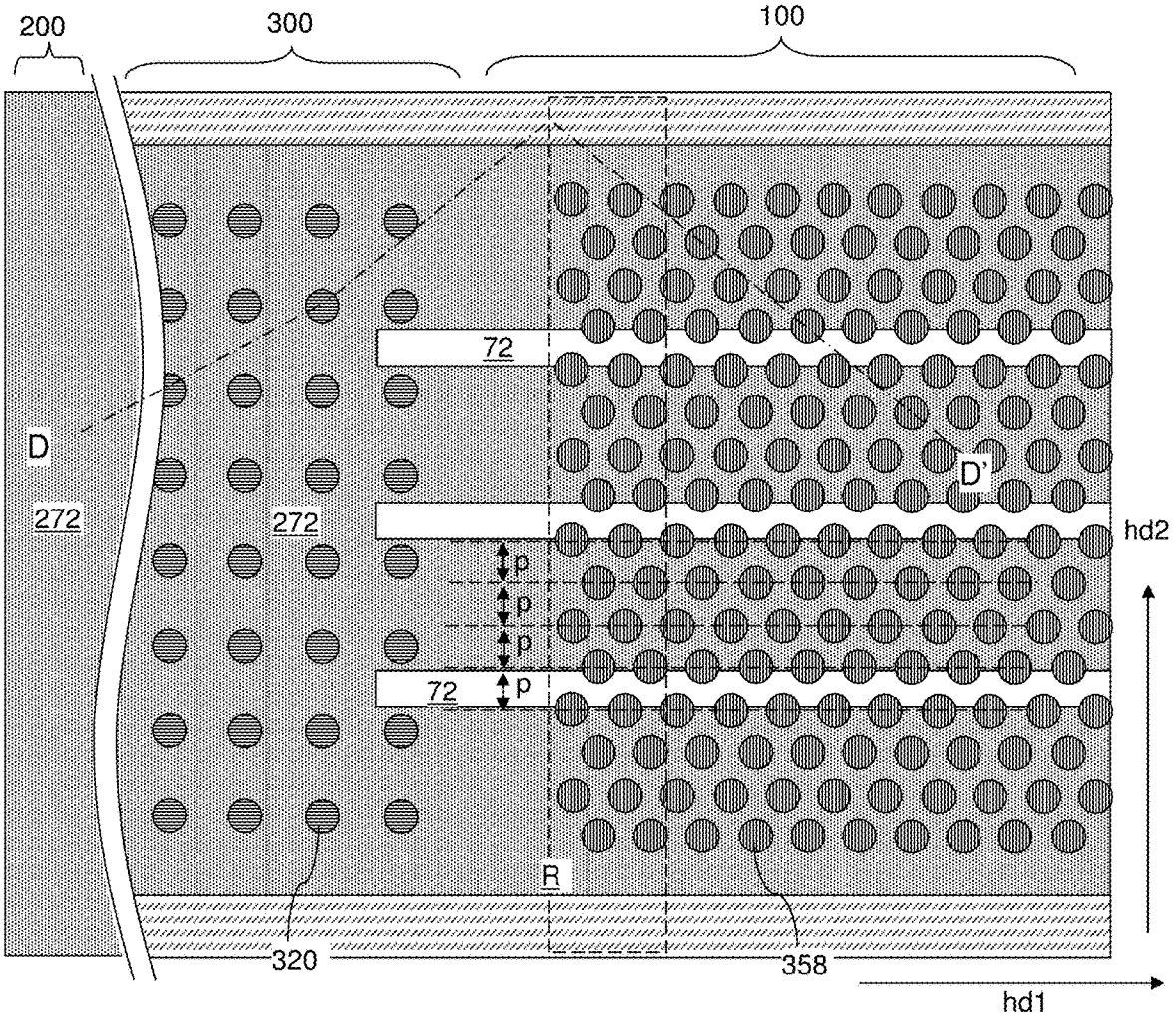
FIG. 16E is a top-down view of the first exemplary structure of FIG. 16D. The plane D-D' is the plane of the vertical cross-sectional view of FIG. 16D.

The photoresist layer can be removed, for example, by ashing. The backside trenches 79 can extend along the first horizontal direction hd1, which is parallel to the word line direction which is the lengthwise direction of the drain select level isolation strips 72. At least one backside trench 79 can be located between a set of at least two drain select level isolation strips 72, and a set of at least one drain select level isolation strip 72 can be located between a neighboring pair of backside trenches 79. For example, as shown in FIG. 16E, a set of three drain select level isolation strip 72 is located between a neighboring pair of backside trenches 79.

Referring to FIGS. 17A-17D, an isotropic etchant can be applied to the first exemplary structure in an isotropic etch process. The isotropic etchant is an etchant that etches the second material of the sacrificial material layers 42, the material of the sacrificial matrix material layer 272, and the material of the sacrificial spacers 274 selective to the first material of the insulating layers 32, selective to the material of the drain select level isolation strips 72, selective to the semiconductor materials of the array of drain select level assemblies 115, and selective to the material of the outermost layer of the memory films 50. The sacrificial material layers 42 can be removed selective to the insulating layers 32 and the memory stack structures 55. Backside recesses 43 are formed in volumes from which the sacrificial material layers 42 are removed. The sacrificial matrix material layer 272 and the sacrificial spacers 274 can be removed from around the drain select level assemblies 115 and the drain select level isolation strips 72 above the top surface of the isolation spacer layer 270.

In one embodiment, the sacrificial material layers 42, the sacrificial matrix material layer 272, and the sacrificial spacers 274 can include silicon nitride, and the materials of the insulating layers 32, the isolation spacer layer 270, the drain select level isolation strips 72, and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42. Void volumes 279 remain in regions previously occupied by the removed sacrificial matrix material layer 272 and the sacrificial spacers 274.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Planar oxide portions (not shown) can be collaterally formed on the top surfaces of the drain regions 263 by conversion of the surface portions of the drain regions 263 into silicon oxide portions. Such planar oxide portions are sacrificial structures that are removed in subsequent processing steps.

Figures 18A, 18B, 18C:
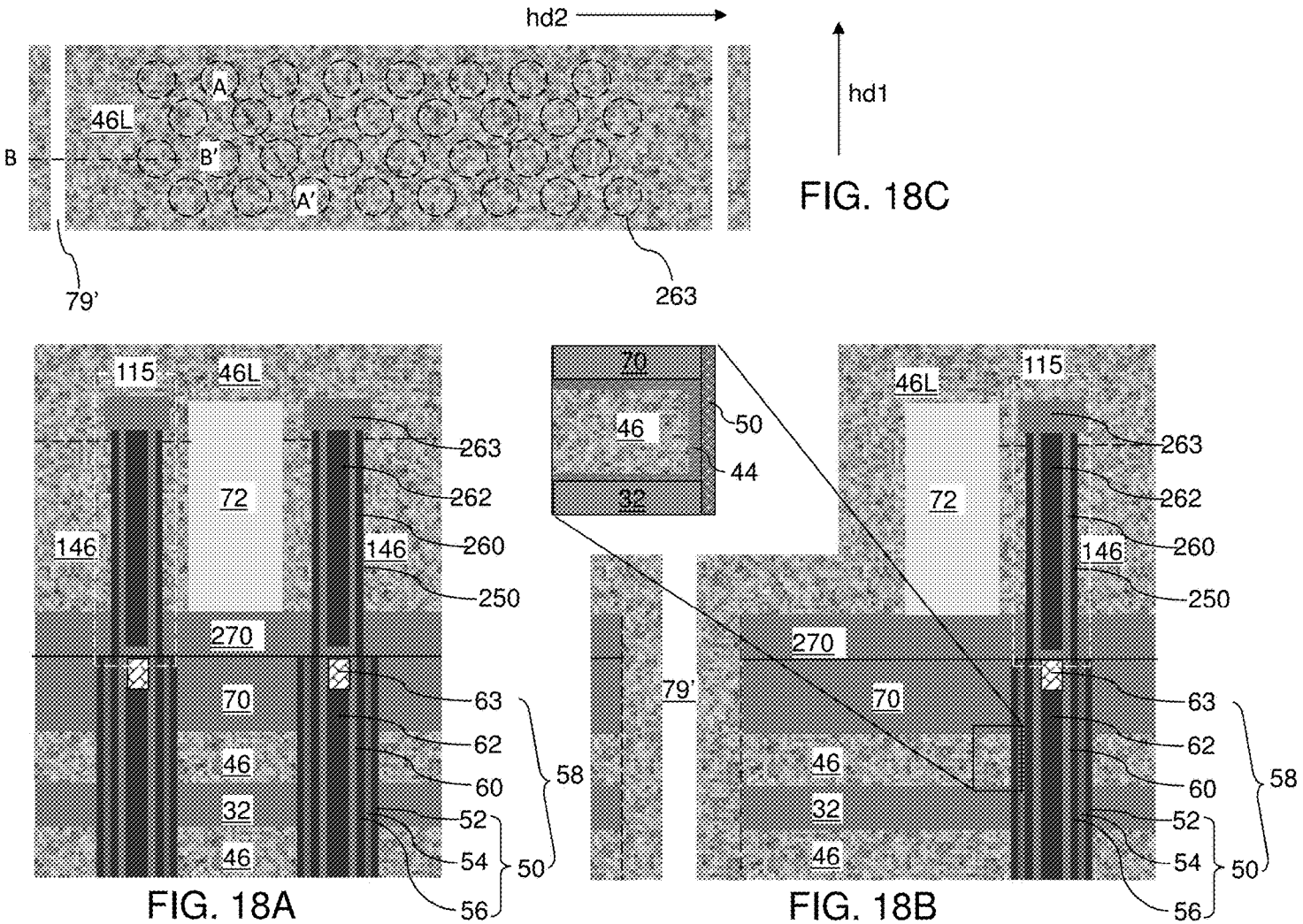
FIG. 18A is a vertical cross-section view of the first exemplary structure along the plane A-A' of FIG. 18C.
FIG. 18B is a vertical cross-section view of the first exemplary structure along the plane B-B' of FIG. 18C.
FIG. 18C is a top-down view of the region R in the first exemplary structure after deposition of at least one conductive material in the backside recesses and over the drain select level assemblies according to the first embodiment of the present disclosure.

Referring to FIGS. 18A-18C, a backside blocking dielectric layer 44 (shown in the inset of FIG. 18B) can be optionally formed by a conformal deposition process. The backside blocking dielectric layer 44, if present, comprises a dielectric material that functions as a portion of a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one conductive material can be subsequently deposited by a conformal deposition method. In one embodiment, the at least one conductive material can include a metallic liner layer and a metallic fill material layer. In this case, the metallic liner layer can include an electrically conductive metallic material that can function as a diffusion barrier layer and/or adhesion promotion layer for a metallic fill material to be subsequently deposited. The metallic liner layer can include a conductive metallic nitride material such as TiN, TaN, WN, or a stack thereof, or can include a conductive metallic carbide material such as TiC, TaC, WC, or a stack thereof. In one embodiment, the metallic liner layer can be deposited by a conformal deposition process such as chemical vapor deposition (CVD) or atomic layer deposition (ALD). The thickness of the metallic liner layer can be in a range from 2 nm to 8 nm, such as from 3 nm to 6 nm, although lesser and greater thicknesses can also be employed. In one embodiment, the metallic liner layer can consist essentially of a conductive metal nitride such as TiN.

The metallic fill material layer can be subsequently deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic liner layer, which can be a metallic barrier layer that blocks diffusion of fluorine atoms therethrough. The thickness of the metallic fill material layer can be in a range from 2 nm to 8 nm, such as from 3 nm to 6 nm, although lesser and greater thicknesses can also be employed.

The thicknesses of the metallic liner layer and the metallic fill material layer can be selected such that each backside recess 43 is completely filled with the metallic liner layer and the metallic fill material layer, while a backside cavity 79' is present within each backside trench 79.

Each portion of the combination of the metallic liner layer and the metallic fill material layer that fills a backside recess constitutes an electrically conductive layer 46. Each portion of the combination of the metallic liner layer and the metallic fill material layer that is deposited below the horizontal plane including the bottom surfaces of the drain regions 263, and within void volumes 279 from which the sacrificial matrix material layer 272 and the sacrificial spacers 274 are removed, constitutes a drain select gate electrode 146. A continuous conductive material layer 46L is formed at peripheral portions of each backside trench 79, over each of the drain select gate electrodes 146, and over regions of the isolation spacer layer 270 that do not underlie arrays of the drain select level assemblies 115.

Figure 19C:
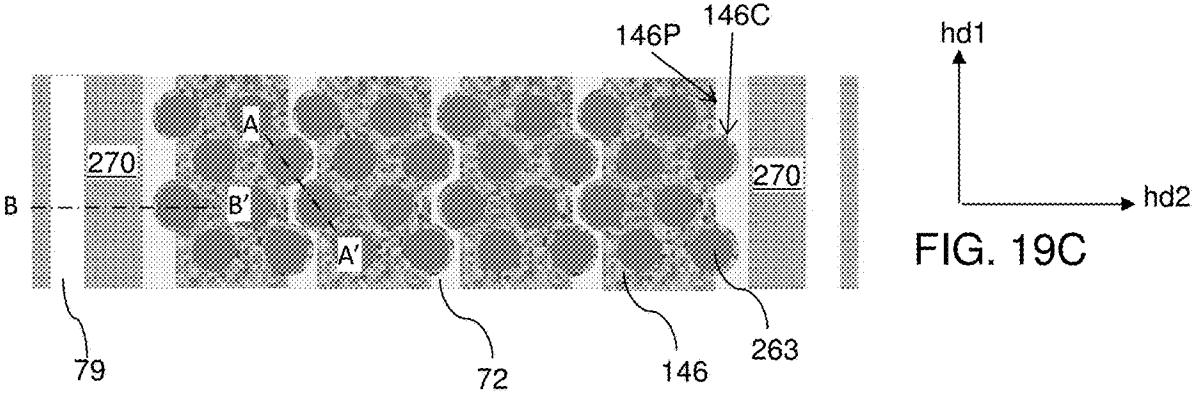
FIG. 19C is a top-down view of the region R in the first exemplary structure after isotropically recessing the at least one conductive material according to the first embodiment of the present disclosure.
Figure 19B:
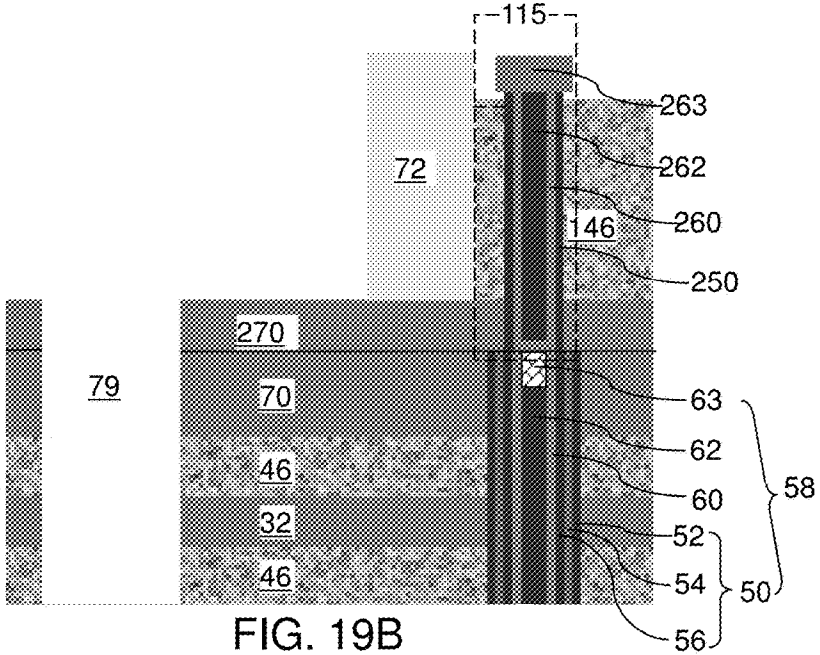
FIG. 19B is a vertical cross-section view of the first exemplary structure along the plane B-B' of FIG. 19C.
Figure 19A:
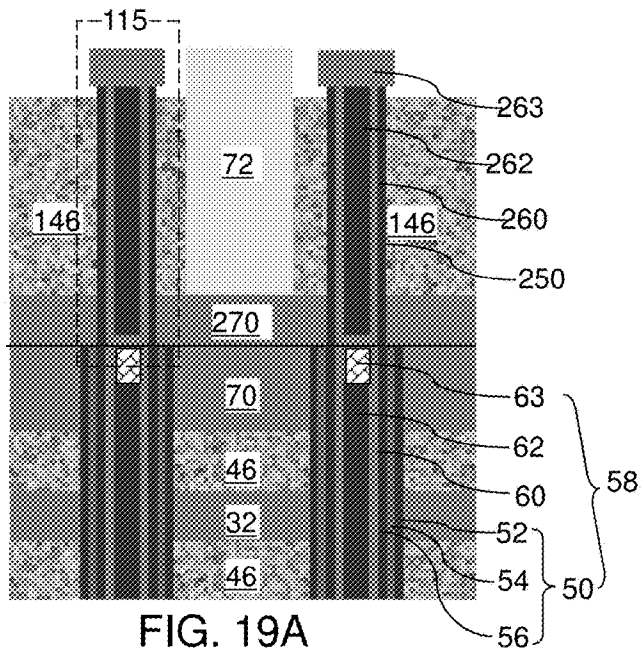
FIG. 19A is a vertical cross-section view of the first exemplary structure along the plane A-A' of FIG. 19C.

Referring to FIGS. 19A-19C, the at least one conductive material of the continuous conductive material layer 46L can be isotropically recessed by an isotropic etch process. Specifically, horizontal portions of the at least one conductive material can be removed from above the array of drain select level assemblies 115 and from around upper portions of the array of drain select level assemblies 115. The unetched remaining portions of the at least one conductive material overlying the isolation spacer layer 270 constitute the drain select gate electrodes 146, which are laterally spaced among one another by the drain select level dielectric strips 72. Further, the vertical portions of the at least one conductive material can be removed from inside the backside trenches 79 by the isotropic etch process. The duration of the isotropic etch process can be controlled to avoid removal of the drain select gate electrodes 146 and the electrically conductive layers 46.

The drain select gate electrodes 146 can be formed on the array of drain select level assemblies 115 and the drain select level isolation strips 72. Each of the drain select gate electrodes 146 can laterally encircle each of the drain select level assemblies 115 located between a neighboring pair of drain select level isolation strips 72. In one embodiment, each of the drain select gate electrodes 146 can include a pair of lengthwise sidewalls that generally extend along the first horizontal direction hd1 and contact a respective sidewall of the drain select level isolation strips 72. Each of the lengthwise sidewalls of the drain select gate electrode 146 can include a laterally alternating sequence of planar sidewall portions 146P and convex sidewall portions 146C. In one embodiment, each of the lengthwise sidewalls of the drain select gate electrode 146 can include a laterally alternating sequence of vertical planar sidewall portions 146P and vertical convex sidewall portions 146C. Each of the drain select gate electrodes 146 laterally surrounds respective rows of the drain select level assemblies 115. Each row of the drain select level assemblies 115 can be arranged along the first horizontal direction hd1. The top surface of each drain select gate electrode 146 can be located below the horizontal plane including the bottom surfaces of the drain regions 263 to avoid electrical shorts between the drain select gate electrodes 146 and the drain regions 263.

Referring to FIGS. 20A-20E, a dielectric fill material layer 78 is formed on the top surface of the drain select gate electrodes 146 and in the backside trenches 79. The dielectric fill material layer 78 can include a planarizable dielectric material such as silicon oxide. The dielectric fill material layer 78 can be planarized to remove to provide a top surface that is coplanar with the top surfaces of the drain regions 263. For example, chemical mechanical planarization or a recess etch can be employed. The top surfaces of the drain select level isolation strips 72 and the dielectric fill material layer 78 can be within a same horizontal plane as the top surfaces of the drain regions 263. The dielectric fill material layer 78 can be formed over the drain select gate electrodes 146. In one embodiment, portions of the dielectric fill material layer 78 may be laterally spaced apart among one another by the drain select level isolation strips 72.

Alternatively, the planarized top surface of the dielectric fill material layer 78 can be formed over the horizontal plane including the top surfaces of the drain regions 163 and the drain select level isolation strips 72. In this case, the dielectric fill material layer 78 can be formed as a single continuous material layer.

Each portion of the dielectric fill material layer 78 that fills one of the backside trenches 79 is herein referred to as a dielectric wall structure 78T, which provides electrical isolation between laterally neighboring pairs of electrically conductive layers 46 that are located at the same level, i.e., at the same vertical distance from the top surface of the substrate (9, 10).

Each volume located underneath horizontal interfaces between the dielectric fill material layer 78 and the drain select gate electrodes 146 and located above bottom surfaces of the drain select gate electrodes 146, and located within peripheries defined by sidewalls of the drain select gate electrodes 146 can be filled entirely with a respective one of the drain select gate electrodes 146. In other words, the drain select gate electrodes can have a uniform horizontal cross-sectional shape that is invariant between the top surface thereof and the bottom surface thereof.

Figure 21C:
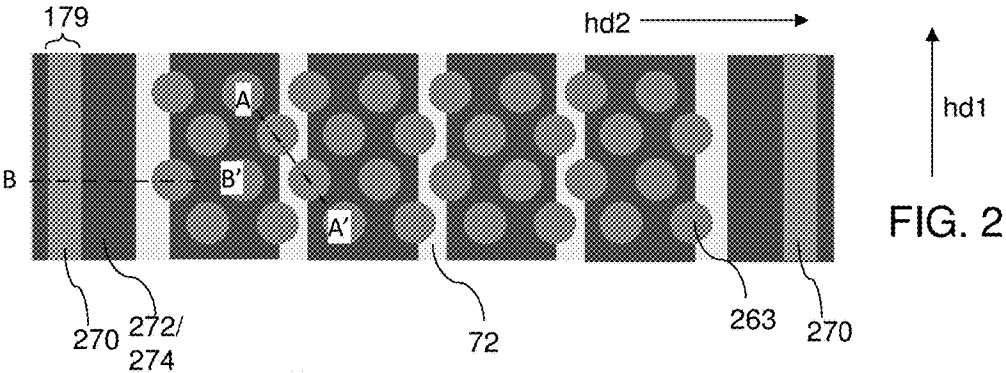
FIG. 21C is a top-down view of the alternative embodiment of the first exemplary structure after formation of upper backside trenches according to the first embodiment of the present disclosure.
Figure 21B:
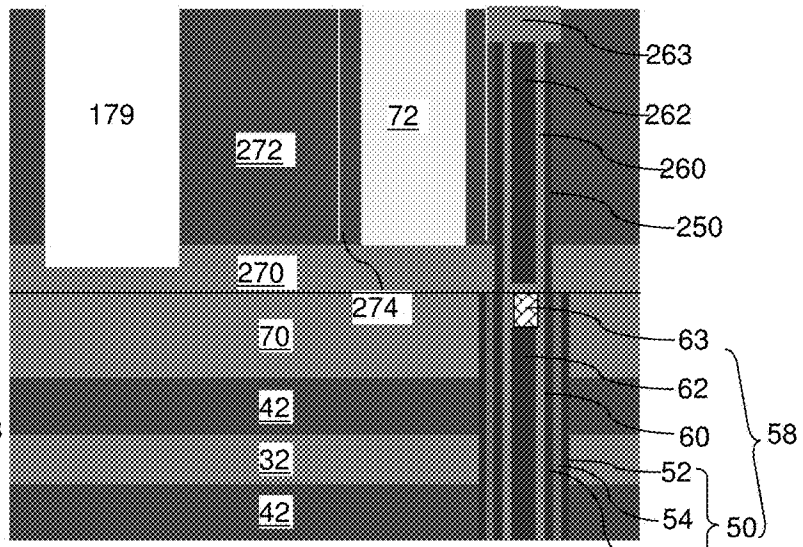
FIG. 21B is a vertical cross-section view of the alternative embodiment of the first exemplary structure along the plane B-B' of FIG. 21C.
Figure 21A:
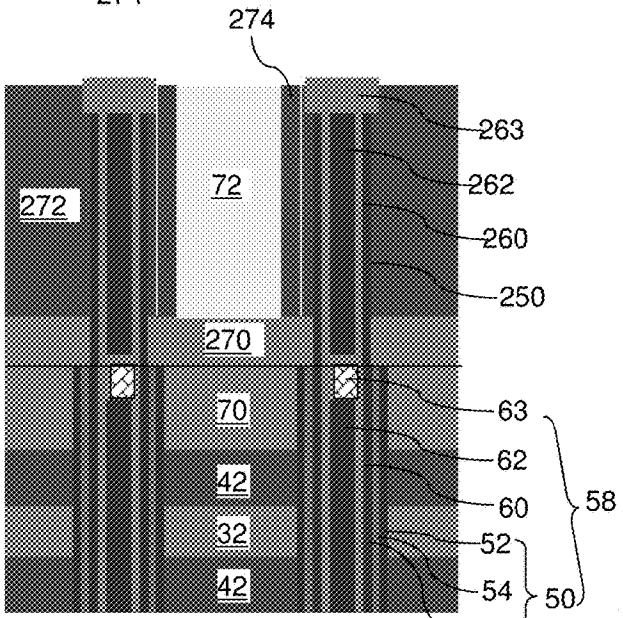
FIG. 21A is a vertical cross-section view of an alternative embodiment of the first exemplary structure along the plane A-A' of FIG. 21C.

Referring to FIGS. 21A-21C, an alternative embodiment of the first exemplary structure can be derived from the first exemplary structure of FIGS. 15A-15C by applying and patterning a photoresist layer in the same manner as in the processing steps of FIGS. 16A-16E, and subsequently performing an isotropic etch such that the depth of the line trenches thereby formed does not extend below the isolation spacer layer 270. The line trenches thereby formed are herein referred to as upper backside trenches 179, which extend through the sacrificial matrix material layer 272 and stops on, or extends only through an upper portion of, the isolation spacer layer 270. The duration of the anisotropic etch process can be controlled to limit the depth of the upper backside trenches 179.

Figure 22C:
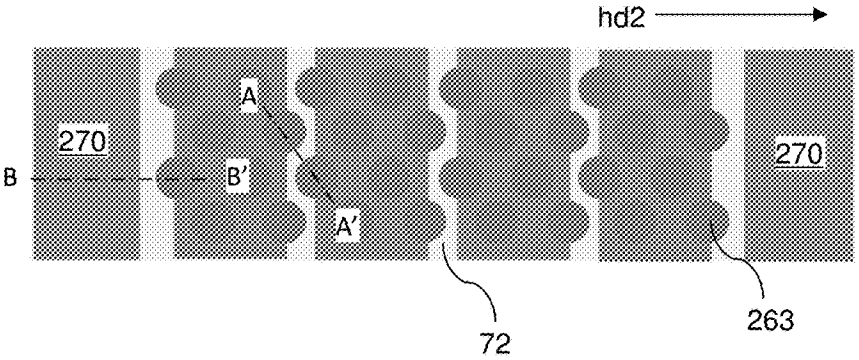
FIG. 22C is a top-down view of the alternative embodiment of the first exemplary structure after removal of the sacrificial matrix material layer according to the first embodiment of the present disclosure.
Figure 22B:
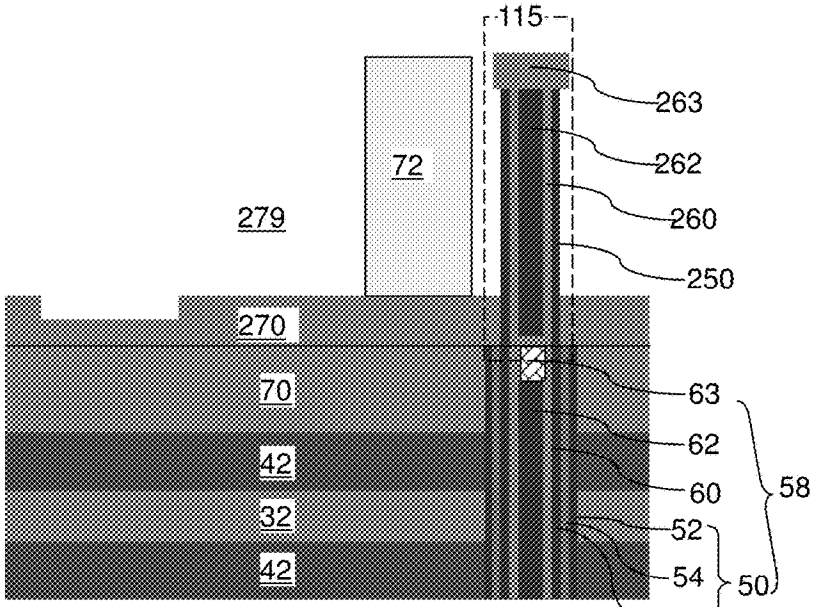
FIG. 22B is a vertical cross-section view of the alternative embodiment of the first exemplary structure along the plane B-B' of FIG. 22C.
Figure 22A:
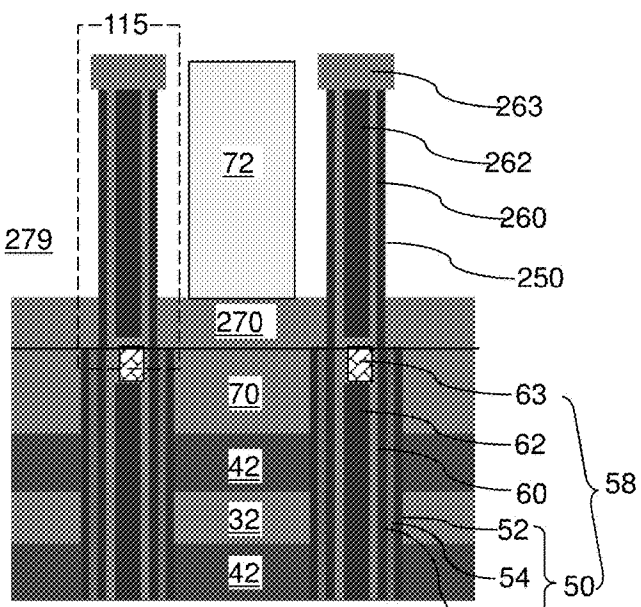
FIG. 22A is a vertical cross-section view of the alternative embodiment of the first exemplary structure along the plane A-A' of FIG. 22C.

Referring to FIGS. 22A-22C, an isotropic etch can be performed to remove the materials of the sacrificial matrix material layer 272 and the spacer layers 274 selective to the materials of the semiconductor materials of the drain select level assemblies 115 and the dielectric material of the drain select level isolation strips 72 to form the void volumes 279. For example, if the sacrificial matrix material layer 272 and the spacer layers 274 include silicon nitride, a wet etch employing hot phosphoric acid can be performed to remove the sacrificial matrix material layer 272 and the spacer layers 274.

Figure 23C:
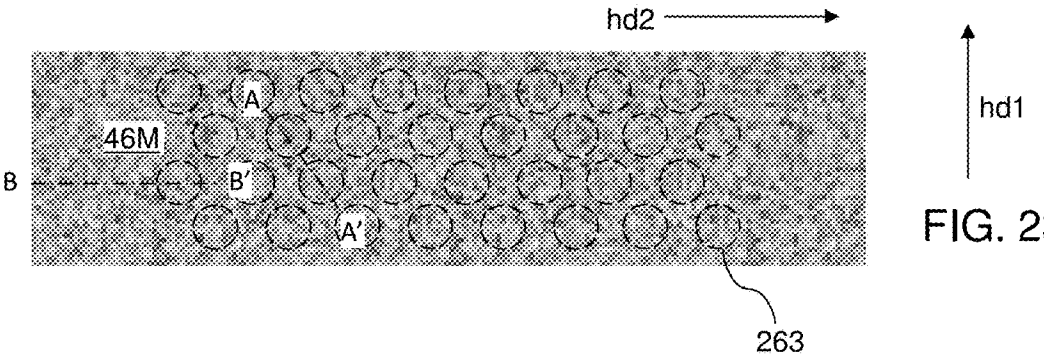
FIG. 23C is a top-down view of the alternative embodiment of the first exemplary structure after deposition of at least one conductive material according to the first embodiment of the present disclosure.
Figure 23B:
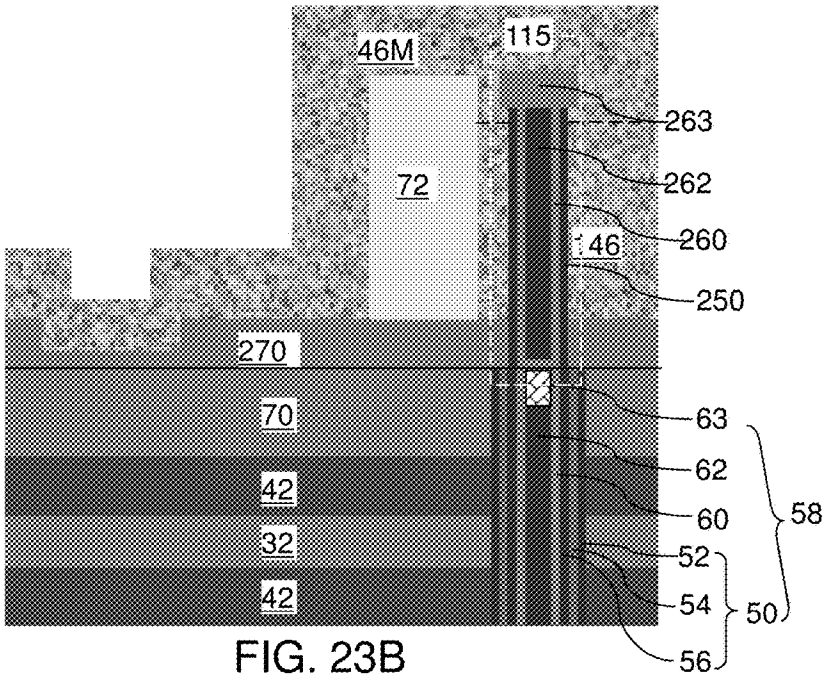
FIG. 23B is a vertical cross-section view of the alternative embodiment of the first exemplary structure along the plane B-B' of FIG. 23C.
Figure 23A:
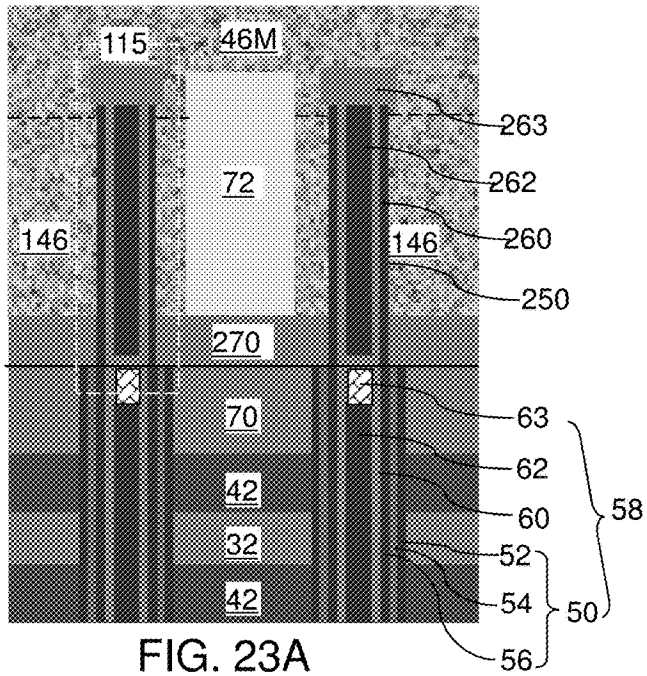
FIG. 23A is a vertical cross-section view of the alternative embodiment of the first exemplary structure along the plane A-A' of FIG. 23C.

Referring to FIGS. 23A to 23C, at least one conductive material can be conformally deposited to fill the void volumes 279 (i.e., gaps) between each set of drain select level assemblies 115 between neighboring pairs of drain select level isolation strips 72. The at least one conductive material can include a metallic liner layer and a metallic fill material layer. For example, the materials employed to form the drain select gate electrodes 146 at the processing steps of FIGS. 18A-18C can be employed. Each portion of the at least one conductive material that is deposited below the horizontal plane including the bottom surfaces of the drain regions 263, and within void volumes 279 from which the sacrificial matrix material layer 272 and the sacrificial spacers 274 are removed, constitutes a drain select gate electrode 146. A continuous conductive material layer 46M is formed over each of the drain select gate electrodes 146 and over regions of the isolation spacer layer 270 that do not underlie arrays of the drain select level assemblies 115.

Figure 24C:
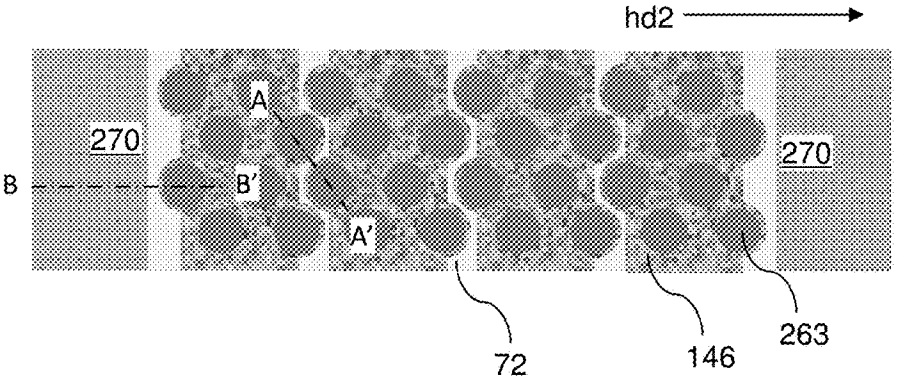
FIG. 24C is a top-down view of the alternative embodiment of the first exemplary structure after isotropically recessing the at least one conductive material to form drain select gate electrodes according to the first embodiment of the present disclosure.
Figure 24B:
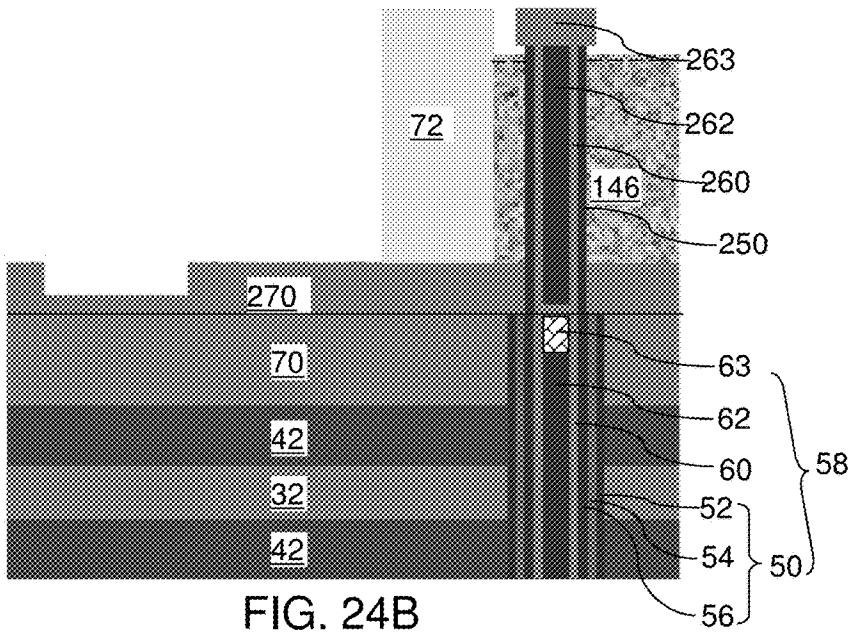
FIG. 24B is a vertical cross-section view of the alternative embodiment of the first exemplary structure along the plane B-B' of FIG. 24C.
Figure 24A:
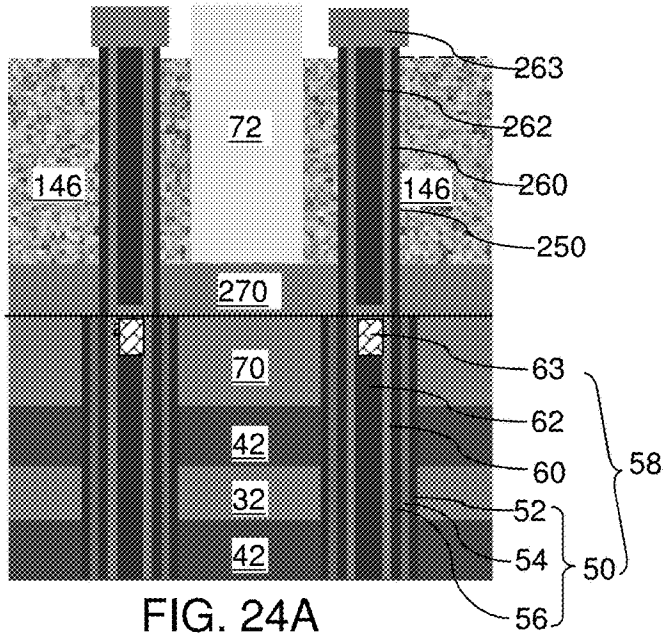
FIG. 24A is a vertical cross-section view of the alternative embodiment of the first exemplary structure along the plane A-A' of FIG. 24C.

Referring to FIGS. 24A-24C, the at least one conductive material of the continuous conductive material layer 46M can be selectively recessed by an anisotropic or isotropic etch process. Specifically, horizontal portions of the at least one conductive material can be removed from above the array of drain select level assemblies 115 and from around upper portions of the array of drain select level assemblies 115. The unetched remaining portions of the at least one conductive material overlying the isolation spacer layer 270 constitute the drain select gate electrodes 146, which are laterally spaced among one another by the drain select level dielectric strips 72.

The drain select gate electrodes 146 can be formed on the array of drain select level assemblies 115 and the drain select level isolation strips 72. Each of the drain select gate electrodes 146 can laterally encircle each of the drain select level assemblies 115 located between a neighboring pair of drain select level isolation strips 72. In one embodiment, each of the drain select gate electrodes 146 can include a pair of lengthwise sidewalls that generally extend along the first horizontal direction hd1. Each of the lengthwise sidewalls of the drain select gate electrode 146 can include a laterally alternating sequence of planar sidewall portions and convex sidewall portions. In one embodiment, each of the lengthwise sidewalls of the drain select gate electrode 146 can include a laterally alternating sequence of vertical planar sidewall portions and vertical convex sidewall portions. Each of the drain select gate electrodes laterally surrounds respective rows of the drain select level assemblies 115. Each row of the drain select level assemblies 115 can be arranged along the first horizontal direction hd1. The top surface of each drain select gate electrode 146 can be located below the horizontal plane including the bottom surfaces of the drain regions 263 to avoid electrical shorts between the drain select gate electrodes 146 and the drain regions 263.

Figure 25C:
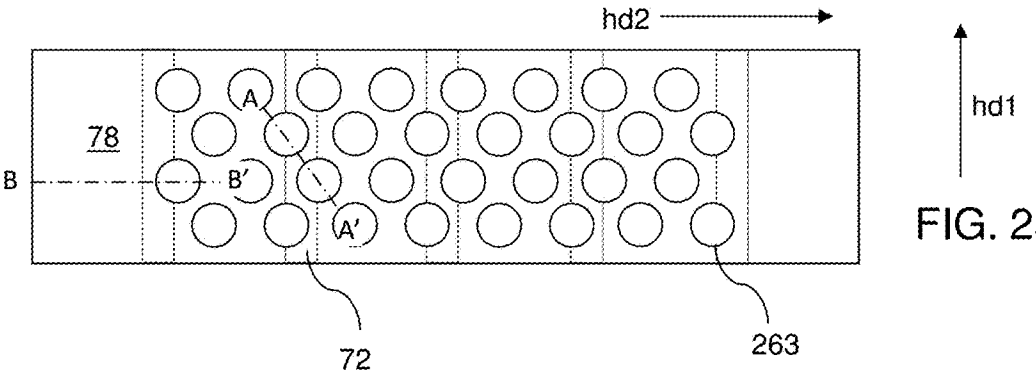
FIG. 25C is a top-down view of the alternative embodiment of the first exemplary structure after formation of a dielectric fill material layer according to the first embodiment of the present disclosure.
Figure 25B:
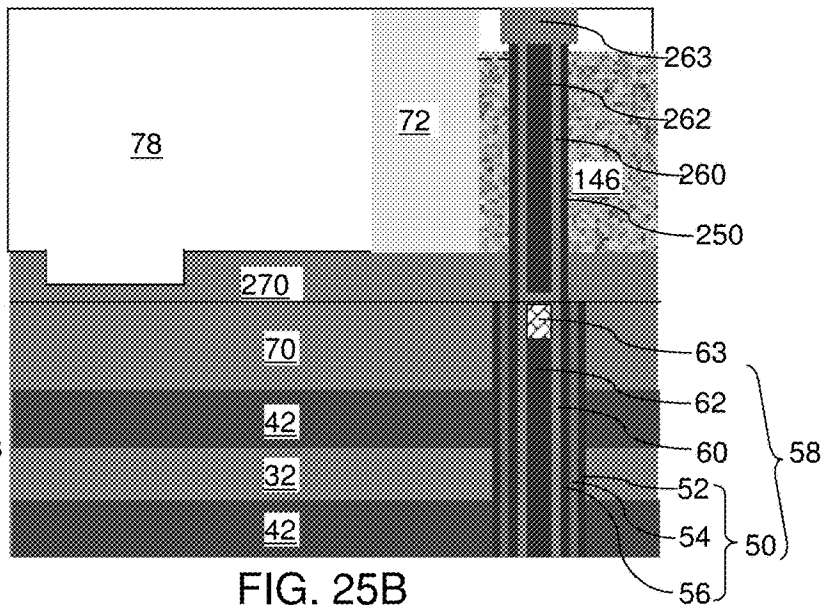
FIG. 25B is a vertical cross-section view of the alternative embodiment of the first exemplary structure along the plane B-B' of FIG. 25C.
Figure 25A:
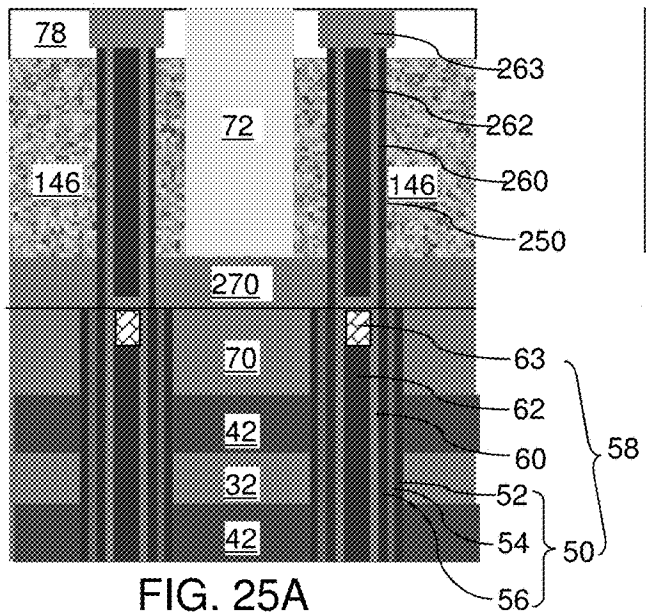
FIG. 25A is a vertical cross-section view of the alternative embodiment of the first exemplary structure along the plane A-A' of FIG. 25C.

Referring to FIGS. 25A-25C, a dielectric fill material layer 78 is formed on the top surface of the drain select gate electrodes 146. The dielectric fill material layer 78 can include a planarizable dielectric material such as silicon oxide. The dielectric fill material layer 78 can be planarized to remove to provide a top surface that is coplanar with the top surfaces of the drain regions 263. For example, chemical mechanical planarization or a recess etch can be employed. The top surfaces of the drain select level isolation strips 72 and the dielectric fill material layer 78 can be within a same horizontal plane as the top surfaces of the drain regions 263. In one embodiment, portions of the dielectric fill material layer 78 may be laterally spaced apart among one another by the drain select level isolation strips 72.

Alternatively, the planarized top surface of the dielectric fill material layer 78 can be formed over the horizontal plane including the top surfaces of the drain regions 163 and the drain select level isolation strips 72. In this case, the dielectric fill material layer 78 can be formed as a single continuous material layer.

Each volume located underneath horizontal interfaces between the dielectric fill material layer 78 and the drain select gate electrodes 146 and located above bottom surfaces of the drain select gate electrodes 146, and located within peripheries defined by sidewalls of the drain select gate electrodes 146 can be filled entirely with a respective one of the drain select gate electrodes 146. In other words, the drain select gate electrodes can have a uniform horizontal cross-sectional shape that is invariant between the top surface thereof and the bottom surface thereof.

Figure 26C:
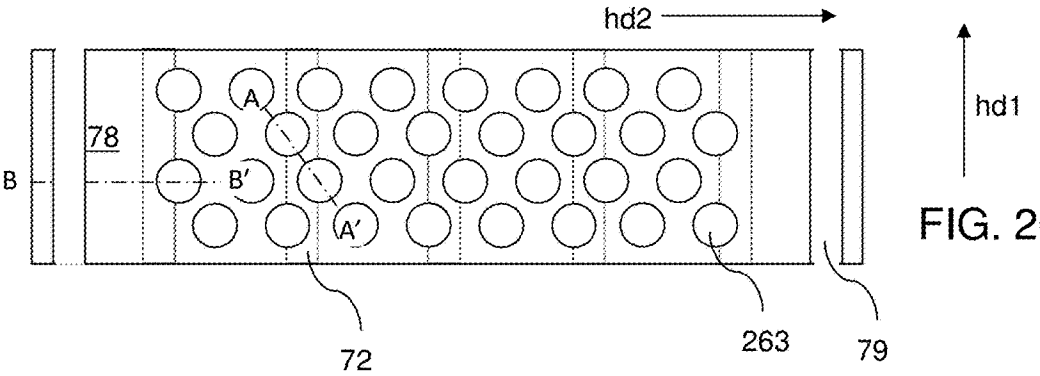
FIG. 26C is a top-down view of the alternative embodiment of the first exemplary structure after formation of backside trenches according to the first embodiment of the present disclosure.
Figure 26B:
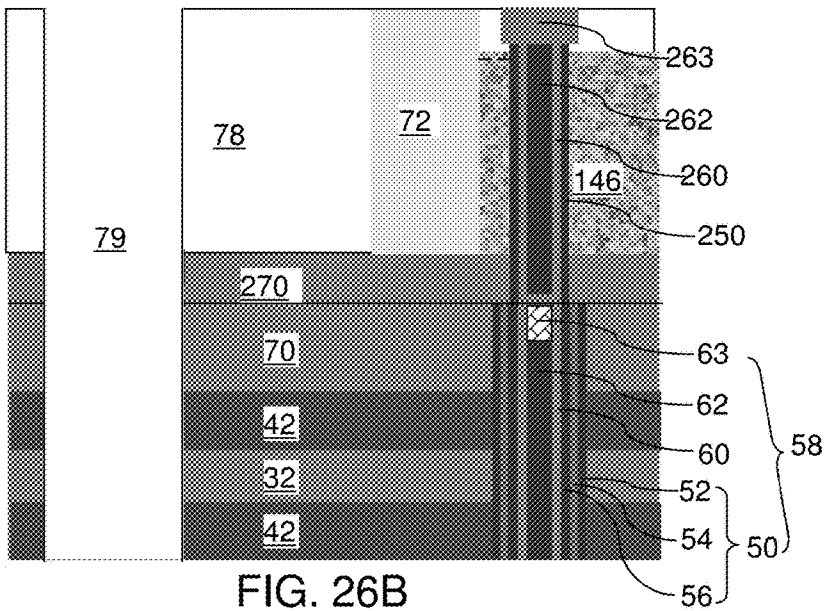
FIG. 26B is a vertical cross-section view of the alternative embodiment of the first exemplary structure along the plane B-B' of FIG. 26C.
Figure 26A:
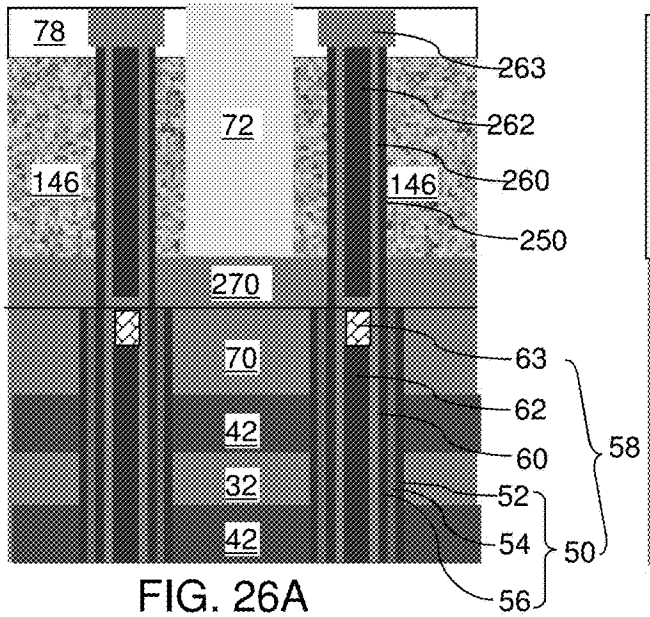
FIG. 26A is a vertical cross-section view of the alternative embodiment of the first exemplary structure along the plane A-A' of FIG. 26C.

Referring to FIGS. 26A-26C, a photoresist layer (not shown) can be applied over the dielectric fill material layer 78, and can be lithographically patterned to form openings in areas between clusters of drain select level assemblies 115. The pattern of the openings in the photoresist layer can be the same as in the processing steps of FIGS. 16A-16E. Further, the pattern of the opening in the photoresist layer can be the same as the pattern of the upper backside trenches 179 as formed at the processing steps of FIGS. 21A-21C.

The pattern in the photoresist layer can be transferred through the dielectric fill material layer 78, the isolation spacer layer 270, the insulating cap layer 70, the alternating stack (32, 42) and/or the retro-stepped dielectric material portion 65 employing an anisotropic etch to form the backside trenches 79. The backside trenches 79 vertically extend at least to the top surface of the substrate (9, 10), and laterally extend in the first horizontal direction hd1 through the memory array region 100 and the contact region 300. In one embodiment, the backside trenches 79 can include a source contact opening in which a source contact via structure can be subsequently formed.

The photoresist layer can be removed, for example, by ashing. The backside trenches 79 can extend along the first horizontal direction hd1, which is parallel to the lengthwise direction of the drain select level isolation strips 72. Each backside trench 79 can be located between a set of at least one drain select level isolation strip 72, and each set of at least one drain select level isolation strip 72 can be located between a neighboring pair of backside trenches 79.

Figures 27A, 27B, 27C:
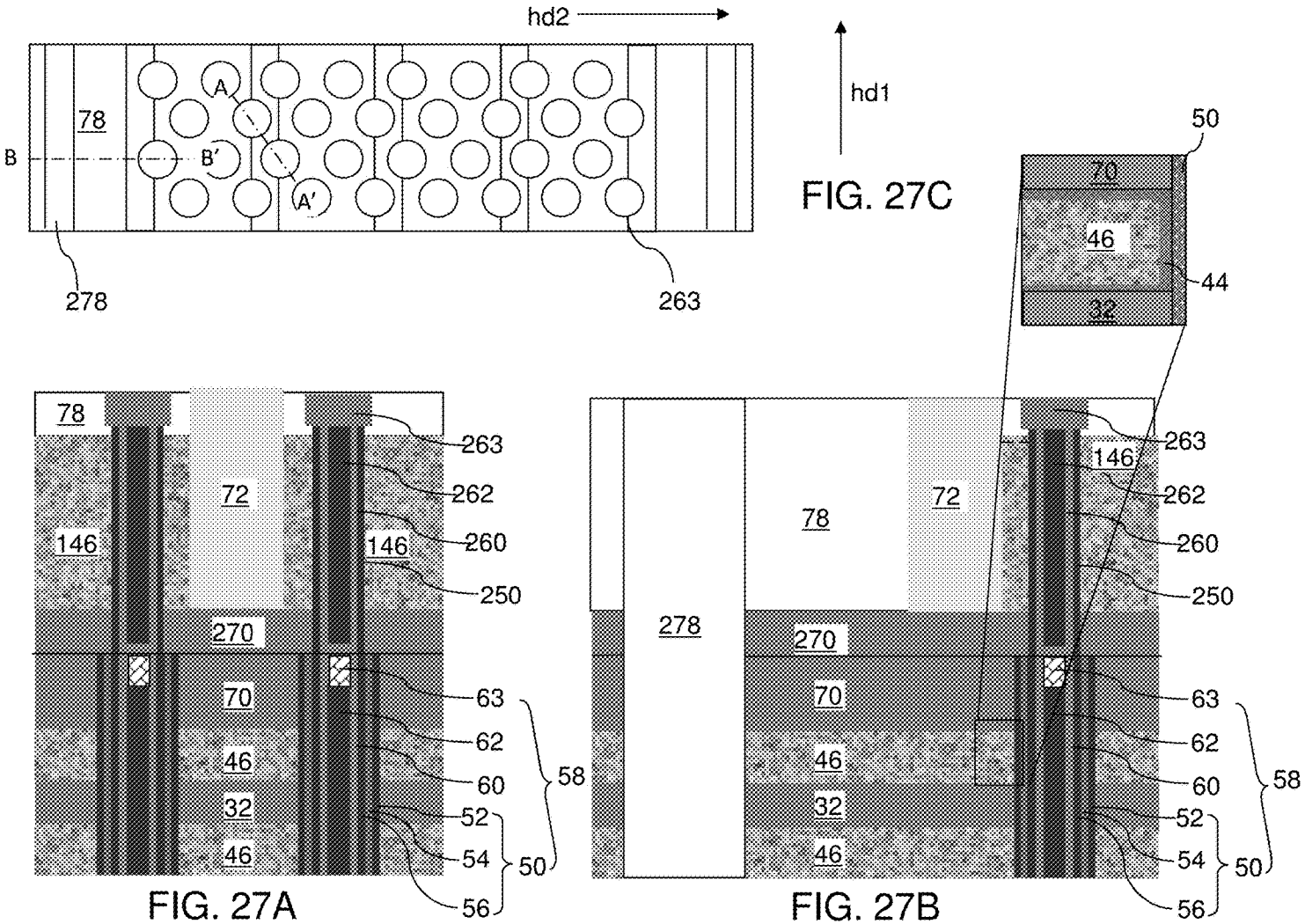
FIG. 27A is a vertical cross-section view of the alternative embodiment of the first exemplary structure along the plane A-A' of FIG. 27C.
FIG. 27B is a vertical cross-section view of the alternative embodiment of the first exemplary structure along the plane B-B' of FIG. 27C.
FIG. 27C is a top-down view of the alternative embodiment of the first exemplary structure after replacement of sacrificial material layers with electrically conductive layers and formation of dielectric wall structures according to the first embodiment of the present disclosure.

Referring to FIGS. 27A-27C, the processing steps of FIGS. 17A-17D can be performed to introduce an isotropic etchant into the backside trenches 79 in an isotropic etch process. The isotropic etchant is an etchant that etches the second material of the sacrificial material layers 42 selective to the first material of the insulating layers 32, selective to the dielectric materials of the dielectric fill material layer 78 and the drain select level isolation strips 72, and selective to the outermost layers of the memory films 50. The sacrificial material layers 42 can be removed selective to the insulating layers 32 and the memory stack structures 55. Backside recesses are formed in volumes from which the sacrificial material layers 42 are removed.

A backside blocking dielectric layer (shown in the inset of FIG. 27B) can be optionally formed by a conformal deposition process as in the processing steps of FIGS. 18A-18C. At least one conductive material can be subsequently deposited by at least one conformal deposition method as in the processing steps of FIGS. 18A-18C. Excess portions of the conductive material can be removed from inside the backside trenches 79 and from above the dielectric fill material layer 78 by an isotropic etch to form electrically conductive layers 46 in the backside recesses.

A dielectric fill material can be subsequently deposited in the backside trenches 79 to form dielectric material portions therein, which are herein referred to as dielectric wall structure 278. The dielectric wall structures 278 provides electrical isolation between laterally neighboring pairs of electrically conductive layers 46 that are located at the same level, i.e., at the same vertical distance from the top surface of the substrate (9, 10). The dielectric fill material layer 78 and the dielectric wall structures 278 can include the same dielectric material or different dielectric materials. For example, the dielectric fill material layer 78 and the dielectric wall structures 278 can include an undoped silicate glass or doped silicate glasses having the same dopant species at the same dopant concentration(s) or having different dopant species and/or different dopant concentrations.

Figure 28C:
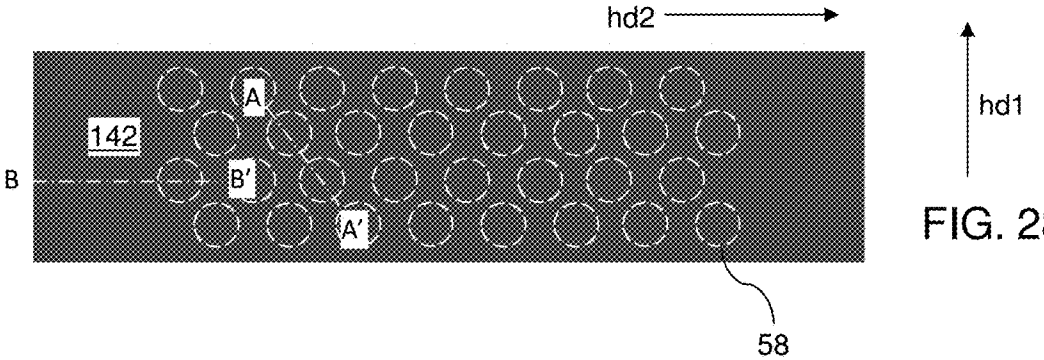
FIG. 28C is a top-down view of the region R of second exemplary structure after formation of sacrificial matrix layers and insulating spacer layers according to the first embodiment of the present disclosure.
Figure 28B:
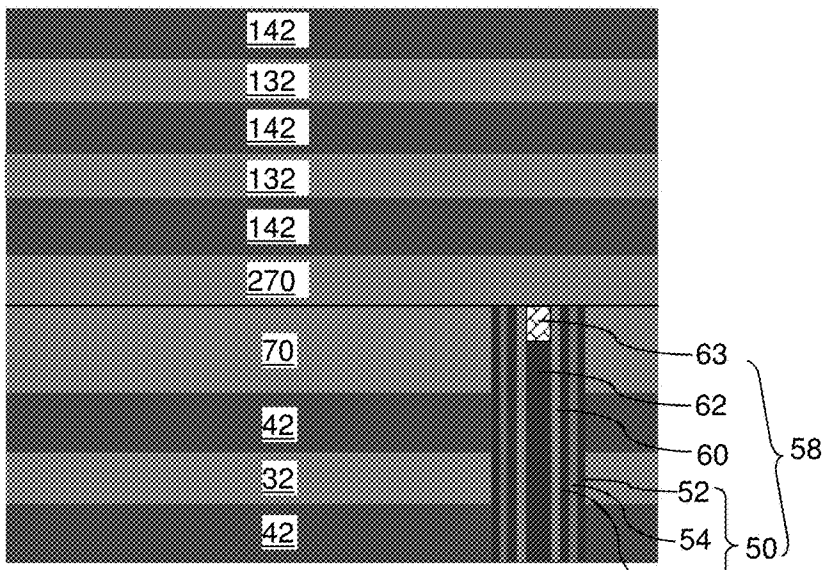
FIG. 28B is a vertical cross-section view of the second exemplary structure along the plane B-B' of FIG. 28C.
Figure 28A:
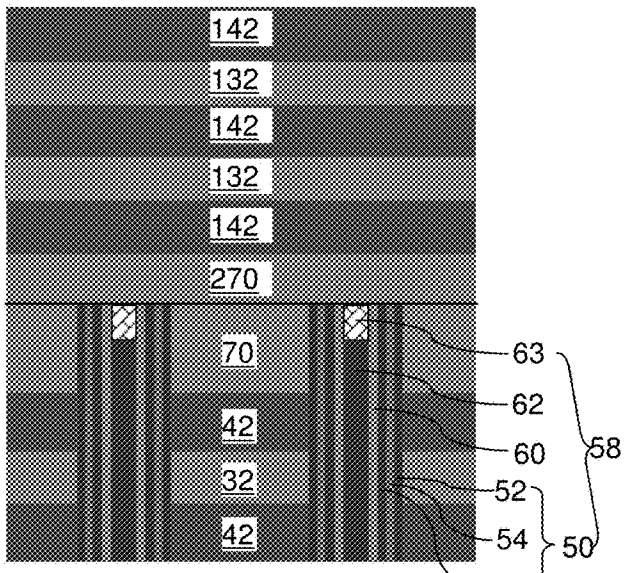
FIG. 28A is a vertical cross-section view of a second exemplary structure along the plane A-A' of FIG. 28C.

Referring to FIGS. 28A-28C, a second exemplary structure according to a second embodiment of the present disclosure can be derived from the first exemplary structure of FIGS. 6A, 6B, and 7A-7C by forming an isolation spacer layer 270 as in the first embodiment, and by subsequently forming a layer stack including multiple sacrificial matrix material layers 142 spaced among one another by insulating spacer layers 132 in lieu of a single sacrificial matrix material layer 272. In this case, the at least one sacrificial matrix material layer 142 formed over the alternating stack (32, 42) includes a plurality of sacrificial matrix material layers 142 that are spaced among one another by one or more insulating spacer layers 132.

Each of the sacrificial matrix material layers 142 of the second embodiment can include the same material as the sacrificial matrix material layer 272 of the first embodiment. Each of the one or more insulating spacer layers 132 can include the same material as the material of the insulating layers 32 or the material of the isolation spacer layer 270. In one embodiment, the sacrificial matrix material layers 142 can include silicon nitride, and the insulating spacer layers 132 can include silicon oxide. Each of the sacrificial matrix material layers 142 and the insulating spacer layers 132 can have a thickness in a range from 20 nm to 100 nm, although lesser and greater thicknesses can also be employed. In one embodiment, an alternating stack of at least three sacrificial matrix material layers 142 and at least two insulating spacer layers 132 can be formed.

Figure 29C:
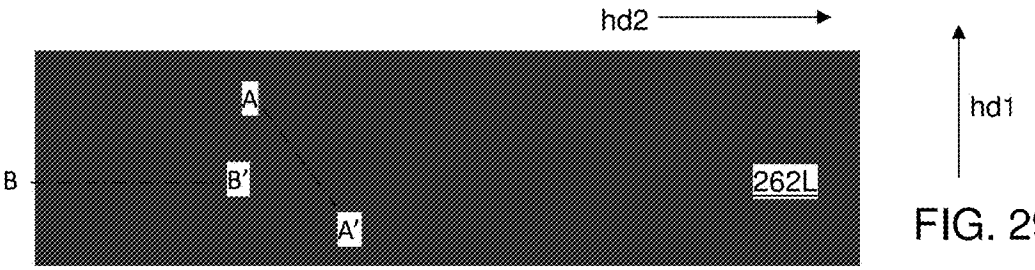
FIG. 29C is a top-down view of the region R in the second exemplary structure after formation of an array of openings extending through the sacrificial matrix material layers and the insulating spacer layers, gate dielectrics, a semiconductor material layer, and a dielectric core material layer according to the second embodiment of the present disclosure.
Figure 29B:
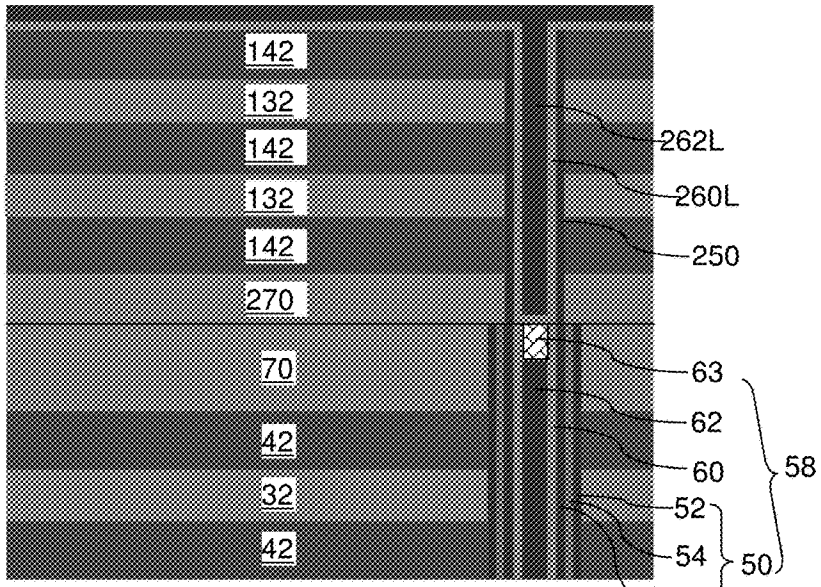
FIG. 29B is a vertical cross-section view of the second exemplary structure along the plane B-B' of FIG. 29C.
Figure 29A:
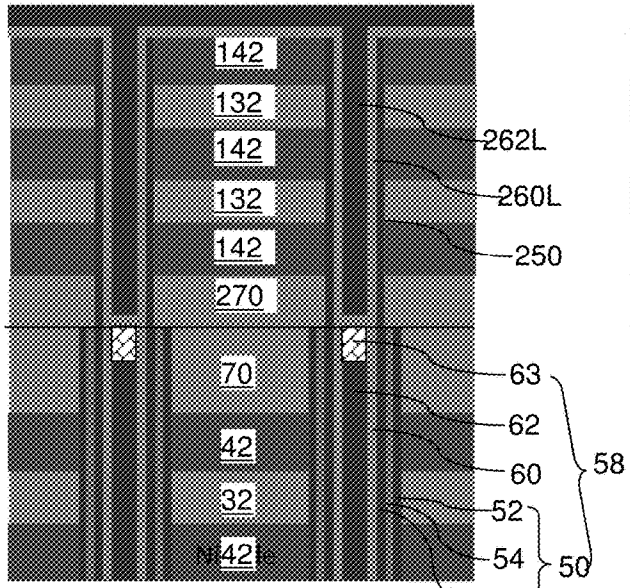
FIG. 29A is a vertical cross-section view of the second exemplary structure along the plane A-A' of FIG. 29C.

Referring to FIGS. 29A-29C, an array of cylindrical openings can be formed through layer stack including multiple sacrificial matrix material layers 142 spaced among one another by insulating spacer layers 132 and through the isolation spacer layer 270. The processing steps of FIGS. 9A-9C can be employed to form a patterned photoresist layer, which can have the same pattern as in the first embodiment. The anisotropic etch process that forms the cylindrical openings through the sacrificial matrix material layer 272 and the isolation spacer layer 270 can be modified to form an array of cylindrical openings through the layer stack including multiple sacrificial matrix material layers 142 spaced among one another by insulating spacer layers 132. Top surfaces of the enhanced doping regions 63 and the memory level channel portions 60 can be physically exposed at the bottom of each of the cylindrical openings through the layer stack including multiple sacrificial matrix material layers 142 spaced among one another by insulating spacer layers 132. Subsequent processing steps of FIGS. 9A-9C can be performed to form gate dielectrics 250, the conformal semiconductor material layer 260L, and the drain select level dielectric core layer 262L in the array of cylindrical openings and over the layer stack including multiple sacrificial matrix material layers 142 spaced among one another by insulating spacer layers 132.

Figure 30C:
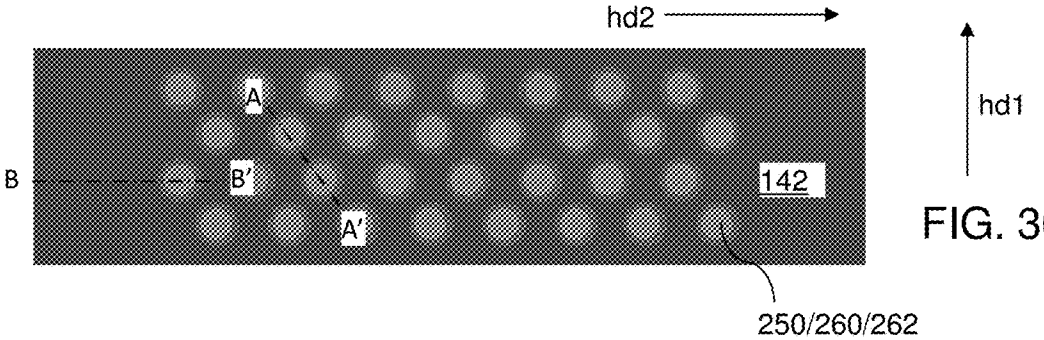
FIG. 30C is a top-down view of the region R in the second exemplary structure after formation of drain select level channel portions and drain select level dielectric cores according to the second embodiment of the present disclosure.
Figure 30B:
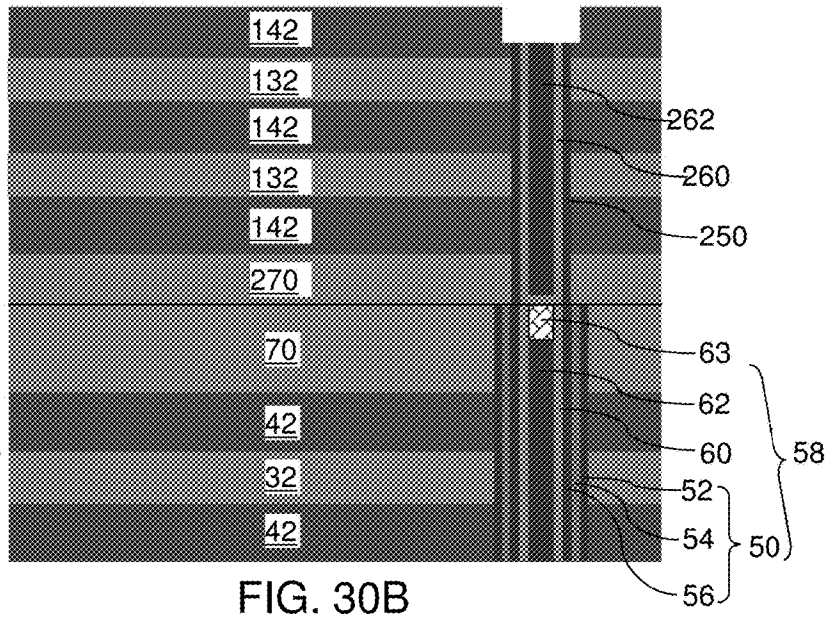
FIG. 30B is a vertical cross-section view of the second exemplary structure along the plane B-B' of FIG. 30C.
Figure 30A:
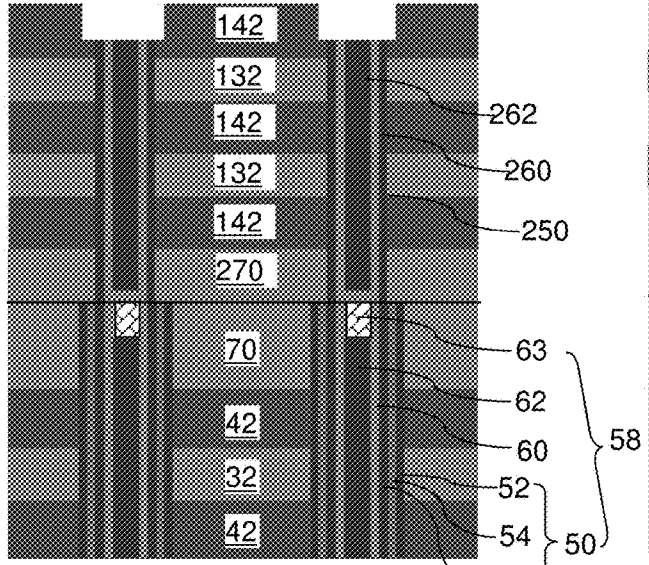
FIG. 30A is a vertical cross-section view of the second exemplary structure along the plane A-A' of FIG. 30C.

Referring to FIGS. 30A-30C, the processing steps of FIGS. 10A-10C can be performed to form the drain select level channel portions 260 and the drain select level dielectric cores 262. Recessed regions can be formed above each drain select level dielectric core 262 in the same manner as in the first embodiment.

Figure 31C:
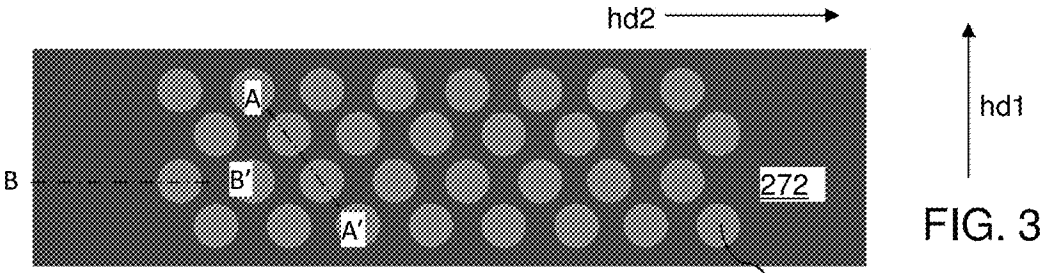
FIG. 31C is a top-down view of the region R in the second exemplary structure after formation of drain regions according to the second embodiment of the present disclosure.
Figure 31B:
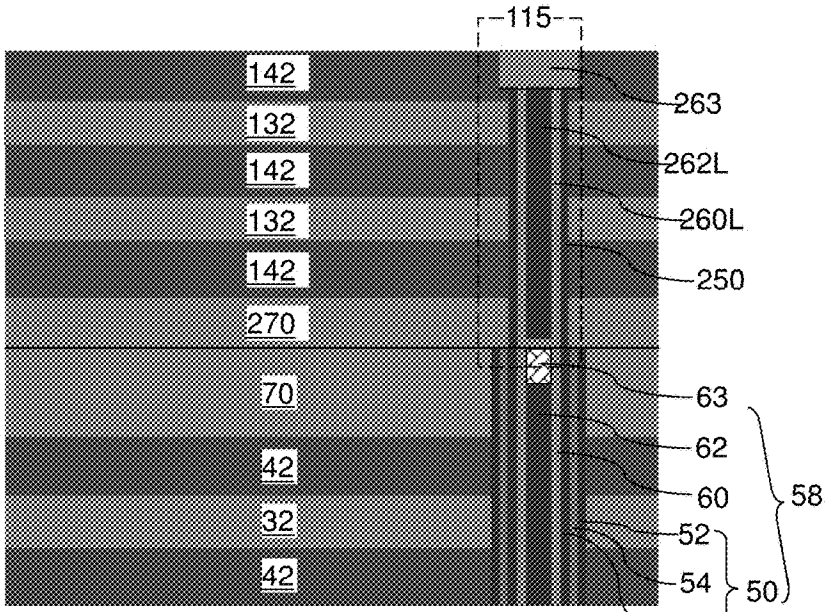
FIG. 31B is a vertical cross-section view of the second exemplary structure along the plane B-B' of FIG. 31C.
Figure 31A:
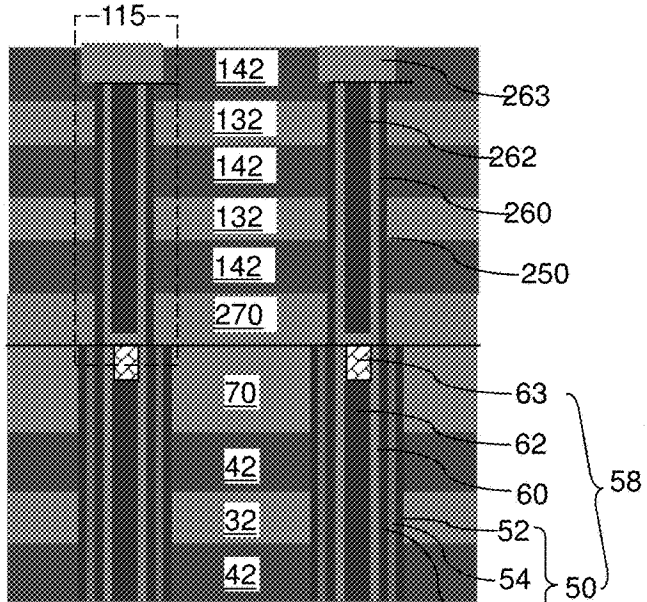
FIG. 31A is a vertical cross-section view of the second exemplary structure along the plane A-A' of FIG. 31C.

Referring to FIGS. 31A-31C, drain regions 263 can be formed in each of the recessed regions in the same manner as in the first embodiment. Arrays of drain select level assemblies 115 having the same periodicity as the underlying array of memory stack structures 55 can be formed as in the first embodiment.

Figures 32A, 32B, 32C:
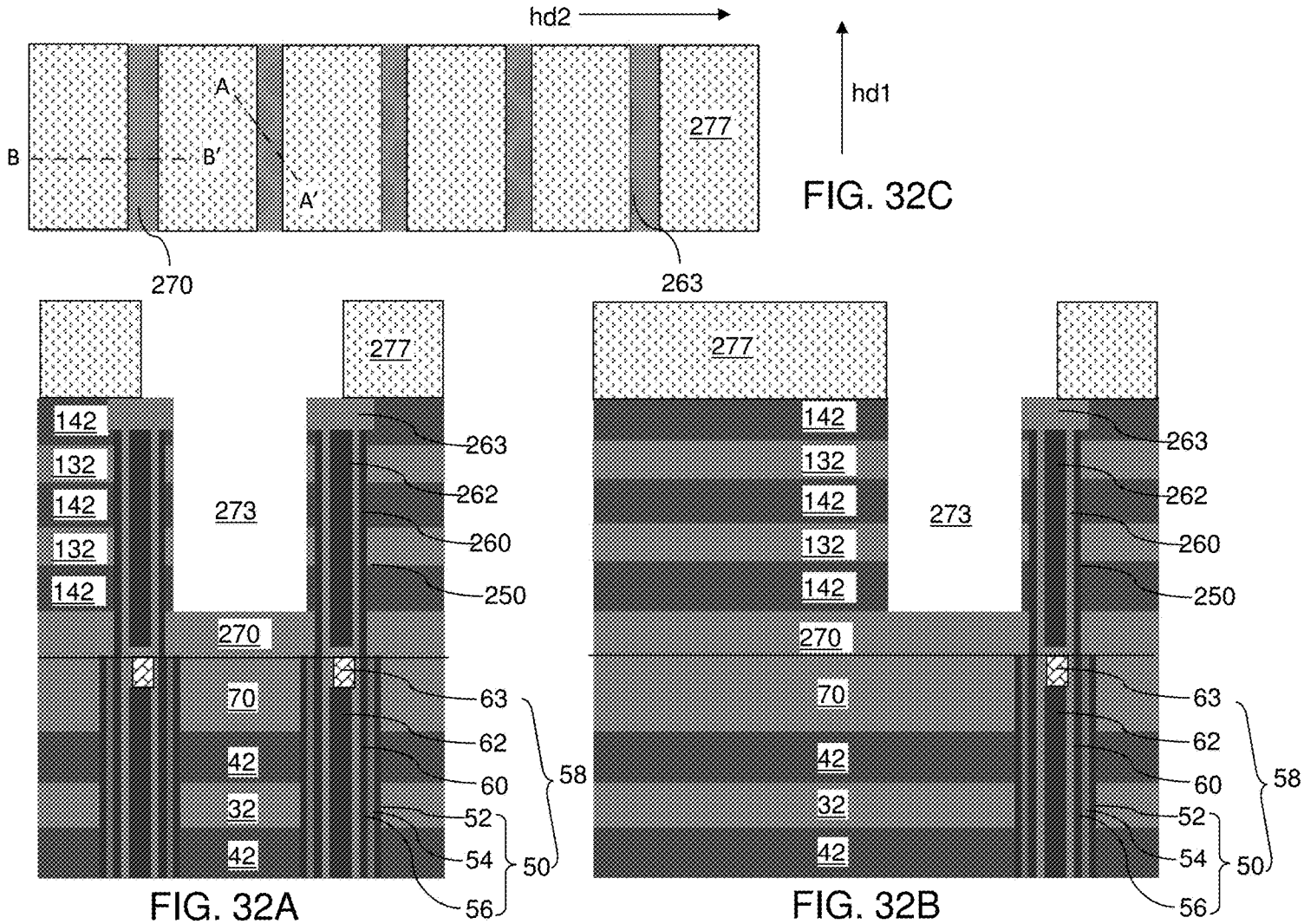
FIG. 32A is a vertical cross-section view of the second exemplary structure along the plane A-A' of FIG. 32C.
FIG. 32B is a vertical cross-section view of the second exemplary structure along the plane B-B' of FIG. 32C.
FIG. 32C is a top-down view of the region R in the second exemplary structure after patterning laterally extending trenches in the sacrificial matrix material layers and the insulating spacer layers according to the second embodiment of the present disclosure.

Referring to FIGS. 32A-32C, a photoresist layer 277 is applied and lithographically patterned in the same manner as in the processing steps of FIGS. 12A-12C. An anisotropic etch process is performed to etch through the layer stack including multiple sacrificial matrix material layers 142 spaced among one another by insulating spacer layers 132 employing the combination of the patterned photoresist layer 277 and the drain regions 263 as an etch mask. The isolation spacer layer 270 can be employed as an etch stop layer. Laterally extending trenches 273 are formed through the layer stack including multiple sacrificial matrix material layers 142 spaced among one another by insulating spacer layers 132. The laterally extending trenches 273 can have the same pattern as in the first embodiment. Each of the sacrificial matrix material layers 142 can be patterned into sacrificial material strips, i.e., strips of the sacrificial material, that are laterally spaced apart by the laterally extending trenches 273. Further, each of the one or more insulating spacer layers 132 can be patterned into insulating material strips, i.e., strips of the insulating material.

Each laterally extending trench 273 can laterally extend along the first horizontal direction hd1. Each laterally extending trench 273 is laterally bounded by two lengthwise sidewalls that generally extend along the first horizontal direction hd1. For each laterally extending trench 273 located between a neighboring pair of rows of the drain select level assemblies 115, each of the two lengthwise sidewalls can include a respective alternating sequence of planar sidewall segments of the layer stack of the sacrificial matrix material layers 142 and one or more insulating spacer layers 132 and convex sidewall segments of the layer stack of the sacrificial matrix material layers 142 and one or more insulating spacer layers 132. In one embodiment, for each laterally extending trench 273 located between a neighboring pair of rows of the drain select level assemblies 115, each of the two lengthwise sidewalls can include a respective alternating sequence of vertical planar sidewall segments of the layer stack of the sacrificial matrix material layers 142 and one or more insulating spacer layers 132 and vertical convex sidewall segments of the layer stack of the sacrificial matrix material layers 142 and one or more insulating spacer layers 132.

For each laterally extending trench 273 located around an outermost row of the drain select level assemblies 115, one of the two lengthwise sidewalls can include a respective alternating sequence of planar sidewall segments of the layer stack of the sacrificial matrix material layers 142 and one or more insulating spacer layers 132 and convex sidewall segments of the layer stack of the sacrificial matrix material layers 142 and one or more insulating spacer layers 132, and the other of the two lengthwise sidewalls can consist of a single straight vertical sidewall. In one embodiment, for each laterally extending trench 273 located between a neighboring pair of rows of the drain select level assemblies 115, one of the two lengthwise sidewalls can include a respective alternating sequence of vertical planar sidewall segments of the layer stack of the sacrificial matrix material layers 142 and one or more insulating spacer layers 132 and vertical convex sidewall segments of the layer stack of the sacrificial matrix material layers 142 and one or more insulating spacer layers 132. The photoresist layer 277 can be subsequently removed, for example, by ashing.

Figure 33C:
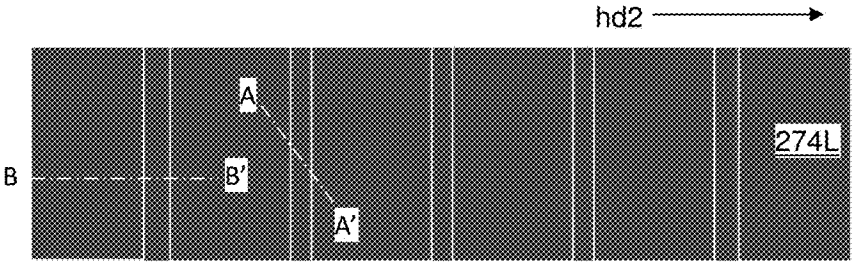
FIG. 33C is a top-down view of the region R in the second exemplary structure after formation of a sacrificial spacer material layer according to the second embodiment of the present disclosure.
Figure 33B:
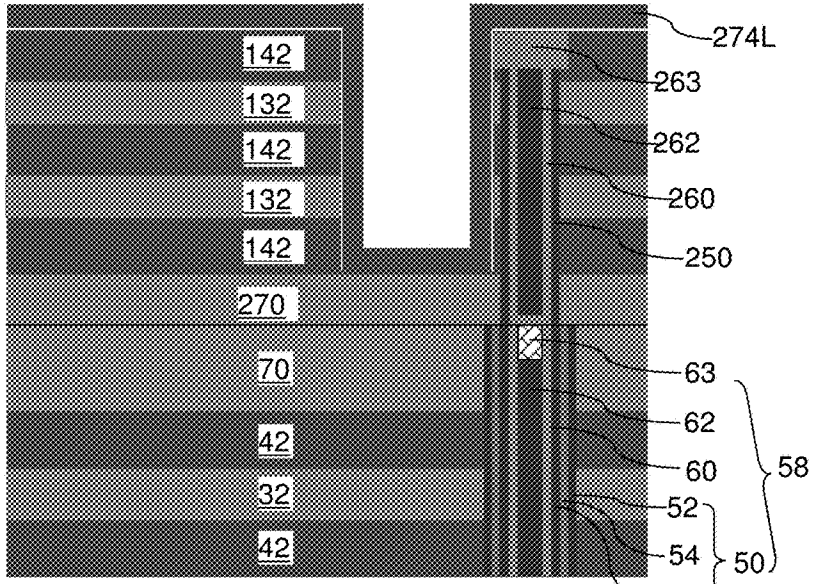
FIG. 33B is a vertical cross-section view of the second exemplary structure along the plane B-B' of FIG. 33C.
Figure 33A:
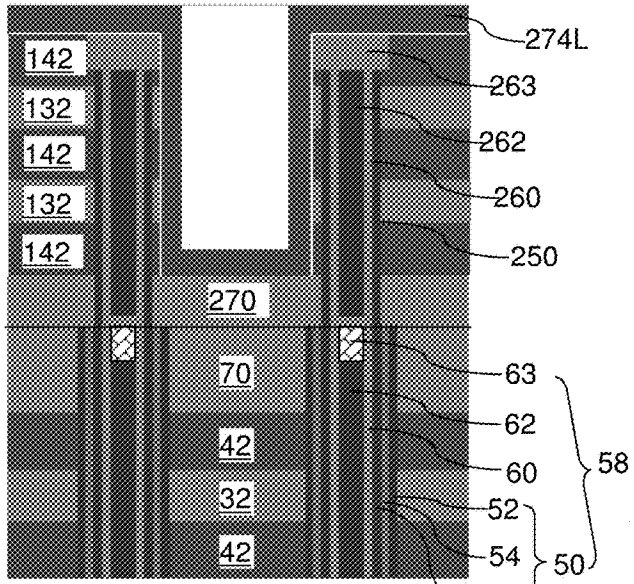
FIG. 33A is a vertical cross-section view of the second exemplary structure along the plane A-A' of FIG. 33C.

Referring to FIGS. 33A-33C, the processing steps of FIGS. 13A-13C can be performed to form a sacrificial spacer material layer 274L.

Figure 34C:
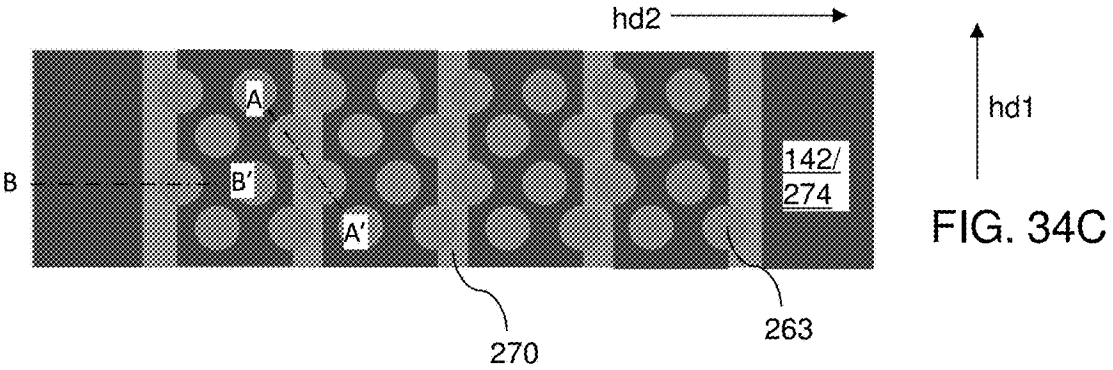
FIG. 34C is a top-down view of the region R in the second exemplary structure after formation of sacrificial spacers according to the second embodiment of the present disclosure.
Figure 34B:
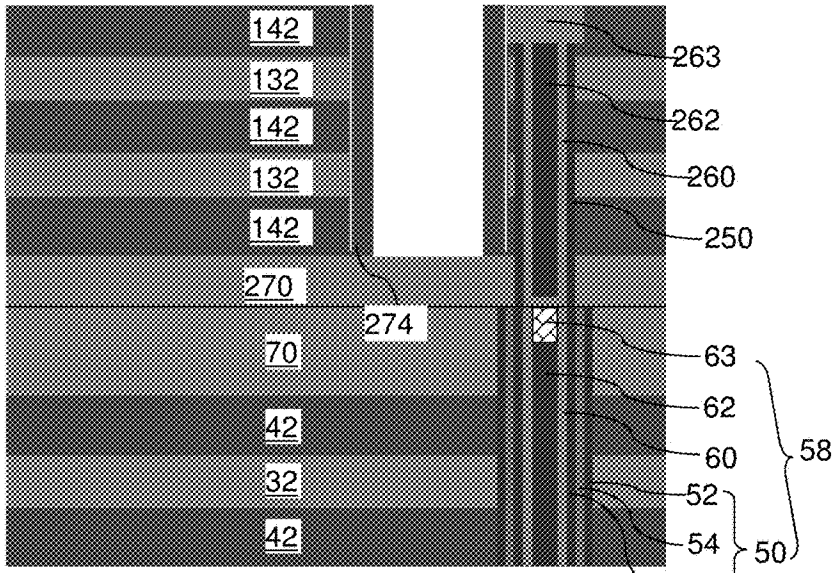
FIG. 34B is a vertical cross-section view of the second exemplary structure along the plane B-B' of FIG. 34C.
Figure 34A:
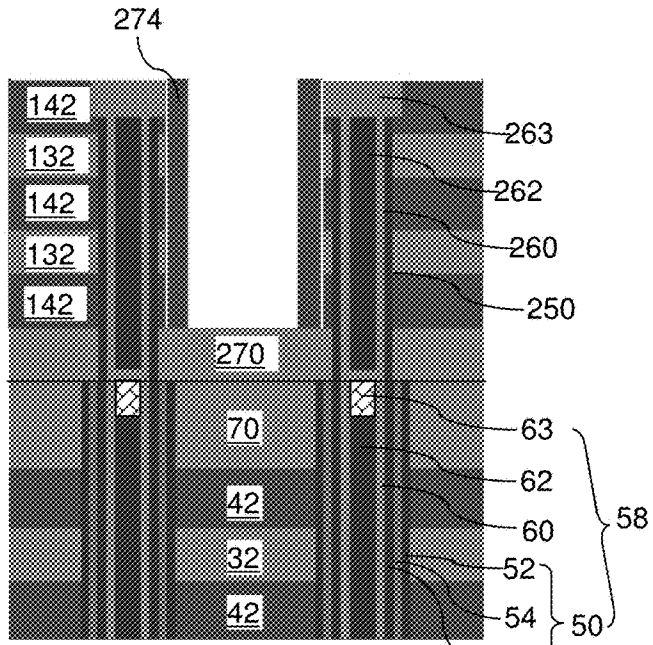
FIG. 34A is a vertical cross-section view of the second exemplary structure along the plane A-A' of FIG. 34C.

Referring to FIGS. 34A-34C, the processing steps of FIGS. 14A-14C can be performed to form sacrificial spacers 274 within each of the laterally extending trenches.

Figure 35C:
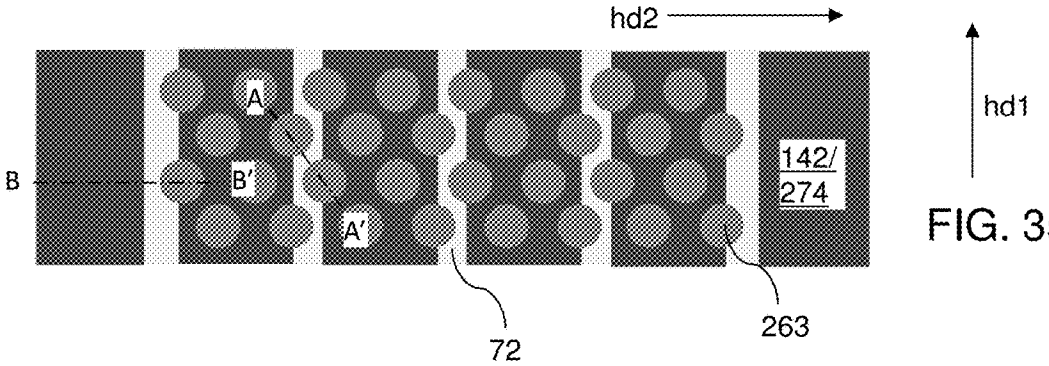
FIG. 35C is a top-down view of the region R in the second exemplary structure after formation of drain select level isolation strips according to the second embodiment of the present disclosure.
Figure 35B:
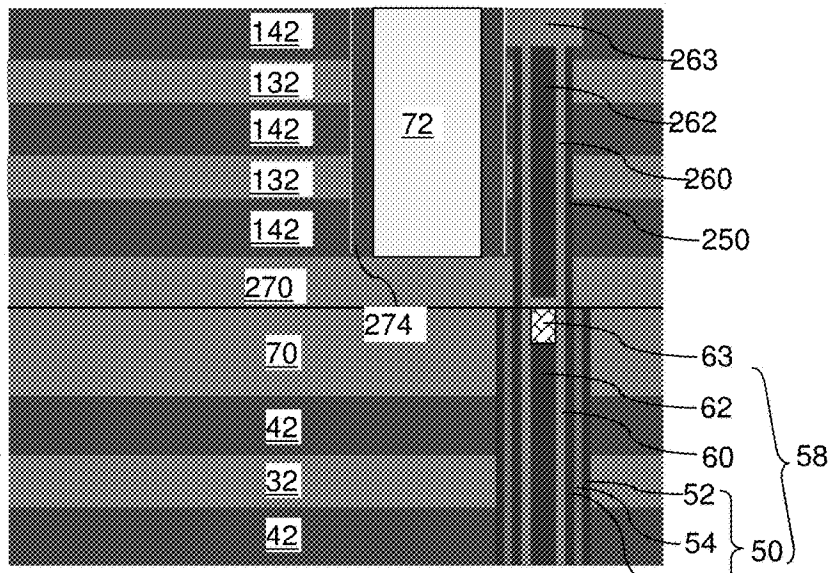
FIG. 35B is a vertical cross-section view of the second exemplary structure along the plane B-B' of FIG. 35C.
Figure 35A:
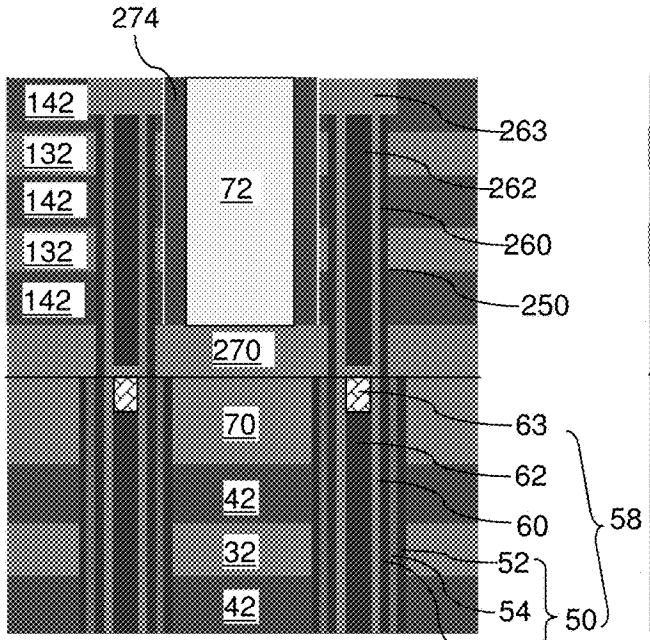
FIG. 35A is a vertical cross-section view of the second exemplary structure along the plane A-A' of FIG. 35C.

Referring to FIGS. 35A-35C, the processing steps of FIGS. 15A-15C can be performed to form a drain select level isolation strip 72 within each unfilled volume of the laterally extending trenches.

Figure 36C:
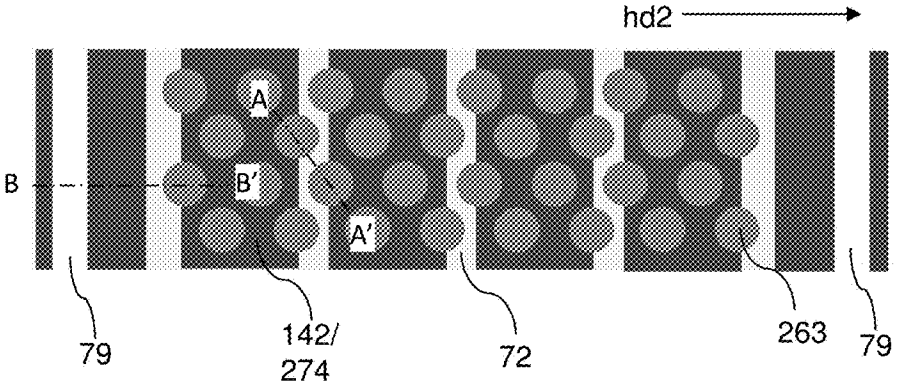
FIG. 36C is a top-down view of the region R in the second exemplary structure after formation of backside trenches according to the second embodiment of the present disclosure.
Figure 36B:
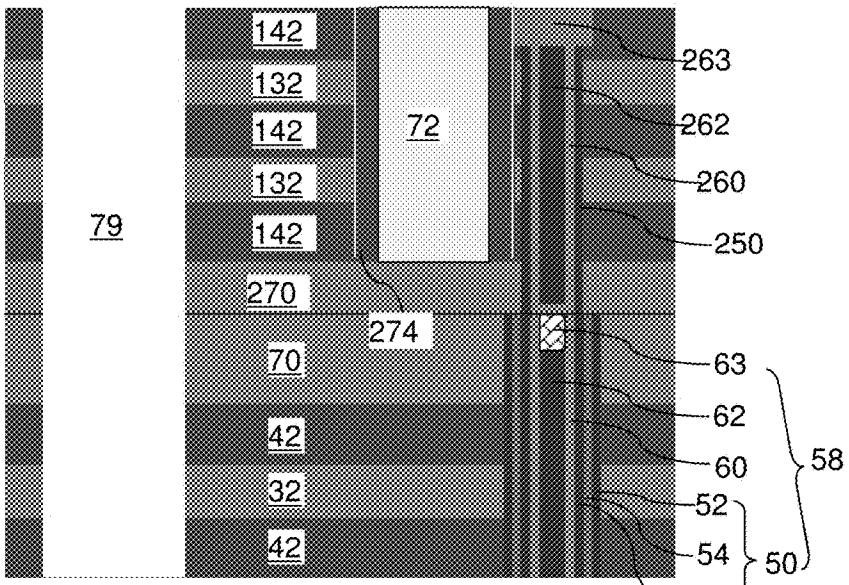
FIG. 36B is a vertical cross-section view of the second exemplary structure along the plane B-B' of FIG. 36C.
Figure 36A:
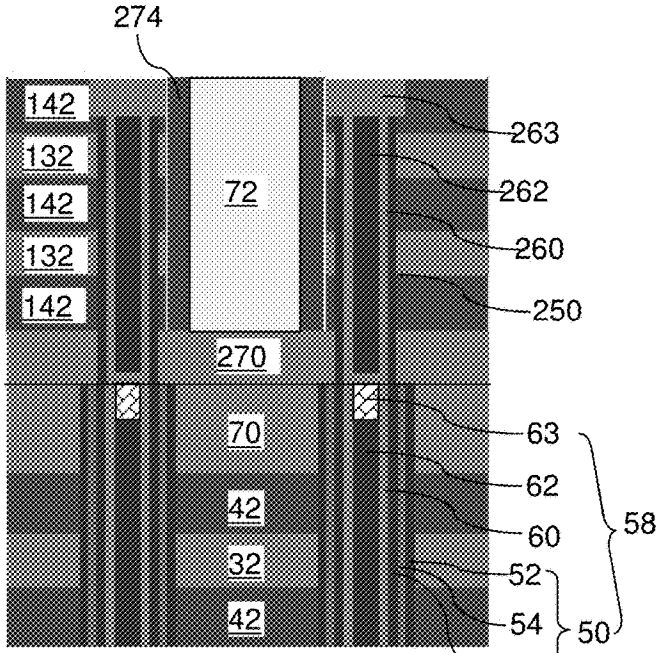
FIG. 36A is a vertical cross-section view of the second exemplary structure along the plane A-A' of FIG. 36C.

Referring to FIGS. 36A-36C, the processing steps of FIGS. 16A-16E can be performed to form backside trenches 79. The anisotropic etch process can be appropriately modified to etch through the layer stack including multiple sacrificial matrix material layers 142 spaced among one another by insulating spacer layers 132, the isolation spacer layer 270, the insulating cap layer 70, and the alternating stack (32, 42).

Figure 37C:
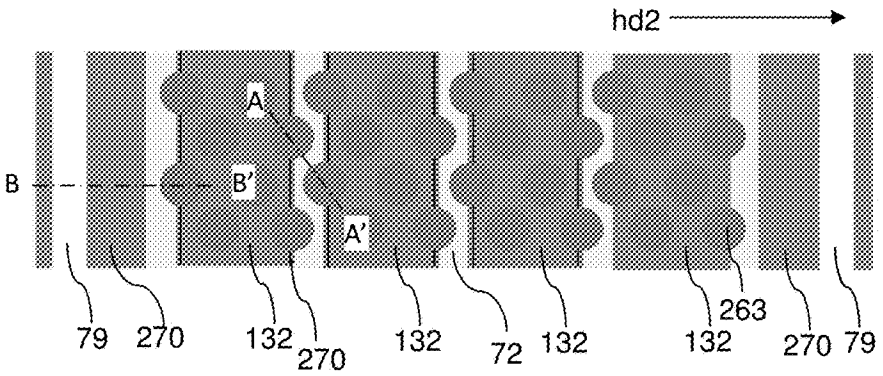
FIG. 37C is a top-down view of the region R in the second exemplary structure after removal of sacrificial material layers, the sacrificial matrix material layers, and the sacrificial spacers and formation of backside recesses according to the second embodiment of the present disclosure.
Figure 37B:
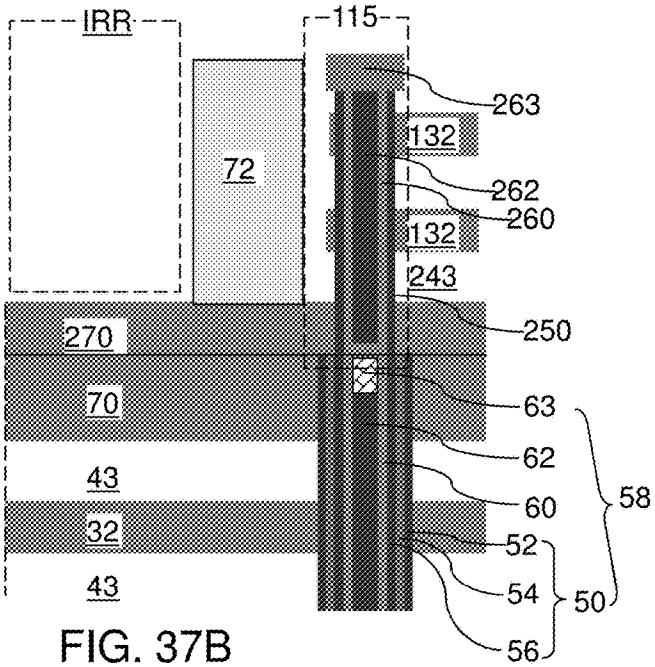
FIG. 37B is a vertical cross-section view of the second exemplary structure along the plane B-B' of FIG. 37C.
Figure 37A:
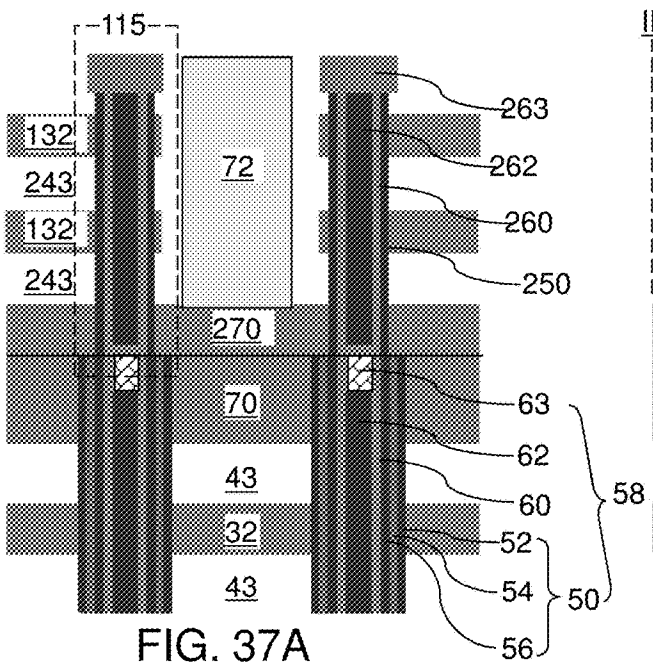
FIG. 37A is a vertical cross-section view of the second exemplary structure along the plane A-A' of FIG. 37C.

Referring to FIGS. 37A-37C, the processing steps of FIGS. 17A-17D can be performed. Specifically, an isotropic etchant can be applied to the second exemplary structure in an isotropic etch process. The isotropic etchant is an etchant that etches the second material of the sacrificial material layers 42, the material of the sacrificial matrix material layers 142, and the material of the sacrificial spacers 274 selective to the first material of the insulating layers 32, selective to the material of the one or more insulating spacer layers 132, selective to the material of the drain select level isolation strips 72, selective to the semiconductor materials of the array of drain select level assemblies 115, and selective to the material of the outermost layer of the memory films 50. The sacrificial material layers 42 can be removed selective to the insulating layers 32 and the memory stack structures 55. Backside recesses 43 are formed in volumes from which the sacrificial material layers 42 are removed. The sacrificial matrix material layer 142 and the sacrificial spacers 274 can be removed from around the drain select level assemblies 115 and the drain select level isolation strips 72 above the top surface of the isolation spacer layer 270.

Strips of each insulating spacer layer 132 that are supported by a respective set of drain select level assemblies 115 between a neighboring pair of drain select level isolation strips 72 remain attached to the respective set of drain select level assemblies 115. Strips of each insulating spacer layer 132 that are not supported by a respective set of drain select level assemblies 115 are removed during the isotropic etch process. The regions from which the strips of each insulating spacer layer 132 are removed are located adjacent to the backside trenches 79, and are herein referred to as insulating spacer removal regions IRR.

Drain select level lateral recesses 243 can be formed between the isolation spacer layer 270 and each remaining strip portion of a bottommost one of the insulating spacer layers 132. If two or more insulating spacer layers 132 are present, additional drain select level lateral recesses 243 can be formed between each vertically neighboring pair of the insulating spacer layers 132.

As in the first embodiment, each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 17C:
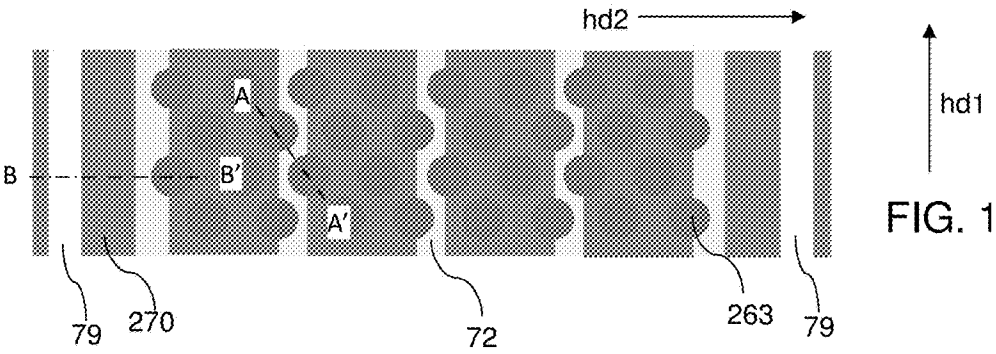
FIG. 17C is a top-down view of the region R in the first exemplary structure after removal of sacrificial material layers, the sacrificial matrix material layer, and the sacrificial spacers and formation of backside recesses according to the first embodiment of the present disclosure.
Figure 17B:
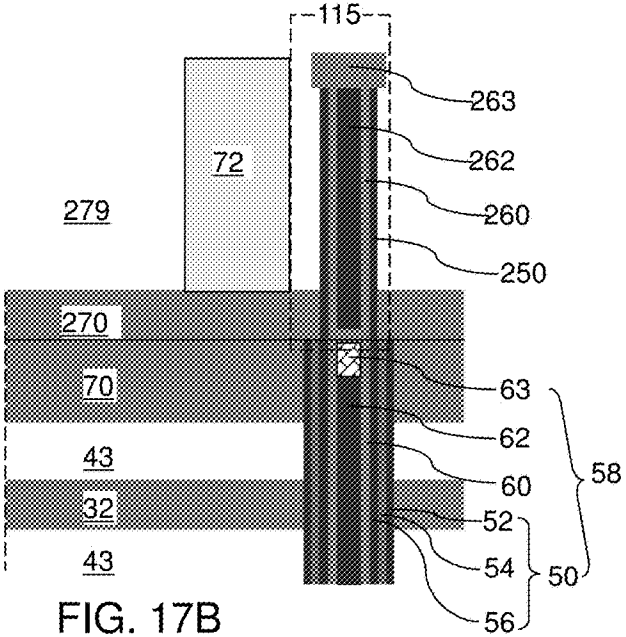
FIG. 17B is a vertical cross-section view of the first exemplary structure along the plane B-B' of FIG. 17C.
Figure 17A:
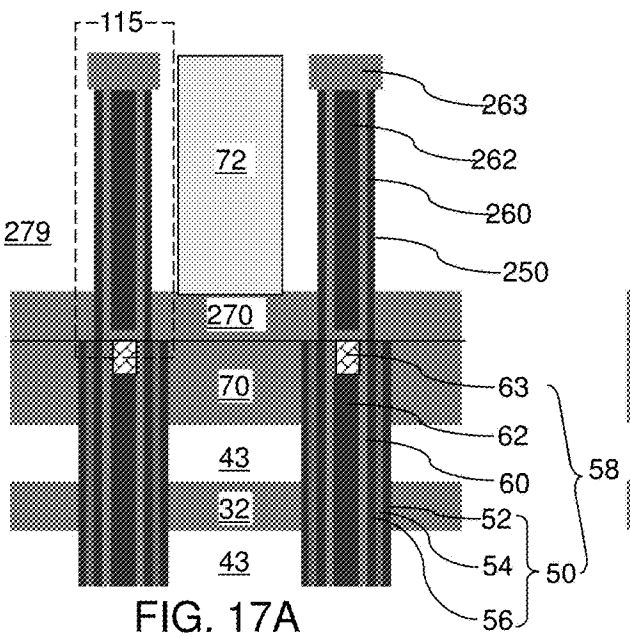
FIG. 17A is a vertical cross-section view of the first exemplary structure along the plane A-A' of FIG. 17C.
Figure 17D:
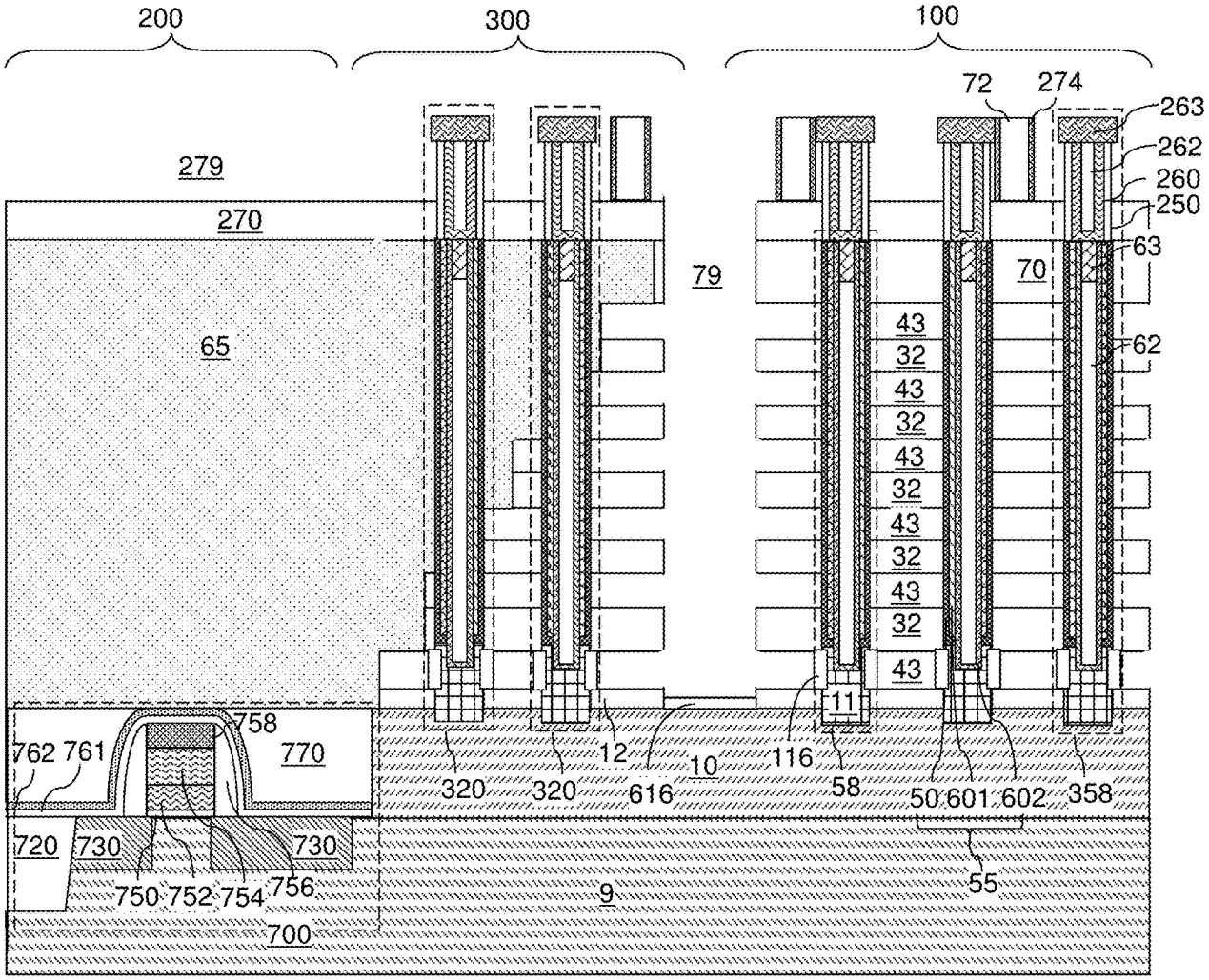
FIG. 17D is a vertical cross-sectional view of the first exemplary structure at the processing steps of FIGS. 17A-17C.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616 as illustrated in FIG. 17D.

Figures 38A, 38B, 38C:
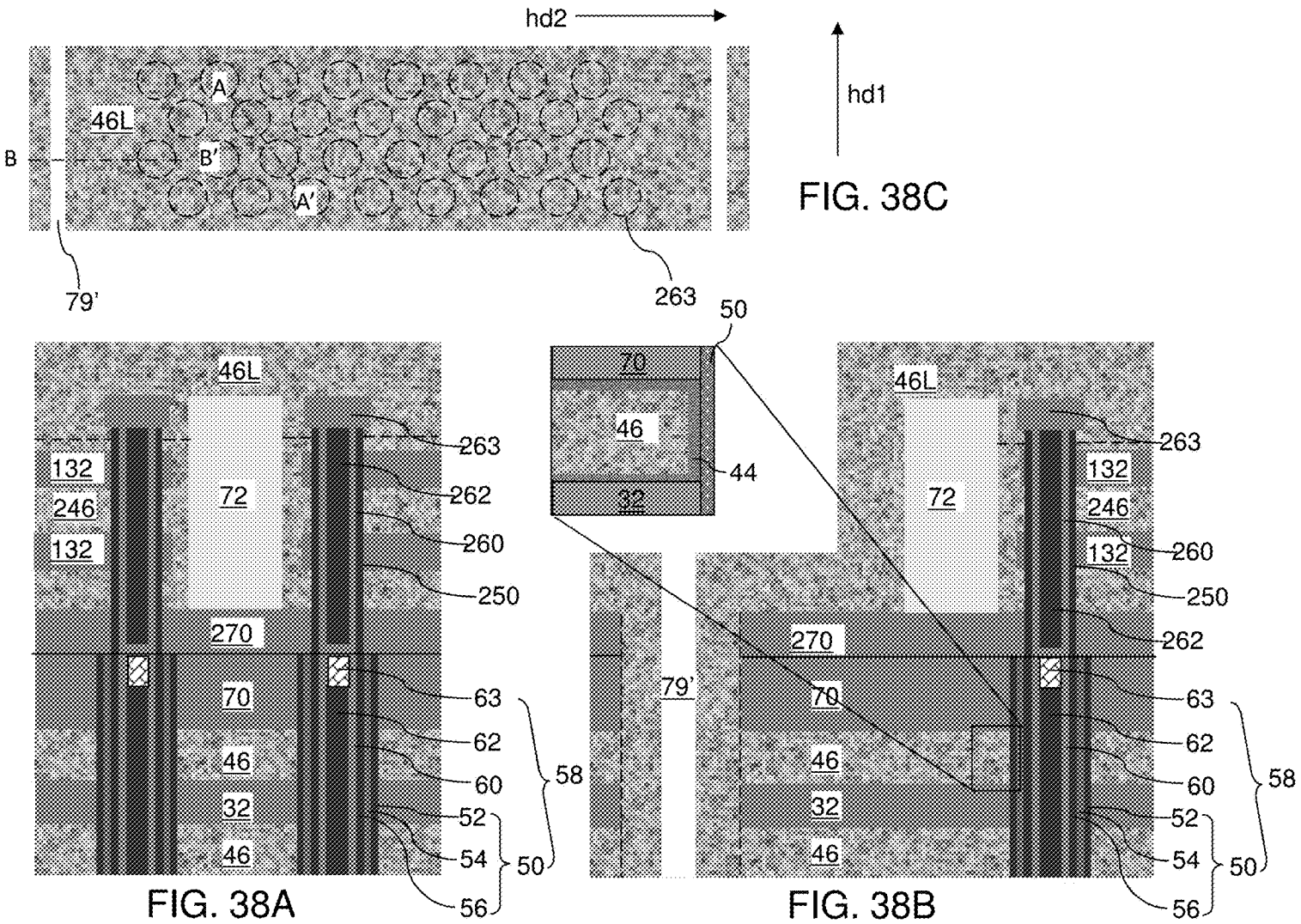
FIG. 38A is a vertical cross-section view of the second exemplary structure along the plane A-A' of FIG. 38C.
FIG. 38B is a vertical cross-section view of the second exemplary structure along the plane B-B' of FIG. 38C.
FIG. 38C is a top-down view of the region R in the second exemplary structure after deposition of at least one conductive material in the backside recesses and over the drain select level assemblies according to the second embodiment of the present disclosure.

Referring to FIGS. 38A-38C, a backside blocking dielectric layer 44 can be deposited as in the first embodiment. The processing steps of FIGS. 18A-18C can be performed to deposit the backside blocking dielectric layer 44. At least one conductive material can be subsequently deposited by a conformal deposition method in the same manner as in the first embodiment. In one embodiment, the at least one conductive material can include a metallic liner layer and a metallic fill material layer. The thicknesses of the metallic liner layer and the metallic fill material layer can be selected such that each backside recess 43 is completely filled with the metallic liner layer and the metallic fill material layer, while a backside cavity 79' is present within each backside trench 79. The processing steps of FIGS. 18A-18C can be performed to deposit the at least one conductive material.

Each portion of the combination of the metallic liner layer and the metallic fill material layer that fills a backside recess constitutes an electrically conductive layer 46. Each portion of the combination of the metallic liner layer and the metallic fill material layer that is deposited below the horizontal plane including the bottom surfaces of the drain regions 263, and within volumes from which the sacrificial matrix material layers 142 and the sacrificial spacers 274 are removed, constitutes a drain select gate electrode 246. A continuous conductive material layer 46L is formed at peripheral portions of each backside trench 79, over each of the drain select gate electrodes 246, and over regions of the isolation spacer layer 270 that do not underlie arrays of the drain select level assemblies 115, i.e., within insulating spacer removal regions IRR shown in FIG. 37C.

Figure 39C:
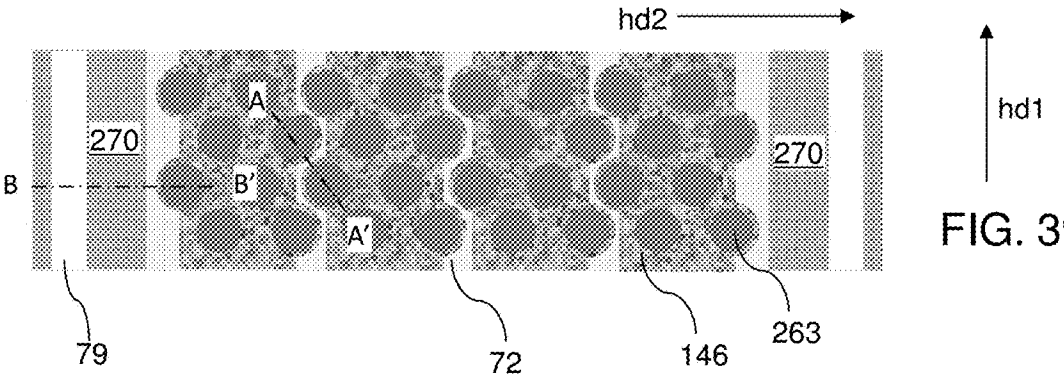
FIG. 39C is a top-down view of the region R in the second exemplary structure after isotropically recessing the at least one conductive material according to the second embodiment of the present disclosure.
Figure 39B:
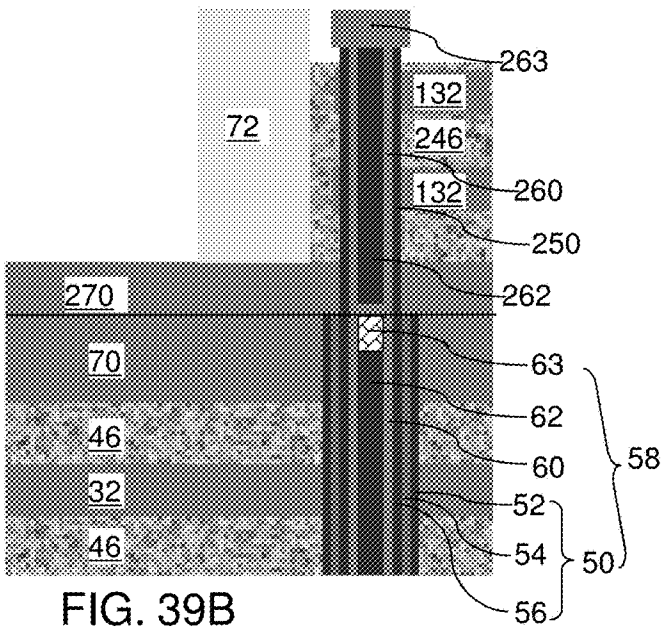
FIG. 39B is a vertical cross-section view of the second exemplary structure along the plane B-B' of FIG. 39C.
Figure 39A:
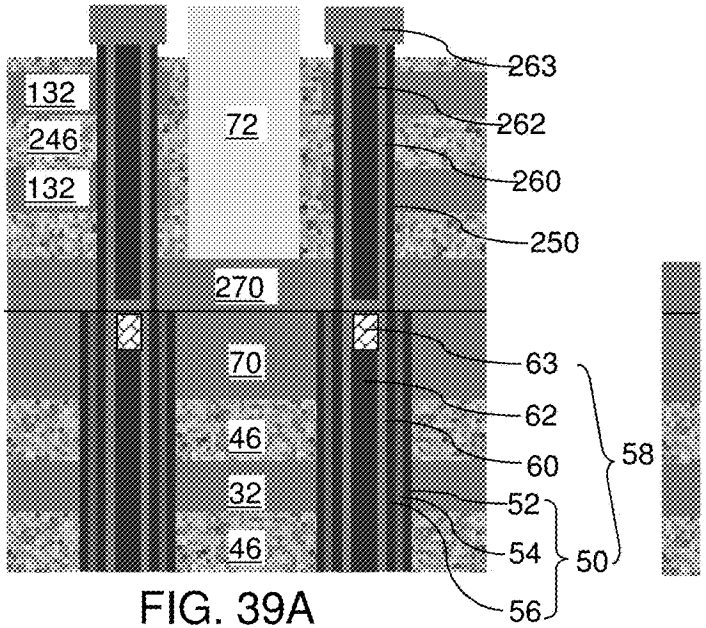
FIG. 39A is a vertical cross-section view of the second exemplary structure along the plane A-A' of FIG. 39C.

Referring to FIGS. 39A-39C, the at least one conductive material of the continuous conductive material layer 46L can be selectively recessed by an etch process as in the first embodiment. Specifically, horizontal portions of the at least one conductive material can be removed from above the array of drain select level assemblies 115 and from around upper portions of the array of drain select level assemblies 115. The unetched remaining portions of the at least one conductive material overlying the isolation spacer layer 270 constitute the drain select gate electrodes 246, which are laterally spaced among one another by the drain select level dielectric strips 72. Further, the vertical portions of the at least one conductive material can be removed from inside the backside trenches 79 by the etch process. The duration of the isotropic etch process can be controlled to avoid removal of the drain select gate electrodes 246 and the electrically conductive layers 46.

The drain select gate electrodes 246 can be formed on the array of drain select level assemblies 115 and the drain select level isolation strips 72. Each of the drain select gate electrodes 246 can laterally encircle each of the drain select level assemblies 115 located between a neighboring pair of drain select level isolation strips 72. In one embodiment, each of the drain select gate electrodes 246 can include a pair of lengthwise sidewalls that generally extend along the first horizontal direction hd1 and contact a respective sidewall of the drain select level isolation strips 72. Each of the lengthwise sidewalls of the drain select gate electrode 246 can include a laterally alternating sequence of planar sidewall portions and convex sidewall portions. In one embodiment, each of the lengthwise sidewalls of the drain select gate electrode 246 can include a laterally alternating sequence of vertical planar sidewall portions and vertical convex sidewall portions. Each of the drain select gate electrodes 246 laterally surrounds respective rows of the drain select level assemblies 115. Each row of the drain select level assemblies 115 can be arranged along the first horizontal direction hd1. The top surface of each drain select gate electrode 246 can be located below the horizontal plane including the bottom surfaces of the drain regions 263 to avoid electrical shorts between the drain select gate electrodes 246 and the drain regions 263.

Each of the drain select gate electrodes 246 includes multiple horizontal portions that are located at different levels and vertical portions that are located adjacent to the lengthwise sidewalls of a neighboring pair of drain select level isolation strips 72. Specifically, each of the drain select level gate electrodes can include a top horizontal drain select gate electrode portion overlying the at least one insulating material strip (as embodied as a discrete portions of each of the insulating spacer layers 132), a bottom horizontal drain select gate electrode portion underlying the at least one insulating material strip, and vertically extending portions that connect the top horizontal drain select gate electrode portion and the bottom horizontal drain select gate electrode portion. If a plurality of insulating spacer layers 132 is present, at least one intermediate level horizontal drain select gate electrode portions can be adjoined to the vertically extending portions.

In one embodiment, each of the drain select gate electrodes 246 can have the same width along the second horizontal direction hd2 (e.g., bit line direction). In this case, each of the drain select gate electrodes 246 can have substantially the same resistance, which can be measured along the first horizontal direction hd1 (e.g., word line direction) between two end portions of each drain select gate electrode 246.

Figure 40C:
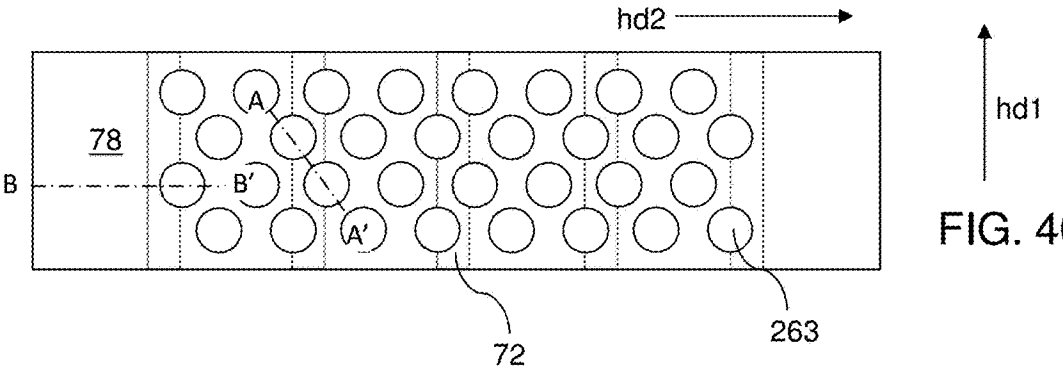
FIG. 40C is a top-down view of the region R in the second exemplary structure after formation of a dielectric fill material layer according to the second embodiment of the present disclosure.
Figure 40B:
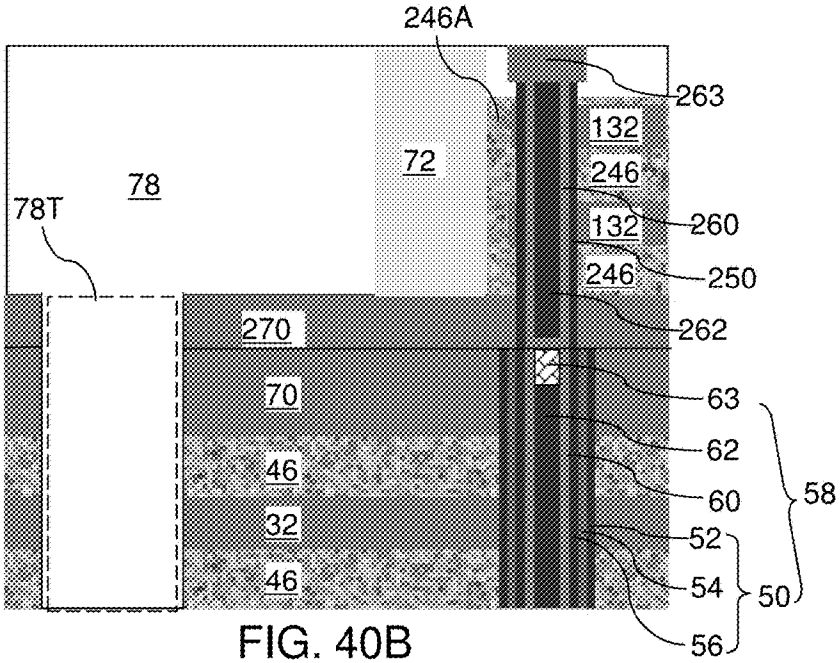
FIG. 40B is a vertical cross-section view of the second exemplary structure along the plane B-B' of FIG. 40C.
Figure 40A:
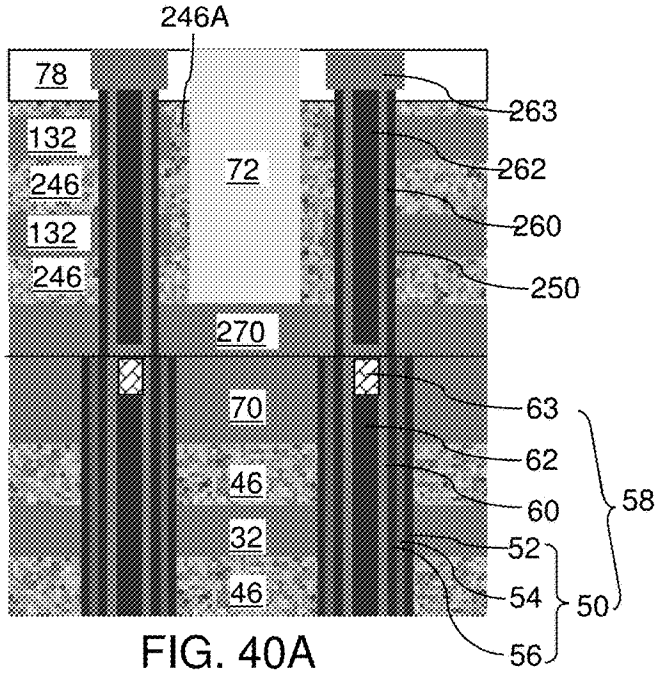
FIG. 40A is a vertical cross-section view of the second exemplary structure along the plane A-A' of FIG. 40C.

Referring to FIGS. 40A-40C, a dielectric fill material layer 78 is formed over the drain select gate electrodes 246 and in the backside trenches 79. The dielectric fill material layer 78 can include a planarizable dielectric material such as silicon oxide. The dielectric fill material layer 78 can be planarized to remove to provide a top surface that is coplanar with the top surfaces of the drain regions 263. For example, chemical mechanical planarization or a recess etch can be employed. The top surfaces of the drain select level isolation strips 72 and the dielectric fill material layer 78 can be within a same horizontal plane as the top surfaces of the drain regions 263. The dielectric fill material layer 78 can be formed over the drain select gate electrodes 246. In one embodiment, portions of the dielectric fill material layer 78 may be laterally spaced apart among one another by the drain select level isolation strips 72.

Alternatively, the planarized top surface of the dielectric fill material layer 78 can be formed over the horizontal plane including the top surfaces of the drain regions 163 and the drain select level isolation strips 72. In this case, the dielectric fill material layer 78 can be formed as a single continuous material layer.

Each portion of the dielectric fill material layer 78 that fills one of the backside trenches 79 is herein referred to as a dielectric wall structure 78T, which provides electrical isolation between laterally neighboring pairs of electrically conductive layers 46 that are located at the same level, i.e., at the same vertical distance from the top surface of the substrate (9, 10).

A discrete strip portion of each of the one or more insulating spacer layers 132 can be embedded within, and encapsulated within, the drain select gate electrodes 246. Multiple horizontal drain select gate electrodes 246 can be vertically spaced among one another by the discrete strip portions of the one or more insulating spacer layers 132, and can be continuously connected among one another by vertically extending portions 246A that contact the lengthwise sidewalls of a pair of drain select level isolation strips 72 located at peripheries of the respective drain select gate electrodes 246. Thus, the horizontal drain select gate electrodes 246 are electrically shorted to each other by the vertically extending portions 246A.

Figure 41C:
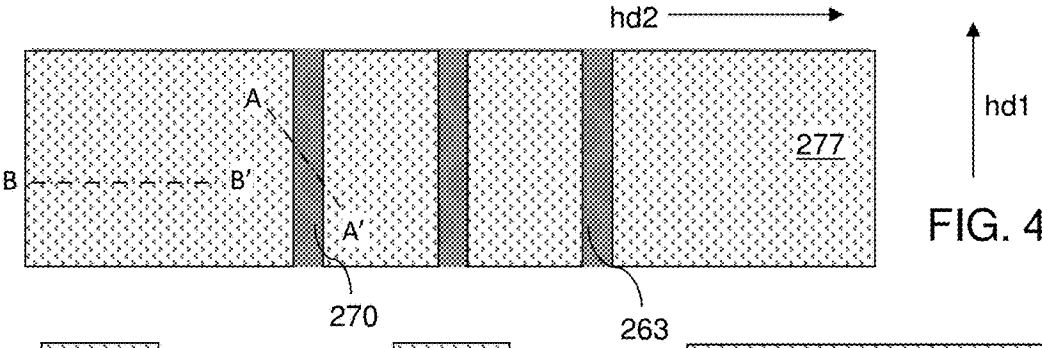
FIG. 41C is a top-down view of the alternative embodiment of the second exemplary structure after formation of laterally extending trenches through the sacrificial matrix material layers and the insulating spacer layers according to the second embodiment of the present disclosure.
Figure 41B:
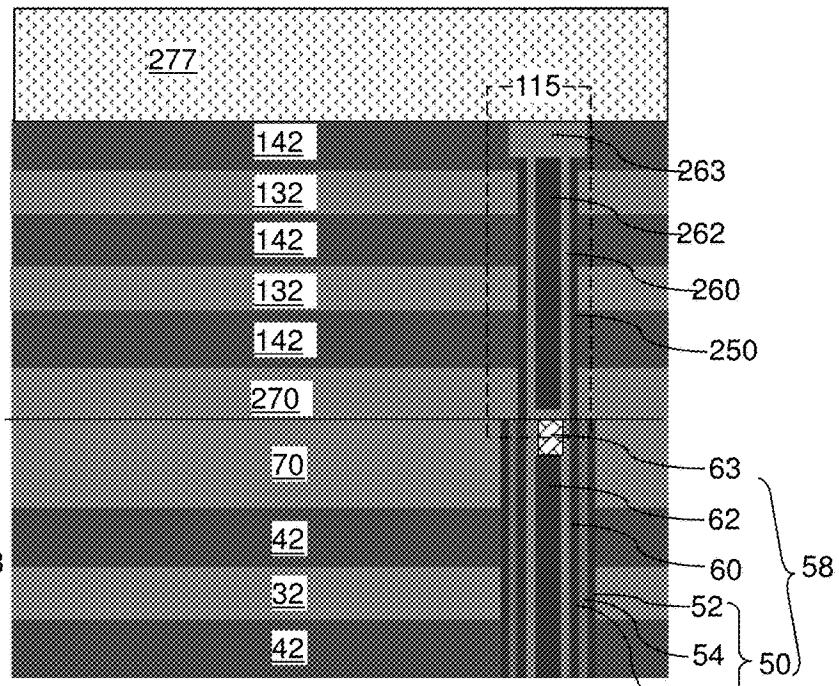
FIG. 41B is a vertical cross-section view of the alternative embodiment of the second exemplary structure along the plane B-B' of FIG. 41C.
Figure 41A:
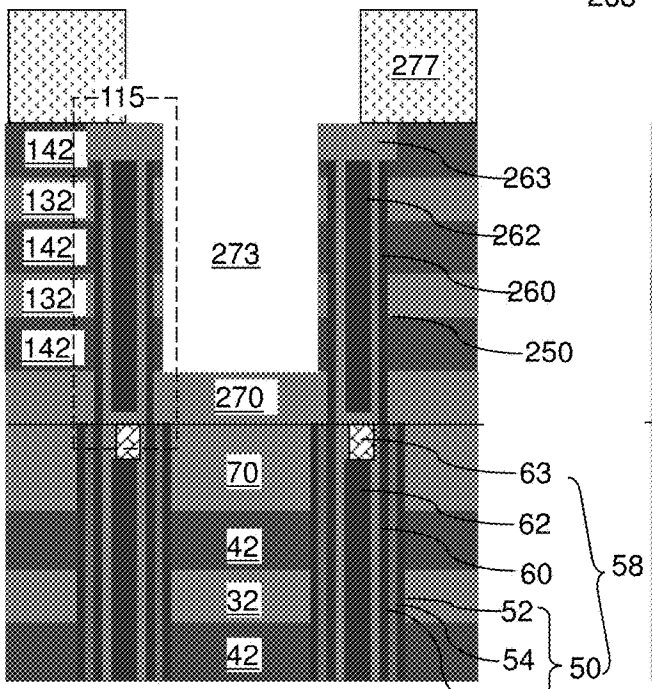
FIG. 41A is a vertical cross-section view of an alternative embodiment of the second exemplary structure along the plane A-A' of FIG. 41C.

Referring to FIGS. 41A-41C, an alternative embodiment of the second exemplary structure can be derived from the second exemplary structure by modifying the pattern of the openings in the photoresist layer at the processing steps of FIGS. 32A-32C. Specifically, linear openings in the photoresist layer 277 are formed only over neighboring pairs of rows of drain select level assemblies 115, and are not formed over peripheral rows of the drain select level assemblies 115. In other words, each peripheral row (i.e., outermost row) of drain select level assemblies 115 is entirely covered with the photoresist layer 277 after lithographic patterning.

Subsequently, the anisotropic etch process of FIGS. 32A-32C can be performed to form laterally extending trenches 273. The number of the laterally extending trenches 273 in this alternate embodiment may be less than the number of the laterally extending trenches 273 in the second exemplary structure of FIGS. 32A-32C because the laterally extending trenches 273 are not formed in regions proximate to areas in which backside trenches are to be subsequently formed. The photoresist layer 277 can be subsequently removed, for example, by ashing.

Figure 42C:
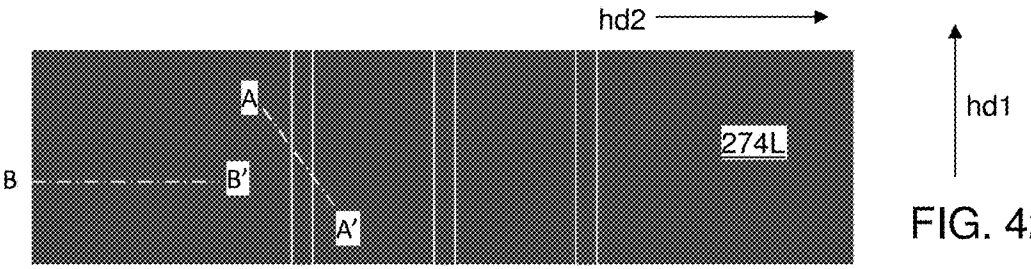
FIG. 42A is a vertical cross-section view of the alternative embodiment of the second exemplary structure along the plane A-A' of FIG. 42C.
Figure 42B:
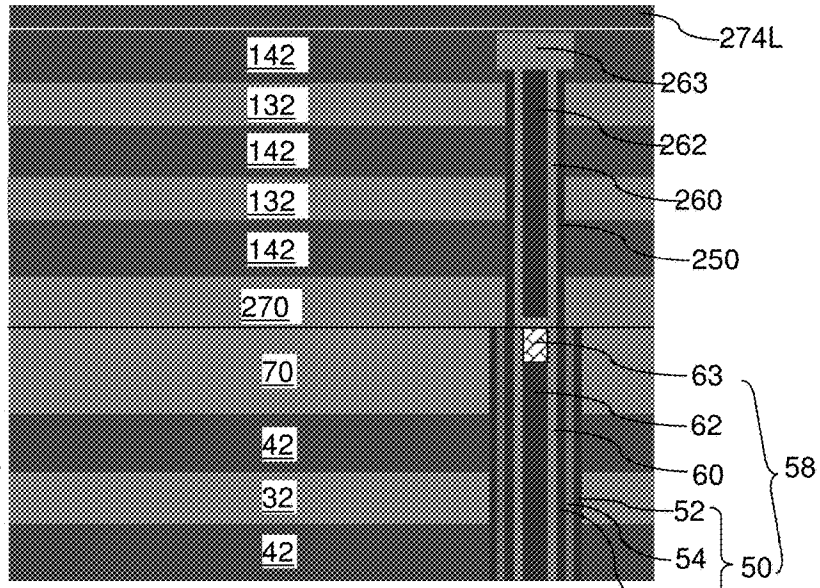
Figure 42A:
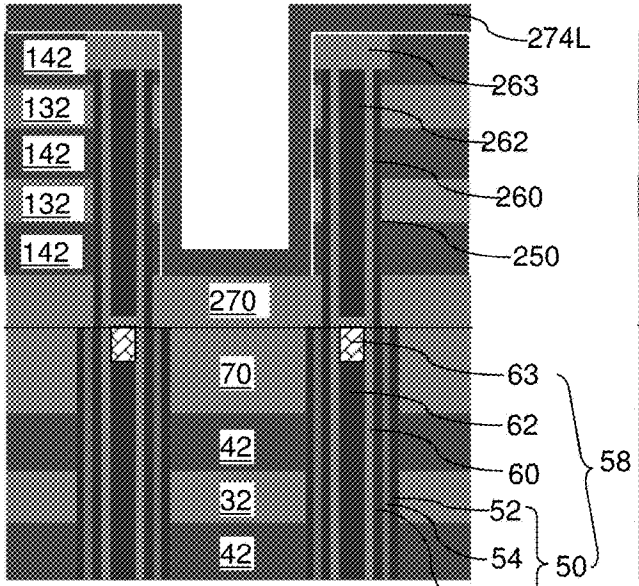

Referring to FIGS. 42A-42C, the processing steps of FIGS. 13A-13C can be performed to form a sacrificial spacer material layer 274L.

Figure 43C:
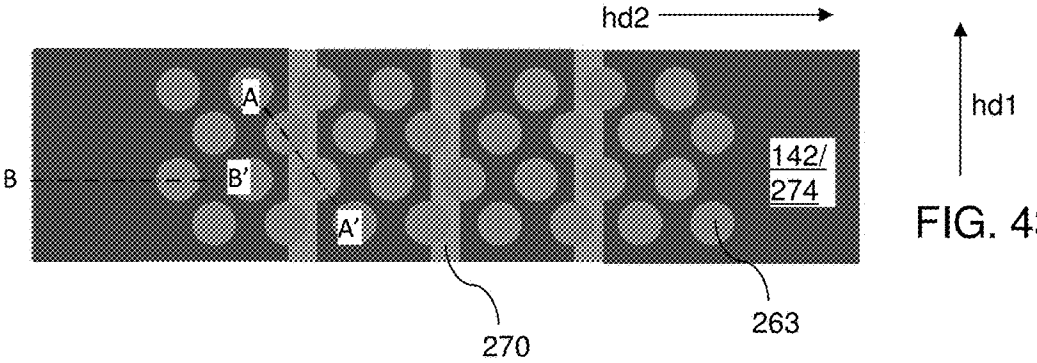
Figure 43B:
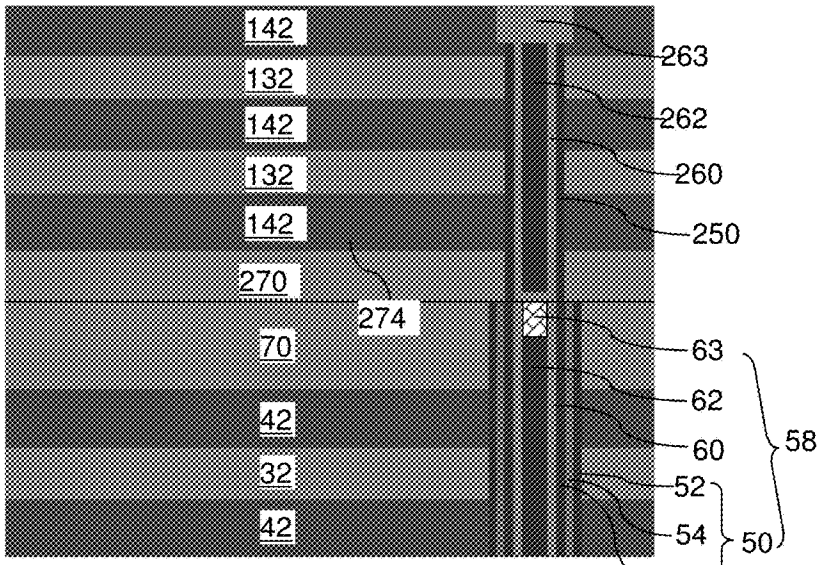
Figure 43A:
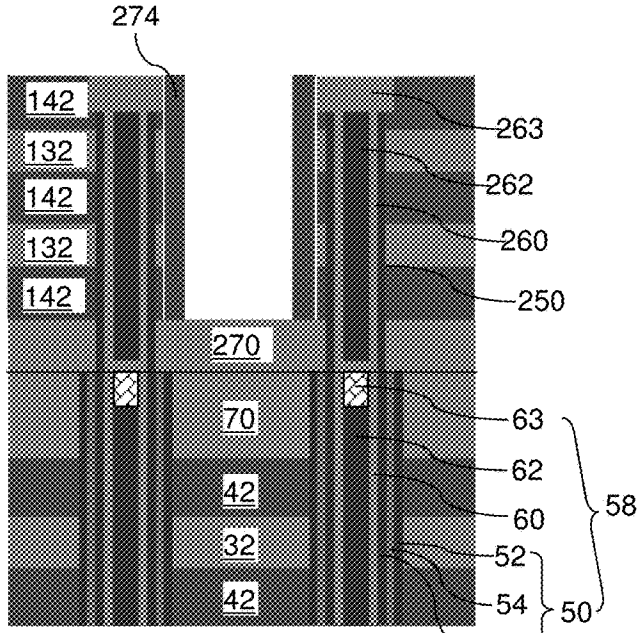

Referring to FIGS. 43A-43C, the processing steps of FIGS. 14A-14C can be performed to form sacrificial spacers 274 within each of the laterally extending trenches.

Figure 44C:
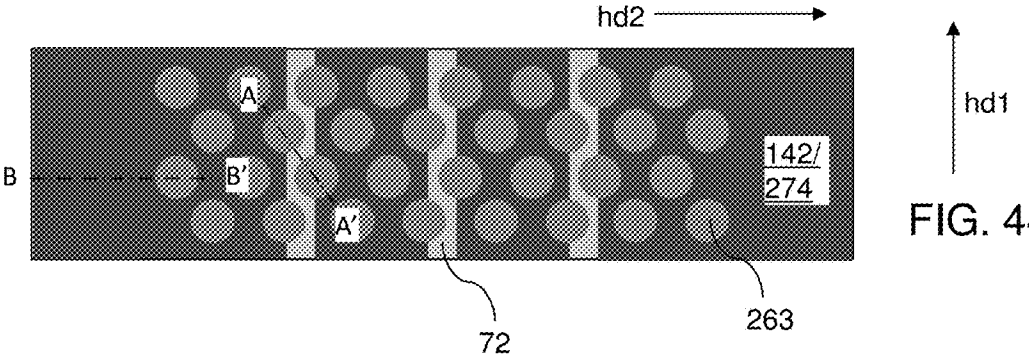
Figure 44B:
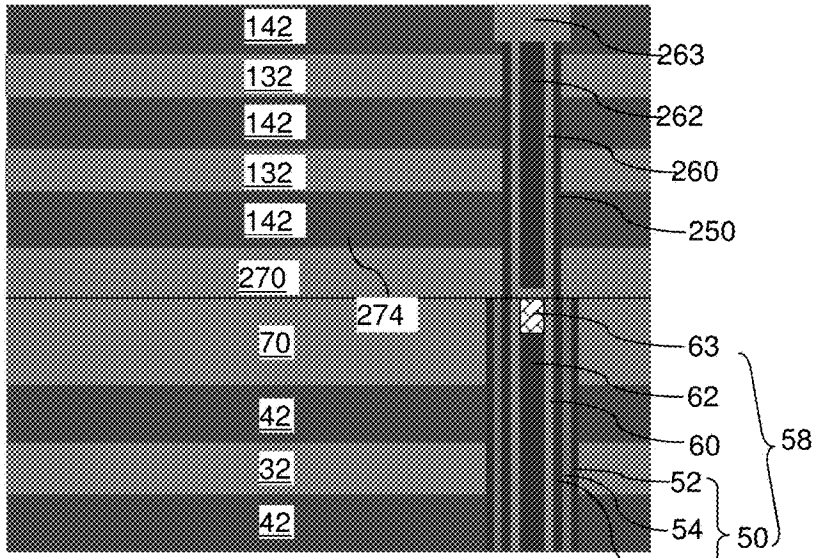
Figure 44A:
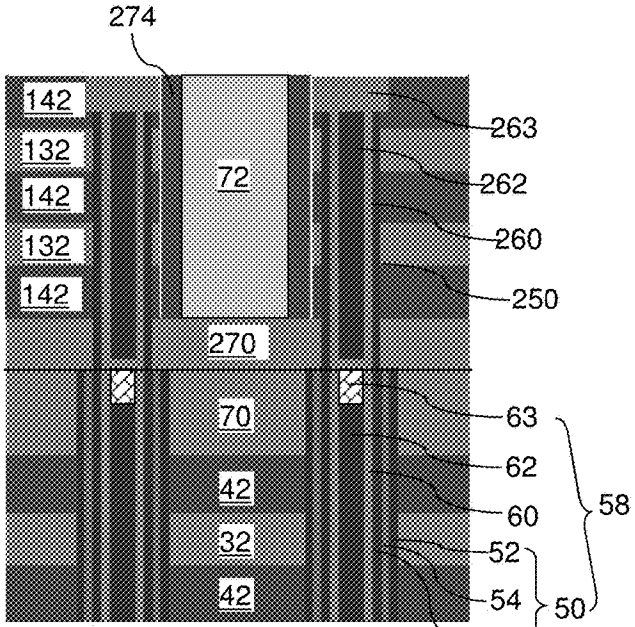

Referring to FIGS. 44A-44C, the processing steps of FIGS. 15A-15C can be performed to form a drain select level isolation strip 72 within each unfilled volume of the laterally extending trenches.

Figures 45A, 45B, 45C:
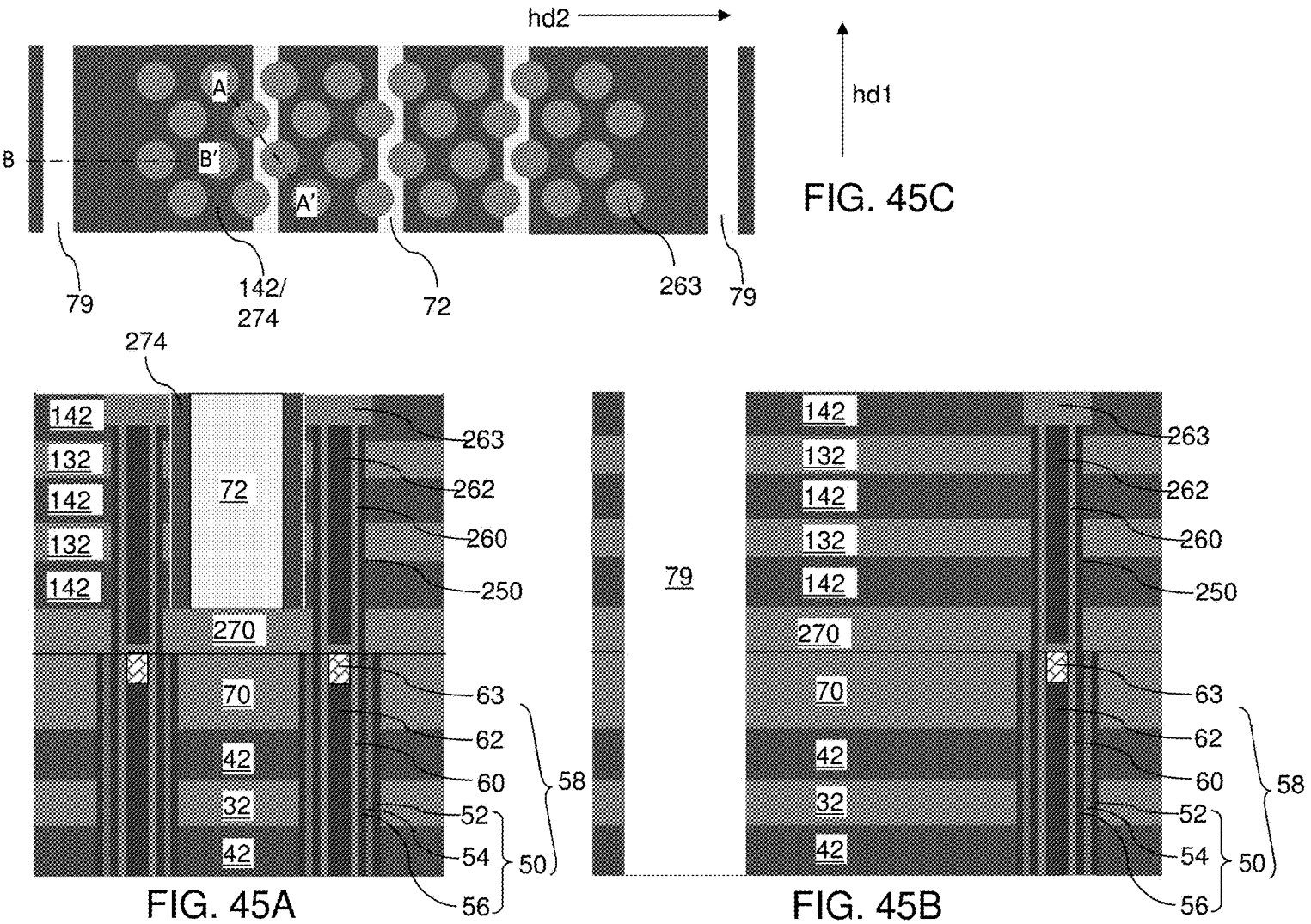

Referring to FIGS. 45A-45C, the processing steps of FIGS. 36A-36C can be performed to form backside trenches 79.

Figure 46A:
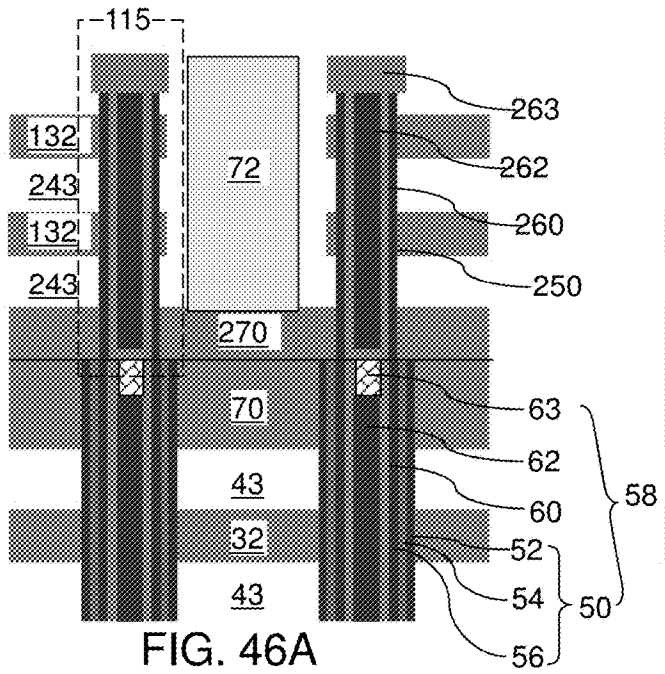

Referring to FIGS. 46A-46C, the processing steps of FIGS. 37A-37C can be performed. The sacrificial material layers 42 can be removed selective to the insulating layers 32 and the memory stack structures 55. Backside recesses 43 are formed in volumes from which the sacrificial material layers 42 are removed. The sacrificial matrix material layer 142 and the sacrificial spacers 274 can be removed from around the drain select level assemblies 115 and the drain select level isolation strips 72 above the top surface of the isolation spacer layer 270.

Drain select level lateral recesses 243 can be formed between the isolation spacer layer 270 and each remaining strip portion of a bottommost one of the insulating spacer layers 132. If two or more insulating spacer layers 132 are present, additional drain select level lateral recesses 243 can be formed between each vertically neighboring pair of the insulating spacer layers 132. Physically exposed surface portions of the optional epitaxial channel portions 11 and the semiconductor material layer 10 can be converted into dielectric material portions by thermal conversion and/or plasma conversion of the semiconductor materials into dielectric materials as in previously described embodiments.

Referring to FIGS. 47A-47C, a backside blocking dielectric layer 44 can be deposited, for example, employing the processing steps of FIGS. 18A-18C. At least one conductive material can be subsequently deposited by a conformal deposition method as in the previously described embodiments. The at least one conductive material can include a metallic liner layer and a metallic fill material layer. The thicknesses of the metallic liner layer and the metallic fill material layer can be selected such that each backside recess 43 is completely filled with the metallic liner layer and the metallic fill material layer, while a backside cavity 79' is present within each backside trench 79. The processing steps of FIGS. 18A-18C can be performed to deposit the at least one conductive material.

Each portion of the combination of the metallic liner layer and the metallic fill material layer that fills a backside recess constitutes an electrically conductive layer 46. Each portion of the combination of the metallic liner layer and the metallic fill material layer that is deposited below the horizontal plane including the bottom surfaces of the drain regions 263, and within volumes from which the sacrificial matrix material layer 272 and the sacrificial spacers 274 are removed, constitutes a drain select gate electrode 246. A continuous conductive material layer 46L is formed at peripheral portions of each backside trench 79, over each of the drain select gate electrodes 246.

Referring to FIGS. 48A-48C, the at least one conductive material of the continuous conductive material layer 46L can be selectively recessed by an etch process as in the first embodiment. Specifically, horizontal portions of the at least one conductive material can be removed from above the array of drain select level assemblies 115 and from around upper portions of the array of drain select level assemblies 115. The unetched remaining portions of the at least one conductive material overlying the isolation spacer layer 270 constitute the drain select gate electrodes 246, which are laterally spaced among one another by the drain select level dielectric strips 72. Further, the vertical portions of the at least one conductive material can be removed from inside the backside trenches 79 by the etch process. The duration of the etch process can be controlled to avoid removal of the drain select gate electrodes 246 and the electrically conductive layers 46.

The drain select gate electrodes 246 can be formed on the array of drain select level assemblies 115 and the drain select level isolation strips 72. Each of the drain select gate electrodes 246 can laterally encircle each of the drain select level assemblies 115 located between a neighboring pair of drain select level isolation strips 72. In one embodiment, each of the drain select gate electrodes 246 located between a neighboring pair of drain select level isolation strips 72 can include a pair of lengthwise sidewalls that generally extend along the first horizontal direction hd1 and contact a respective sidewall of the drain select level isolation strips 72. Each of the lengthwise sidewalls of the drain select gate electrode 246 can include a laterally alternating sequence of planar sidewall portions and convex sidewall portions. In one embodiment, each of the lengthwise sidewalls of the drain select gate electrode 246 can include a laterally alternating sequence of vertical planar sidewall portions and vertical convex sidewall portions.

In one embodiment, each of the drain select gate electrodes 246 located between a drain select level isolation strip 72 and a backside trench 79 can include a lengthwise sidewall that generally extends along the first horizontal direction hd1 and contacts a respective sidewall of the drain select level isolation strips 72. The lengthwise sidewall of the drain select gate electrode 246 can include a laterally alternating sequence of planar sidewall portions and convex sidewall portions. In one embodiment, the lengthwise sidewall of the drain select gate electrode 246 can include a laterally alternating sequence of vertical planar sidewall portions and vertical convex sidewall portions. Further, each of the drain select gate electrodes 246 located between a drain select level isolation strip 72 and a backside trench 79 can include a set of vertically coincident straight sidewalls that laterally extend along the first horizontal direction hd2, and is a portion of a sidewall of the backside trench 79.

Each of the drain select gate electrodes 246 laterally surrounds respective rows of the drain select level assemblies 115. Each row of the drain select level assemblies 115 can be arranged along the first horizontal direction hd1. The top surface of each drain select gate electrode 246 can be located below the horizontal plane including the bottom surfaces of the drain regions 263 to avoid electrical shorts between the drain select gate electrodes 246 and the drain regions 263.

In one embodiment, the drain select gate electrodes 246 bordering the backside trenches 79 can have a lower resistance than drain select gate electrodes 246 that do not border the backside trenches 79. A drain select gate electrode 246 bordering a backside trench 79 can have a greater width along the second horizontal direction hd2 than a drain select gate electrode 246 located between a neighboring pair of drain select level isolation strips 72. In this case, a drain select gate electrode 246 bordering a backside trench 79 can have a lower electrical resistance than a drain select gate electrode 246 formed between neighboring pair of drain select level isolation strips 72.

Referring to FIGS. 49A-49C, a dielectric fill material layer 78 is formed on the top surface of the drain select gate electrodes 246 and in the backside trenches 79. The dielectric fill material layer 78 can include a planarizable dielectric material such as silicon oxide. The dielectric fill material layer 78 can be planarized to remove to provide a top surface that is coplanar with the top surfaces of the drain regions 263. For example, chemical mechanical planarization or a recess etch can be employed. The top surfaces of the drain select level isolation strips 72 and the dielectric fill material layer 78 can be within a same horizontal plane as the top surfaces of the drain regions 263.

The dielectric fill material layer 78 can be formed over the drain select gate electrodes 246. In one embodiment, portions of the dielectric fill material layer 78 may be laterally spaced apart among one another by the drain select level isolation strips 72.

Alternatively, the planarized top surface of the dielectric fill material layer 78 can be formed over the horizontal plane including the top surfaces of the drain regions 163 and the drain select level isolation strips 72. In this case, the dielectric fill material layer 78 can be formed as a single continuous material layer.

Each portion of the dielectric fill material layer 78 that fills one of the backside trenches 79 is herein referred to as a dielectric wall structure 78T, which provides electrical isolation between laterally neighboring pairs of electrically conductive layers 46 that are located at the same level, i.e., at the same vertical distance from the top surface of the substrate (9, 10).

In an alternative embodiment, the drain select gate electrodes 246 can be formed separately from the other electrically conductive layers 46 (e.g., word lines and source select gate electrodes) using the separate processing steps shown in FIGS. 21A to 27C and described above. If desired the drain select gate electrodes 246 can be formed by selective metal deposition, while the other electrically conductive layers 46 are subsequently formed by non-selective metal deposition followed by etching the metal layer from the backside trenches as described above.

The various embodiments of the present disclosure can provide a three-dimensional memory device. The three-dimensional memory device can include: an alternating stack of insulating layers 32 and electrically conductive layers 46 located over a substrate (9, 10); an array of memory stack structures 55 extending through the alternating stack (32, 42) and arranged as rows that extend along a first horizontal direction hd1 and spaced apart along a second horizontal direction hd2. Each of the memory stack structures 55 comprises a memory film 50 and a memory level channel portion 60 contacting an inner sidewall of the memory film 50; an array of drain select level assemblies 115 overlying the alternating stack (32, 46) and having a same periodicity as the array of memory stack structures 55 along the first horizontal direction hd1 and the second horizontal direction hd2; drain select gate electrodes (146 or 246) laterally surrounding respective rows of the drain select level assemblies 115; and a first drain select level isolation strip 72 comprising a dielectric material and located between a neighboring pair of drain select gate electrodes (146 or 246) and including a pair of lengthwise sidewalls, wherein each of the pair of lengthwise sidewalls includes a laterally alternating sequence of planar sidewall portions and [convex] *concave* sidewall portions, and wherein each of the [convex] *concave* sidewall portions is equidistant from a sidewall of a respective most proximal one of the drain select level assemblies 115. The distance from the respective most proximal one of the drain select level assemblies 115 can be the same as the thickness of a sacrificial spacer 274 that is employed during formation of the three-dimensional memory device.

In one embodiment, each of the drain select level assemblies 115 comprises a drain select level channel portion (160 or 260) contacting a respective memory level channel portion 60 and a gate dielectric (150 or 250) laterally surrounding the drain select level channel portion (160 or 260). In one embodiment, each of the gate dielectrics (150 or 250) has a cylindrical configuration, and top surfaces of the drain select gate electrodes (146 or 246) are adjoined to a respective subset of outer sidewalls of the gate dielectrics (150 or 250).

In one embodiment, each of the drain select level assemblies 115 comprises a drain region 263 contacting top surfaces of the drain select level channel portion (160 or 260) and optionally the gate dielectrics (150, 250). In one embodiment, a peripheral portion of the drain region 263 protrudes outward from an outer sidewall of the gate dielectric (150 or 250) and overhangs the gate dielectric (150 or 250) due to lateral recessing of a sacrificial matrix material layer 272 or a topmost sacrificial matrix material layer 142.

In one embodiment, the memory film 50 comprises a stack, from outside to inside, of a blocking dielectric 52, charge storage elements as embodied as portions of a charge storage layer 54 located at levels of the electrically conductive layers 46, and a tunneling dielectric 56; and the gate dielectric (150 or 250) comprises a material that is different from a material of the charge storage elements. A dielectric fill material layer 78 can contact, and laterally surround, each of the drain regions 263, and can contact top surfaces of the drain select gate electrodes (146 or 246).

Figure 20C:
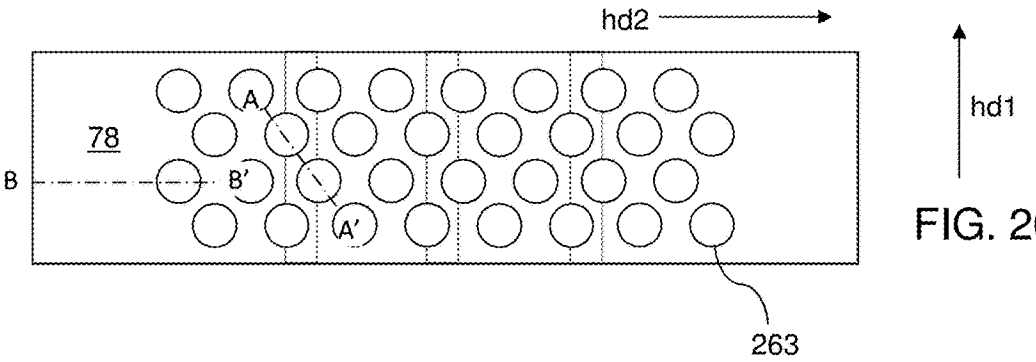
FIG. 20C is a top-down view of the region R in the first exemplary structure after formation of a dielectric fill material layer according to the first embodiment of the present disclosure.
Figure 20B:
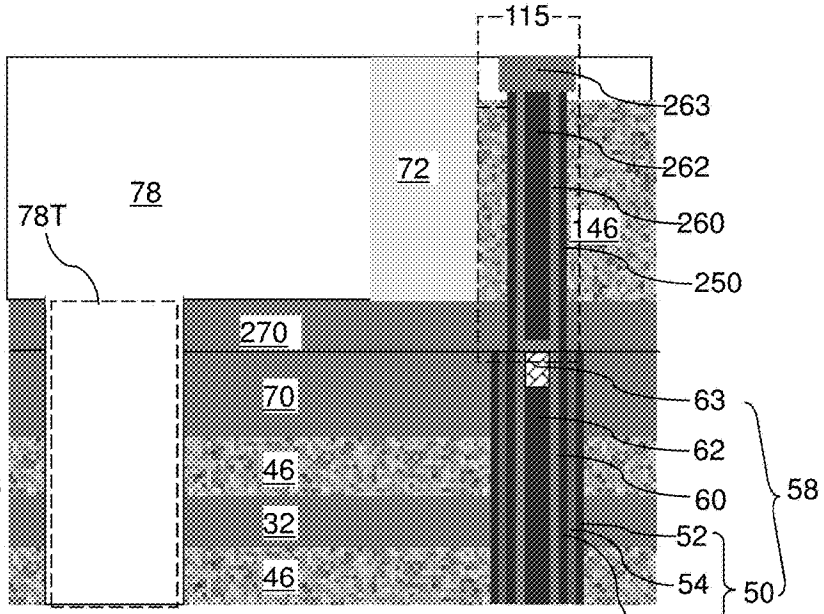
FIG. 20B is a vertical cross-section view of the first exemplary structure along the plane B-B' of FIG. 20C.
Figure 20A:
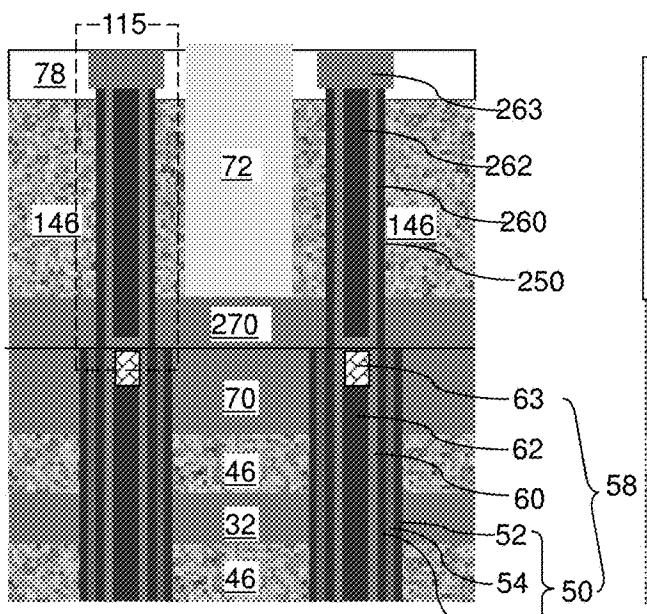
FIG. 20A is a vertical cross-section view of the first exemplary structure along the plane A-A' of FIG. 20C.
Figure 20D:
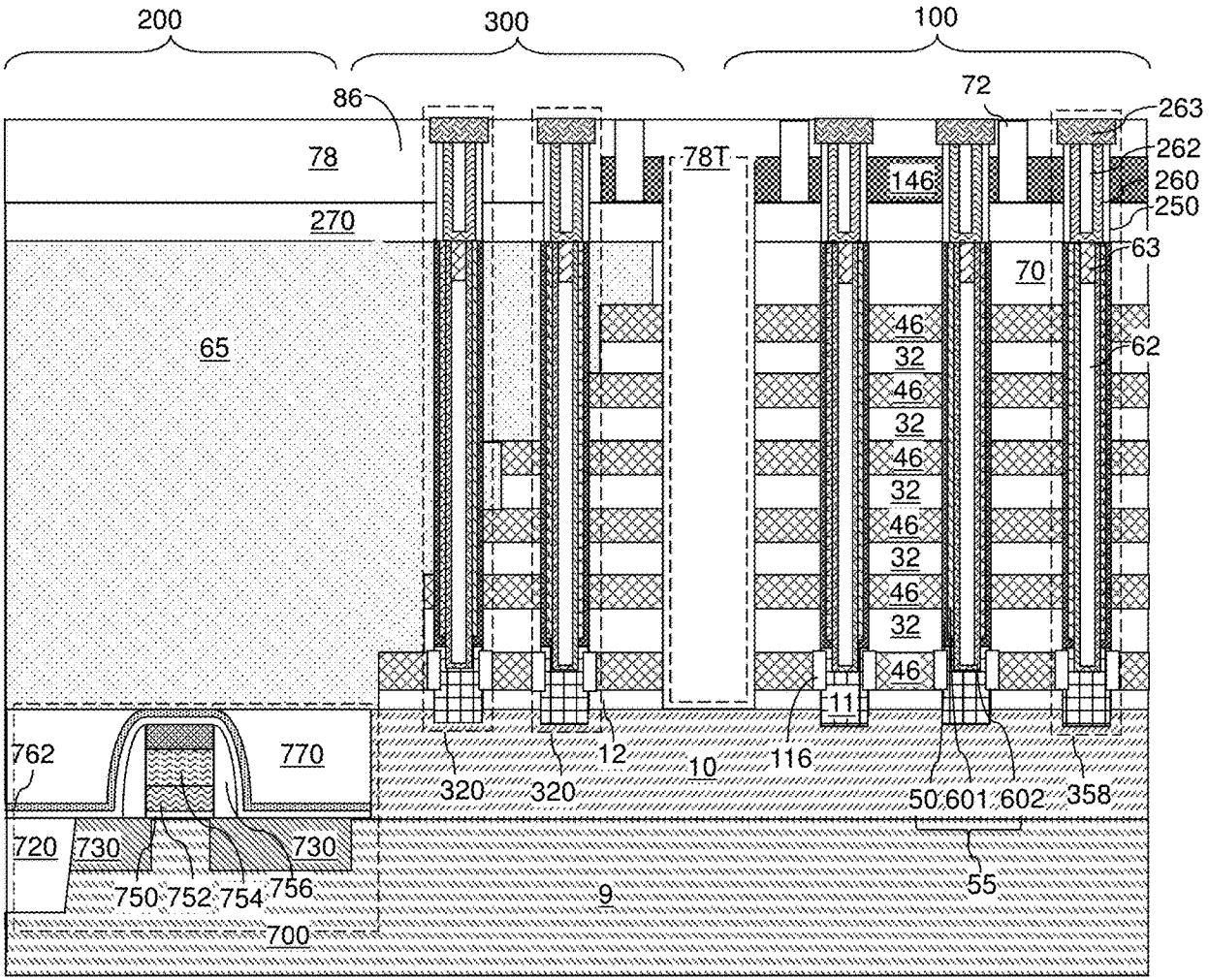
FIG. 20D is a vertical cross-sectional view of the first exemplary structure at the processing steps of FIGS. 20A-20C.
Figure 20E:
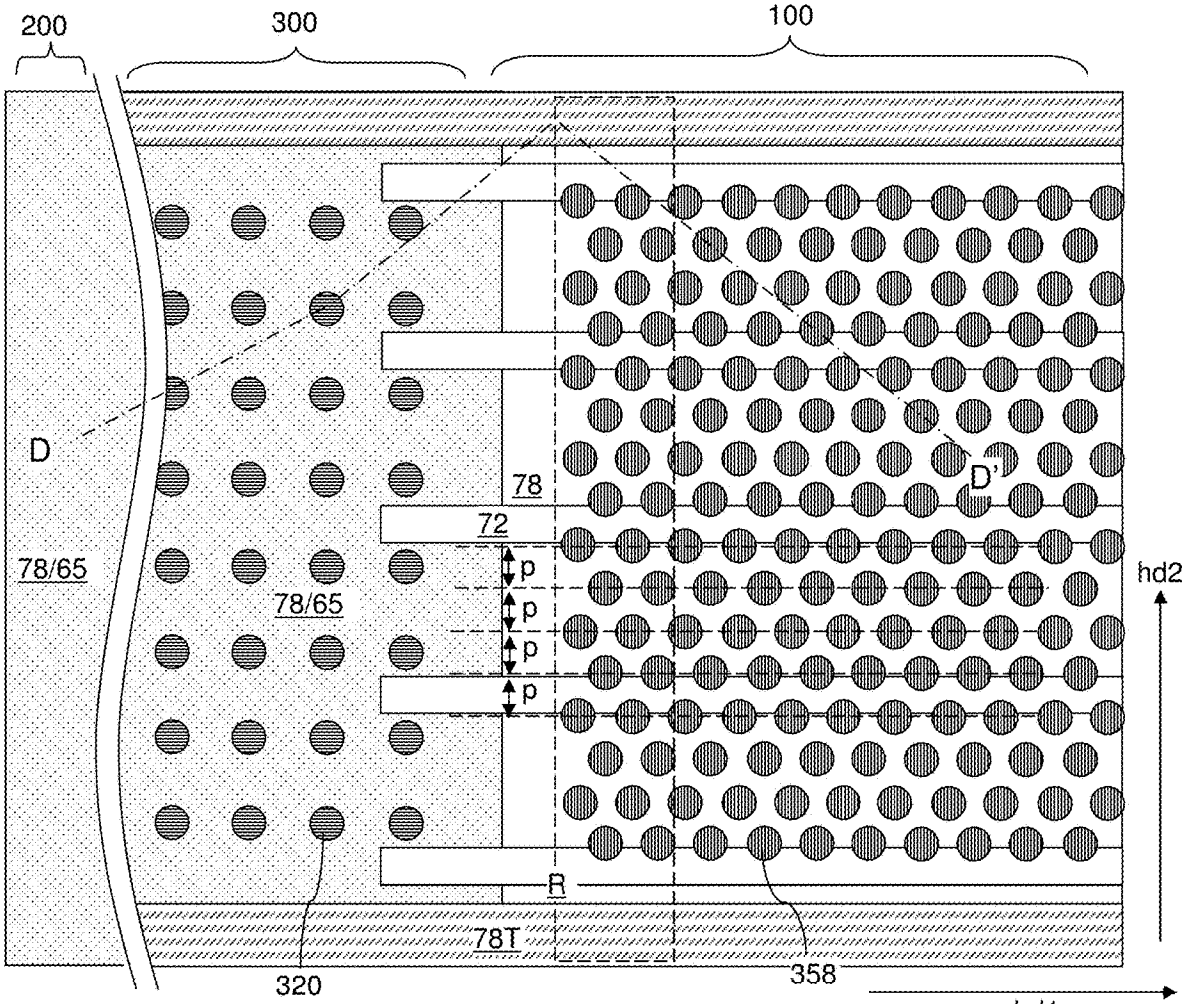
FIG. 20E is a top-down view of the first exemplary structure of FIG. 20D.

The three-dimensional memory device can further include a second drain select level isolation strip 72. In one embodiment, each of the pair of lengthwise sidewalls of the first drain select level isolation strip 72 contacts a respective one of the drain select gate electrodes (146 or 246) as illustrated in FIGS. 20A, 27A, and 40A; the second drain select level isolation strip 72 comprises a first lengthwise sidewall and a second lengthwise sidewall; the first lengthwise sidewall contacts a respective one of the drain select gate electrodes (146 or 246); and an entirety of the second lengthwise sidewall contacts a sidewall of a portion of the dielectric fill material layer 78 as illustrated in FIGS. 20B, 27B, and 40B.

In one embodiment, each respective drain select level assembly 115 is laterally surrounded by only one drain select gate electrode 146. In another embodiment, insulating spacer strip is 132 located between a first horizontal drain select gate electrode 246 and a second horizontal drain select gate electrode 246 which is electrically connected to the first horizontal drain select gate electrode by a vertically extending portion 246A.

In one embodiment, each of the gate dielectrics 250 contacts, and is laterally encircled by, a respective one of the vertically extending portions of the drain select gate electrodes 246. In one embodiment, each drain select level channel portion (160, 260) contacts a top surface of a respective enhanced doping region 63 that contacts a sidewall of, and embedded within, a respective memory level channel portion 60.

In one embodiment, each laterally alternating sequence of planar sidewall portions and [convex] *concave* sidewall portions vertically extend from a bottom surface of the first drain select level isolation strip 72 to a top surface of the first drain select level isolation strip 72.

Each of exemplary structures of the present disclosure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (11, 60, 63, 160 or 260). The plurality of semiconductor channels can additionally include a horizontal surface portion of the semiconductor material layer 10 between the pedestal channel portions 11 and a source region (not shown), which has a doping of the second conductivity type and is contacted by a source contact via structure. At least one end portion (60, 63, 160 or 260) of each of the plurality of semiconductor channels (11, 60, 63, 160 or 260) extends substantially perpendicular to a top surface of the substrate (9, 10); and a plurality of charge storage elements (as embodied as charge trapping material portions). Each charge storage element can be located adjacent to a respective one of the plurality of semiconductor channels (11, 60, 63, 160 or 260).

According to another aspect of the present disclosure, methods for formation of a spaceless drain select level isolation structure is provided, which provides on-pitch drain select gate electrode architecture in which memory stack structures are aligned to the drain select gate electrodes with no additional space allocated for the drain select level isolation structure, thereby providing a smaller array size. This feature can be advantageously employed to provide scaling of three-dimensional memory devices.

In one embodiment, one or more silicon nitride layers (272, 142) can be employed as sacrificial drain select level layers, which are subsequently selectively removed by a wet etch process either during word line sacrificial silicon nitride removal process or during a separate removal process.

In the first embodiment, single-level thick drain select gate electrodes can be employed. The drain select gate RC difference between the edge strings and the center strings of the drain select gate electrode is small. Single replacement process to form the drain select gate electrodes 246 together with the other electrically conductive layers 46, or a dual replacement process to form the drain select gate electrodes 246 separately from the other electrically conductive layers 46, may be employed.

In the second embodiment, multi-level drain select gate electrodes can be employed. Uniform drain select gate isolation structure flow provides more uniform drain select gate RC for each string of the drain select gate electrodes. Unbalanced string flow gives relatively small RC for edge strings of the drain select gate electrodes. Selective metal deposition may used in this process. Dual replacement may be employed in the second embodiment. For example, the word line electrically conductive layers can employ non-selective metal deposition, and the drain select gate electrodes can employ a selective metal deposition process.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:

an alternating stack of insulating layers and electrically conductive layers located over a substrate;

an array of memory stack structures extending through the alternating stack and arranged as rows that extend along a first horizontal direction and spaced apart along a second horizontal direction, wherein each of the memory stack structures comprises a memory film and a memory level channel portion contacting an inner sidewall of the memory film;

an array of drain select level assemblies overlying the alternating stack and having a same periodicity as the array of memory stack structures along the first horizontal direction and the second horizontal direction;

drain select gate electrodes laterally surrounding respective rows of the drain select level assemblies; and a first drain select level isolation strip comprising a dielectric material located between a neighboring pair of drain select gate electrodes and including a pair of lengthwise sidewalls, wherein each of the pair of lengthwise sidewalls includes a laterally alternating sequence of planar sidewall portions and [convex] *concave* sidewall portions.

2. The three-dimensional memory device of claim 1, wherein each of the drain select level assemblies comprises a drain select level channel portion contacting a respective memory level channel portion and a gate dielectric laterally surrounding the drain select level channel portion.

3. The three-dimensional memory device of claim 2, wherein:

each of the gate dielectrics has a cylindrical configuration;

top surfaces of the drain select gate electrodes are adjoined to a respective subset of outer sidewalls of the gate dielectrics; and each of the [convex] *concave* sidewall portions is equidistant from a sidewall of a respective most proximal one of the drain select level assemblies.

4. The three-dimensional memory device of claim 2, wherein each of the drain select level assemblies comprises a drain region contacting top surfaces of the drain select level channel portion.

5. The three-dimensional memory device of claim 4, wherein a peripheral portion of the drain region protrudes outward from an outer sidewall of the gate dielectric and overhangs the gate dielectric.

6. The three-dimensional memory device of claim 4, wherein:

the memory film comprises a stack, from outside to inside, of a blocking dielectric, charge storage elements, and a tunneling dielectric; and the gate dielectric comprises a material that is different from a material of the charge storage elements.

7. The three-dimensional memory device of claim 4, further comprising a dielectric fill material layer contacting, and laterally surrounding, each of the drain regions, and contacting top surfaces of the drain select gate electrodes.

8. The three-dimensional memory device of claim 7, further comprising a second drain select level isolation strip, wherein:

each of the pair of lengthwise sidewalls of the first drain select level isolation strip contacts a respective one of the drain select gate electrodes;

the second drain select level isolation strip comprises a first lengthwise sidewall and a second lengthwise sidewall;

the first lengthwise sidewall contacts a respective one of the drain select gate electrodes; and an entirety of the second lengthwise sidewall contacts a sidewall of a portion of the dielectric fill material layer.

9. The three-dimensional memory device of claim 7, wherein each respective drain select level assembly is laterally surrounded by only one drain select gate electrode.

10. The three-dimensional memory device of claim 7, wherein an insulating spacer strip is located between a first horizontal drain select gate electrode and a second horizontal drain select gate electrode which is electrically connected to the first horizontal drain select gate electrode by a vertically extending portion.

11. The three-dimensional memory device of claim 7, wherein each of the gate dielectrics contacts, and is laterally encircled by, a respective one of the vertically extending portions of the drain select gate electrodes.

12. The three-dimensional memory device of claim 1, wherein each drain select level channel portion contacts a top surface of a respective enhanced doping region that contacts a respective vertical semiconductor channel.

13. The three-dimensional memory device of claim 1, wherein each laterally alternating sequence of planar sidewall portions and [convex] *concave* sidewall portions vertically extend from a bottom surface of the first drain select level isolation strip to a top surface of the first drain select level isolation strip.

* * * * *